United States Patent [19]
Takasugi

[11] Patent Number: 5,418,739
[45] Date of Patent: May 23, 1995

[54] SEMICONDUCTOR MEMORY DEVICE

[75] Inventor: Atsushi Takasugi, Tokyo, Japan

[73] Assignee: Oki Electric Industry Co., Ltd., Tokyo, Japan

[21] Appl. No.: 186,093

[22] Filed: Jan. 25, 1994

[30] Foreign Application Priority Data

Jan. 28, 1993 [JP] Japan .................. 5-012888

[51] Int. Cl.⁶ .................. G11C 11/24; G11C 17/00
[52] U.S. Cl. ........................ 365/149; 365/94; 365/102
[58] Field of Search ............ 365/149, 210, 94, 102

[56] References Cited

U.S. PATENT DOCUMENTS 5,062,077  10/1991  Takashima et al. ............. 365/210
5,148,063   9/1992  Hotta ............................... 365/210

FOREIGN PATENT DOCUMENTS 59-225615  12/1984  Japan .
60-47294    3/1985  Japan .

Primary Examiner—Joseph A. Popek
Assistant Examiner—Son Dinh
Attorney, Agent, or Firm—Steven M. Rabin

[57] ABSTRACT

A semiconductor memory device having typical DRAM memory cells and voltage lines selectively connected to the memory cells, functions as a ROM in which the stored data are partly rewritten to other data while the data in the memory cells having contact with the voltage line are used as common data. In the memory cells having contact with the voltage line, the voltage line, such a power supply line or a ground line, charges or discharges the bit line, whose voltage level is to be read out as stored data in lieu of actual stored data in the capacitor of the memory cell. The memory cell having contact with the voltage line functions as a ROM cell whereas the memory cell having no contact with the voltage line functions as a DRAM cell. ROM cells and DRAM cells on one chip are set arbitrarily by users, and read cycle operation of this memory device is performed with a high speed in the same manner as the read cycle operation of a typical DRAM.

29 Claims, 49 Drawing Sheets

SEMICONDUCTOR MEMORY DEVICE

CROSS-REFERENCE TO RELATED APPLICATIONS

This application claims priority benefits under 35 USC §119 of Japanese Application Serial No. Hei 5-012,888, filed Jan. 28, 1993, the entire disclosure of which is incorporated herein by reference.

BACKGROUND OF THE INVENTION

1. Field of the Invention

This invention relates to a semiconductor memory device and, more particularly, to a semiconductor memory device which employs memory cells functioning both as DRAM (Dynamic Random Access Memory) and as ROM (Read Only Memory).

2. Description of Related Art

DRAMs are typically arranged with a two dimensional memory cell array constituted of a plurality of memory cells. Each memory cell is accessible by an address input, some digits of which are used for row selection, and the rest of which are used for column selection. To perform such row and column selections, each memory cell is connected to one of the row lines, called word lines, and one of the column lines, known as bit lines.

In a high density memory device, each memory cell has a MOS transistor serving as a transfer gate and a capacitor serving as data storing means. The gate electrode of the MOS transistor is made of one of the word lines. One of the source and drain of the MOS transistor is connected to the one end of the capacitor, whereas the other of the source and drain is connected to the bit line. To read out data from the memory cell, the MOS transistor is turned on by the word line, thereby coupling the capacitor to the bit line so that the charges in the capacitor and the bit line are shared. Then, data in the bit line is amplified by a sense amplifier using another bit line as reference. This amplified data is then transferred to an output circuit through a data line pair, to be read out of the device.

Such DRAMs, though they can be realized with large capacity and low cost production, never keep stored data once the power is turned off. To the contrary, mask ROMs, EPROMs and EEPROMs can keep the stored data even if the power is turned off, but the mask ROMs, among such non-volatile memories, are unable to write the data therein and EPROMs and EEPROMs are unable to read or write the data at a high speed.

Many situations, in the case of designing electronics products, require RAMs and ROMs be used together so as to enjoy the benefits of both types of memories. Specially, when many volatile and non-volatile memories are required, respective memories, such as DRAMs and mask ROMs, are used together. In such a situation, however, there arise the following problems. First, RAMs and ROMs are generally designed to have a capacity of, for example, 256K, 1M, 4M, and so on, and namely, inflexibly available. As a result, especially ROMs are sometimes used in wasteful ways. Second, it is costly to use two types of semiconductor memory devices. Third, the process gap between DRAMs and ROMs is too large to fabricate the conventional type DRAM and ROM on a single chip, thereby causing high cost and requiring longer development time. Fourth, even if the fabrication on a single chip in turn were realized, the resulting chip would be no more than a memory device merely including two different control systems, and the development time for such a memory device would take more than twice as that for an ordinarily organized memory device. Moreover, performance evaluation has to be done separately for the two systems. Fifth, even if the fabrication on a single chip were realized, since different systems are built in one chip, RAM and ROM would have independent fault modes respectively, even after the chip is commercialized in the market, which causes high fault occurrence and complexity of analysis.

SUMMARY OF THE INVENTION

It is an object of the invention to provide a semiconductor memory device incorporating both a RAM area and a ROM area in a single chip, so that user of this device can determine each capacity of RAM and ROM to be used.

It is another object of the invention to provide a semiconductor memory device having almost the same access time as that of the conventional DRAM.

It is yet another object of the invention to provide a semiconductor memory device enabling development at a considerably lower developing cost, and in a shorter time and even preventing the device from being involved in serious troubles in the market.

The foregoing objects are accomplished with a semiconductor memory device having a plurality of bit line pairs, word lines, and memory cells and voltage feeding means for feeding respective voltage as the stored data in the memory cell. Each of the bit line pairs is divided into two bit lines in which one bit line serves as a reference for the other bit line, and each of the word lines is arranged to intersect said bit line pairs. Each memory cell delivers stored data thereof in the form of a voltage difference to one of the bit lines when selected by activating one of the word lines. The voltage feeding means is selectively connected to the memory cells, which function as ROMs' cells because the voltage is used as the stored data.

According to preferred embodiments of the invention, the memory cell connected to the voltage feeding means may include or exclude data storing means, for example, a capacitor. The memory cell includes a transfer gate for coupling the capacitor or the voltage feeding means with the bit line when the word line thereof is selectively activated.

The organization of the bit line pairs can take two constitutions: one is, so called, a folded bit line constitution in which the bit line pairs extend in one direction and are disposed on one side of sense amplifiers and the other is, so called, an open bit line constitution in which two bit lines of the bit line pairs extend in one direction and are respectively disposed on both sides of sense amplifiers. The two bit lines of the bit line pair are divided for positive and negative logic sections, respectively, with the center at the sense amplifier.

The voltage feeding means includes a plurality of first voltage lines for feeding a first level voltage and second voltage lines for feeding a second level voltage different from said first level voltage.

These two level voltages could be a ground level voltage and a power supply level voltage. In another embodiment, the voltage feeding means could be either a ground line or a power supply line, which is provided for only either the positive logic section or the negative logic section or provided commonly for both of said positive and negative logical sections with logic converting means for converting logical level of a read out signal from either the positive logic section or the negative logic section.

In accordance with another prefined embodiment, the semiconductor memory device is arranged with an X decoder for selectively activating the word lines selecting the memory cells in the positive logic section to which one series of sequential X addresses is assigned and in the negative logic section to which another series of sequential X addresses is assigned.

BRIEF DESCRIPTION OF THE DRAWINGS

The above and other objects and features of the invention are apparent to those skilled in the art from the following preferred embodiments thereof when considered in conjunction with the accompanied drawings, in which.

DETAILED DESCRIPTION OF THE PREFERRED EMBODIMENTS

Figure 1:
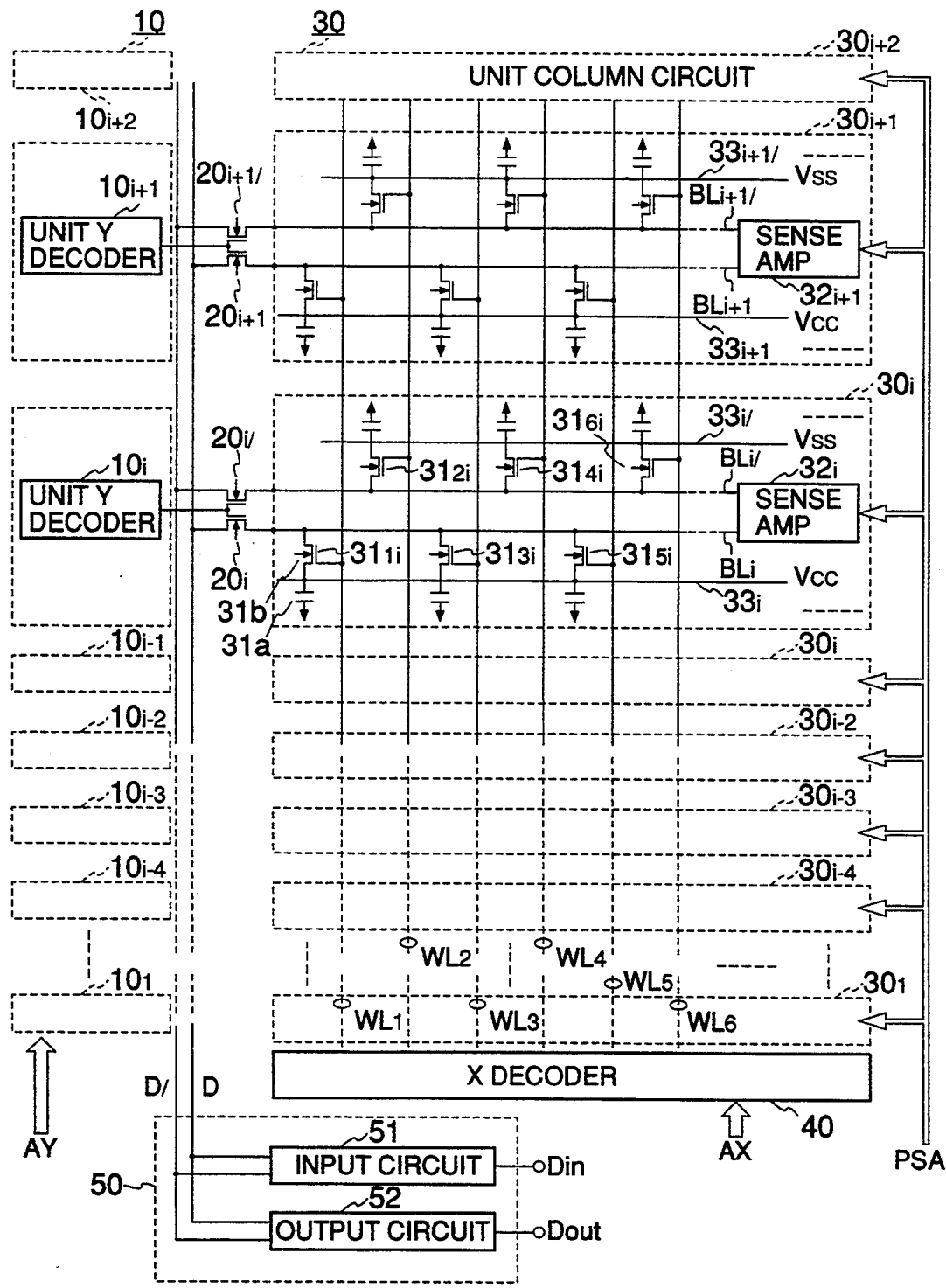
FIG. 1 is a circuit diagram illustrating a semiconductor memory device according to a first embodiment of the invention.
Figure 2:
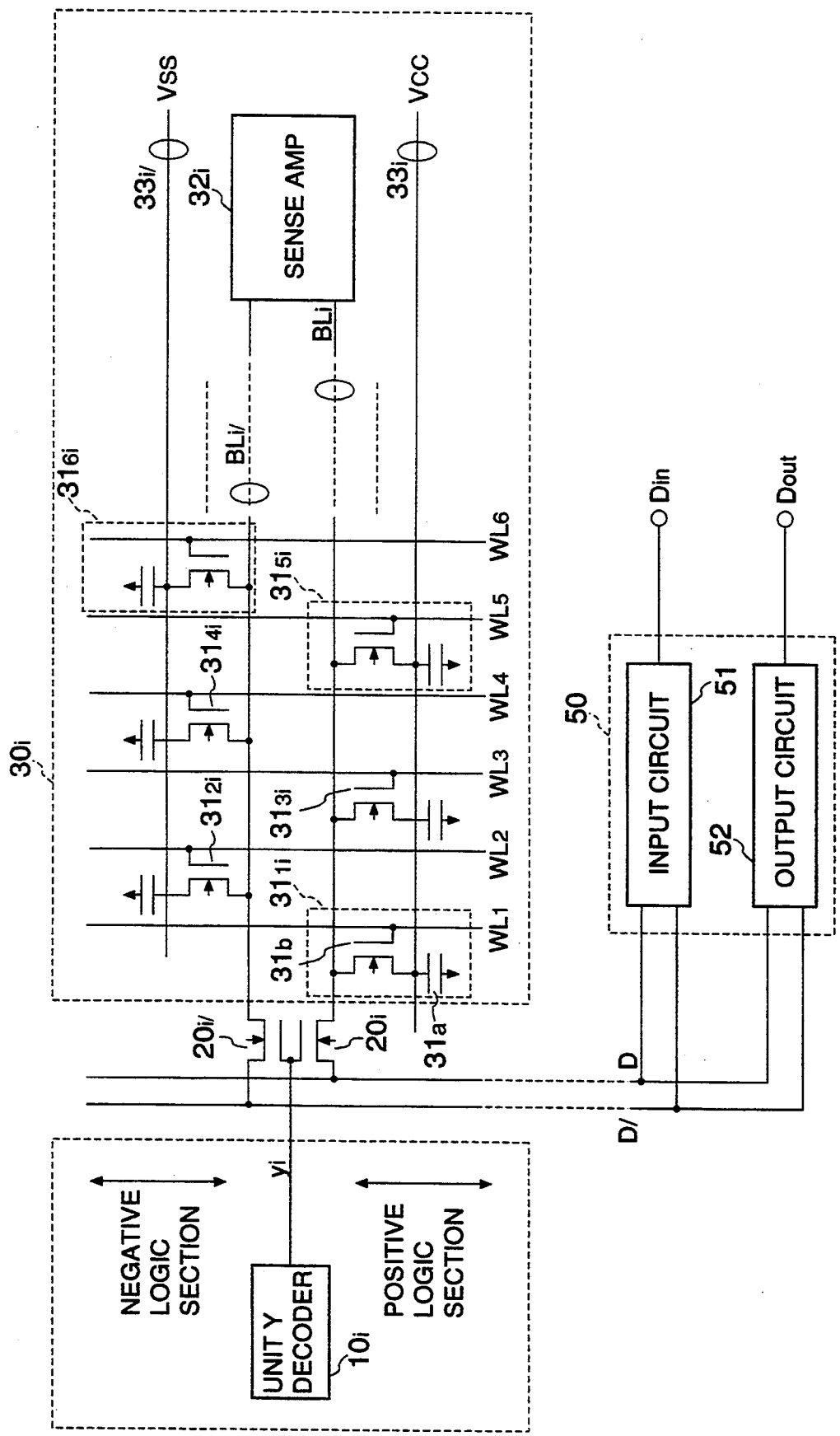
FIG. 2 is a circuit diagram illustrating a unit column circuit of the semiconductor memory device in FIG. 1.

Referring to the drawings in detail, in particular, to FIGS. 1 and 2, a semiconductor memory device according to a preferred embodiment of the invention is shown.

As shown in FIG. 1, the memory device includes a memory cell array composed of a plurality of unit column circuits $30i$ ($i=1$ to n, where n is an arbitrary integer), a Y decoder 10 composed of a plurality of unit Y decoders $10i$, an X decoder 40, and an input/output circuit 50 incorporating an input circuit 51 and an output circuit 52.

The Y decoder 10 acts for column selection in accordance with column address signal AY, one part of the address input. The Y decoder 10 is divided into a plurality of unit Y decoders $10i$, each of which delivers column selection signal yi to transfer gates $20i$, $20i/$ of the corresponding unit column circuit $30i$. The transfer gates $20i$, $20i/$ operate in a complementary manner. The transfer gate $20i$, formed of an NMOS transistor, turns on and off according to the level of the column selection signal yi. The complementary transfer gates $20i$, $20i/$, which correspond to one of the unit column circuits $30i$, are arranged between a complemtary bit line pair BLi, BLi/ and a data line pair D, D/.

The unit column circuit $30i$ includes a complemtary bit line pair BLi, BLi/ and a plurality of word lines WLk ($k=1$ to l, where l is an arbitrary integer) intersecting the bit line pair BLi, BLi/. Respective of one transistor-type memory cells are situated at the intersections of and connected to the intersection word lines and ones of bit lines BLi, BLi/. In the unit column circuit $30i$, a sense amplifier $32i$, activated by sense amplifier drive signal PSA, is connected between bit lines BLi, BLi/. One bit line BLi is connected to the memory cells $31_{1i}$, $31_{3i}$, $31_{5i}$, to $31_{l-1}$ at odd number positions, or in a positive logic section, of the column circuit. The other bit line BLi/ is connected to the memory cells $31_{2i}$, $31_{4i}$, $31_{6i}$, to $31_{l}$ at even number positions, or in a negative logic section, of the column circuit.

Each of these memory cells is connected to corresponding word lines WLk and WLl, respectively. The word lines WLk, WLl are arranged in order from $WL_1$ to WLk and $WL_1$ to WLl in accordance with the arranged order of the X address AX. The word lines WLk are activated for row selection in accordance with row address signal AX, the other part of the address input, through operation of the X decoder 40. Those word lines WLk are activated in turn when sequential row address signals AXk are received at the X decoder 40. The memory cell 31ki includes a capacitor $31a$ for storing data in the form of voltage and a transfer gate $31b$ constituted of an NMOS transistor. The capacitor $31a$ has one end connected to ½ VCC (½ power supply voltage) and the other end connected to one of the source and drain of the transfer gate $31b$. The transfer gate $31b$ is connected between the capacitor $31a$ and one of bit lines BLi or BLi/. The gate electrode of the transfer gate $31b$ is controlled so as to be turned on and off by the voltage level of the corresponding word line WLk.

First and second voltage lines, namely, a power supply line $33i$ (VCC) and a ground line $33i/$ (VSS), are provided in the unit column circuit $30i$. The power supply line $33i$ and the ground line $33i/$ are selectively connected with nodes between the capacitor $31a$ and the transfer gate $31b$ in the memory cell $31_{ki}$ serving as a ROM cell. The memory cells in which those lines $33i$, $33i/$ are not connected to the nodes thereof serve as ordinary DRAM memory cells. The power supply line $33i$ and the ground line $33i/$ feed respective voltages to the selected memory cells as stored data, corresponding to either "1" or "0", to make the memory cells act as ROM cells.

Referring to FIG. 2, memory cells $31_{1i}$, $31_{5i}$, $31_{6i}$ are fixedly used as ROM cells storing data "1". In the positive logic section, the high level voltage fed through the power supply line $33i$ corresponds to data "1", and in the negative logic section, the low level voltage fed through the ground line $33i/$ corresponds to data "0". Accordingly, the power supply line $33i$ is connected with the nodes of the memory cells $31_{1i}$, $31_{5i}$, and the ground line $33i/$ with the node of the memory cell $31_{6i}$.

The memory cells $31_{2i}$, $31_{3i}$, $31_{4i}$ are used as cells for storing data "0". Although these memory cells $31_{2i}$, $31_{3i}$, $31_{4i}$ serve as DRAM cells because of no connection with either the power supply line $33i$ or the ground line $33i/$, data "0" is written in these memory cells $31_{2i}$, $31_{3i}$, $31_{4i}$ right after the power is turned on so that the memory cells can store the data "0".

Each of the word lines WLk in the unit column circuits $30i$ is respectively selected by the X Decoder 40 which decodes the X address signal AX. The pair of data buss D, D/ are connected to the input/output circuit 50.

Since the bit line pairs BLi, BLi/ are used to write data in memory cells $31_{ki}$, the external input logic in the positive logic section, or on the side of the bit line BLi, is different from that in the negative logic section, or on the side of the bit line BLi/. In the positive logic section, when the input data to be written is logic "1", the memory cell $31_{ki}$ stores data logic "1", or a high level voltage (=VCC level), as it is. To the contrary, in the negative logic section, when the input data to be written is logic "1", the memory cell $31_{ki}$ stores data logic "0", or a low level voltage (=VSS), because the data line D/ transferring inverted data is connected to the memory cells $31_{ki}$ in the negative logic section. Even though the memory cells $31_{ki}$ store the reversed data "0", data "1" is regularly read out because the same route is used when read out.

The data line pair D, D/ are connected to each bit line pair BLi, BLi/ of all unit column circuits 30i. Each of the bit line pairs BLi, BLi/ is coupled with the data line pair D, D/ when the corresponding transfer gates 20i are closed, or conducting. The data line pair D, D/ is also connected to an input circuit 51 having an input terminal Din and an output circuit 52 having an output terminal Dout.

In operation, right after the power of the memory device is turned on, data "0" is written in all memory cells $31_{2i}$, $31_{3i}$, $31_{4i}$, . . . having no connection with either the power supply line 33i or the ground line 33i/. It is possible to write data "0" in all memory cells including the memory cells which are connected with the voltage lines VSS, VCC at the initializing stage. Writing data "0" in all memory cells readily allows the memory cells which are connected with each of the voltage lines VSS, VCC to store data "1", because, even having received data "0", the memory cells which are connected with the voltage lines VSS, VCC, charge or discharge the electron charges of the data "0" within a certain period through the voltage lines VSS, VCC, without retaining data "0". Accordingly, shortly after data "0" is written to even all memory cells, the memory cells $31_{1i}$, $31_{5i}$, $31_{6i}$, . . . , that is, each of the memory cells connected with one of the voltage lines can automatically hold data "1". The memory cells not connected with the voltage lines VSS, VCC, can reserve the data "0" as far as a refresh is made which is normally done in a DRAM.

Writing data "0" at the initializing stage allows this device to be use as a ROM every time. If the data of the memory cells connected with the voltage lines are not to be changed, but some data in the memory cells not connected is to be changed, the memory device can easily store other ROM data and be used as another ROM. That is, data in the memory cells not connected with the voltage lines VSS, VCC can be changed to other data since these memory cells are no more than DRAM cells, while data in the other memory cells are maintained. Therefore, data stored in this device can be altered another data, so that this device is used as another ROM storing another data.

Figure 3:
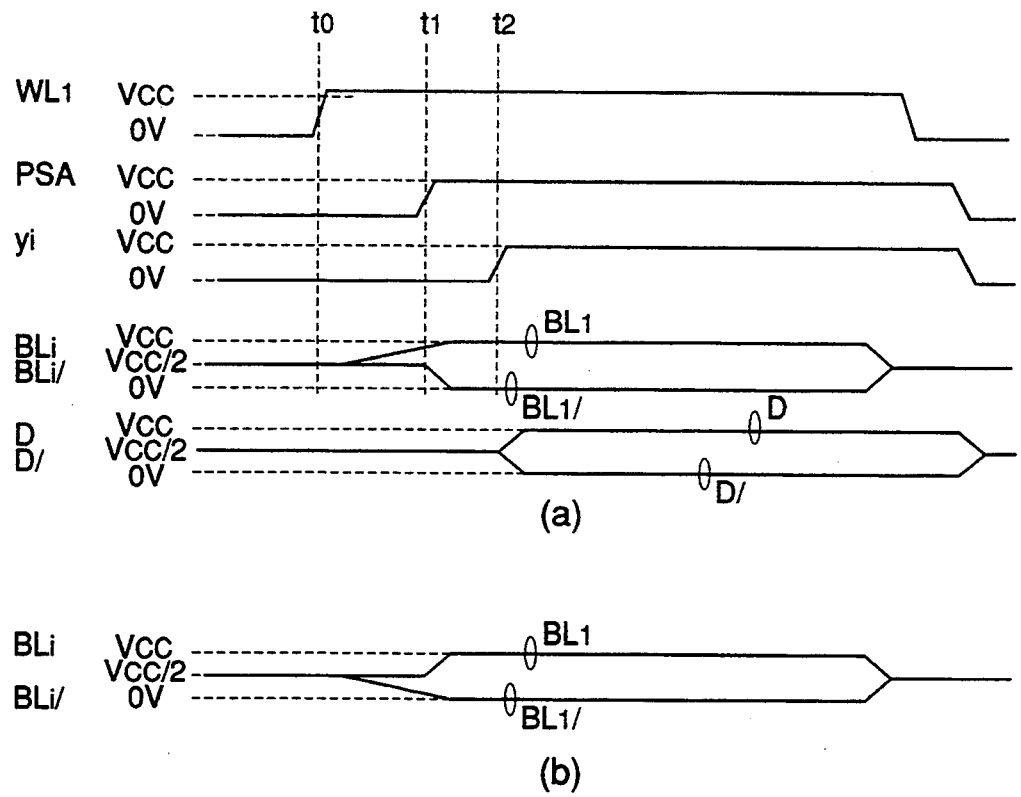
FIG. 3 is a time chart showing wave forms of signals during a read cycle for the semiconductor memory device in FIG. 1.

Referring to FIG. 3, the operation of the memory device during a read cycle is shown with wave forms of signals. In FIG. 3, (a) shows signals at a time when the word line $WL_1$ is selected in accordance with a positive logic selection, and (b) shows signals at a time that the word line $WL_6$ is selected in accordance with a negative logic selection.

In FIG. 3(a), in the positive logic section, a row address signal AX is decoded at the X decoder 40, and then, the word line $WL_1$ is raised to VCC at time $t_0$. Upon activating the word line $WL_1$, the memory cell $31_{1i}$ is selected in each unit column circuit, and the transfer gate 31b in the selected memory cell $31_{1i}$ is turned on. Then, bit line BLi is connected to the power supply line 33i supplying VCC voltage through the transfer gate 31b and the node if the memory cell $31_{1i}$ is connected with the power supply line 33i. Then, the voltage of the bit line BLi is raised gradually as shown in FIG. 3(a) with charges transferred from the power supply line 33i to the bit line BLi.

Needless to say, when the voltage on the word line $WL_1$ is raised, all memory cells $31_{ki}$ connected to the word line $WL_1$ function in the same way.

At time $t_1$, when the sense amplifier 32i is activated in response to a raised sense amplifier drive signal PSA, voltage difference DV between the bit line BLi and the bit line BLi/ is amplified so that the voltage on bit line BLi is shifted up to VCC, or logic "1" in the positive logic section, and that on the bit line BLi/ is shifted down to VSS. At that time, each sense amplifier 32i in each unit column circuit 30i is activated, and therefore, voltage differences of all bit line pairs BLi, BLi/ are amplified in the same manner. This operation functions for restoring or refreshing data in memory cells not connected with any voltage line.

The Y decoder 10 decodes the column address signal AY and activates one of column selection signals yi to VCC at time $t_2$ so that the corresponding transfer gates 20i, 20i/ turn to be conducting, thereby coupling the corresponding bit line pair BLi, BLi/ with the data line pair D, D/. As a result, the information amplified on the bit line pair BLi, BLi/ is transferred to the data line pair D, D/ and then delivered through the output circuit 52, to the output terminal Dout. Since the bit lines BLi, BLi/ are shifted to VCC and VSS, respectively, the data lines D, D/ are shifted to VCC and VSS, respectively. This makes the signal on output terminal Dout to be the logic "1".

When a memory cell connected with the ground line VSS in the negative logic section is selected, the ground line 33i/ pulls down the voltage on bit line BLi/ to deliver logic "1" of the negative logic.

For example, as shown in FIG. 3(b), in the case that the word line $WL_6$ is selected, the voltage on word line $WL_6$ is raised to VCC according to the corresponding decoded row address signal at time $t_0$. The word line $WL_6$ connects the ground line 33i/ with the bit line BLi/ by conducting the transfer gate 31b of the memory cell $31_{6i}$, thereby discharging charges on the bit line BLi/ to the ground line 33i/ through the memory cell $31_{6i}$.

Again it is noted that, when the voltage on word line $WL_6$ is raised, all memory cells $31_{6i}$, . . . function in the same way.

At time $t_1$, the sense amplifier 32i operates to amplify the voltage on the bit line pairs BLi, BLi/ in response to the sense amplifier drive signal PSA in the same manner described above. The voltage on bit line BLi/ is pulled down to VSS, logic "1" in the negative logic section. Then, the transfer gates 20i, 20i/ become conducting in accordance with the column address signal to couple the bit line pair BLi, BLi/ to the data line pair D, D/. Since the voltage on data line D/ is at a low level through coupling with the bit line BLi/, the output terminal Dout goes to a high level, logic "1".

As described above, the power supply line 33i and the ground line 33i/ supply voltage levels VCC and VSS, respectively, which are used for storing data of logic "1" in the memory cell at which the node is connected with these line 33i, 33i/. Therefore, the memory cell connected with one of the voltage lines can act as a ROM cell. The memory cells not connected with a voltage line act as a DRAM cell, so that after writing logic "0" initially, the memory cells keep the data "0" as long as the power is turned on.

It is to be noted that although the above described memory cells in the positive logic section and the negative logic section are connected with the power supply line 33i and the ground line 33i/, respectively, the memory cells in the positive logic section and the negative logic section can be connected with the ground line 33i/ and the power supply line 33$i$, respectively to make the memory cells connected with the voltage lines as if storing data of logical "0". In this case, data "1" is written right after the power is turned on to allow the device to be used as a ROM.

Figure 4:
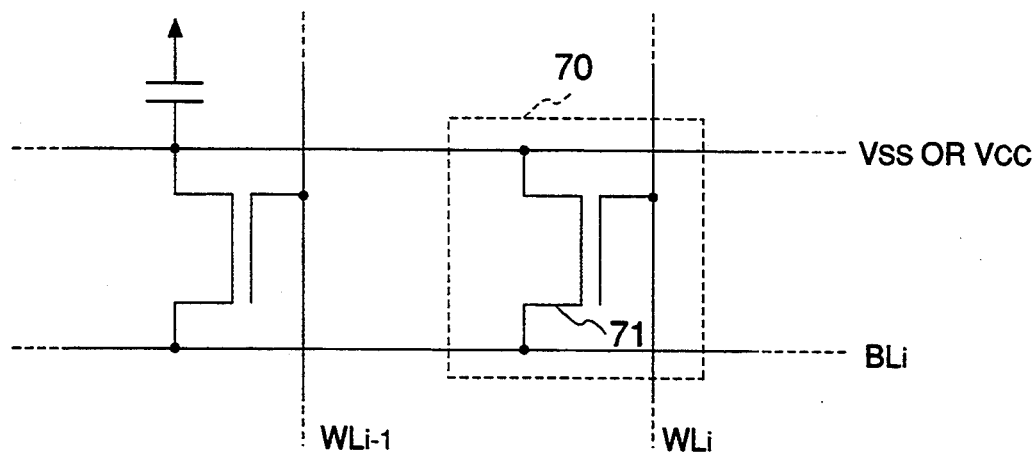
FIG. 4 is a circuit diagram illustrating another type memory cell for the semiconductor memory in FIG. 1.

Referring to FIG. 4, another type of the memory cell which can be used for this memory device is shown. The memory cell 70, connected with a power supply line VCC or a ground line VSS, includes an NMOS transistor 71 serving as a transfer gate and excludes any capacitor for storing data. The gate electrode of the NMOS transistor 71 is connected to the corresponding word line WL$i$. Using the memory cell 70 to function as a ROM cell, and excluding a capacitor, allows space for the contact between the node and the voltage line to be placed at a portion at which a capacitor is eliminated. Therefore, by using the memory cell having no capacitor, the memory device, used as a ROM, and fabricated by a DRAM process, is formed in a smaller size and can obtain higher density.

Figure 5:
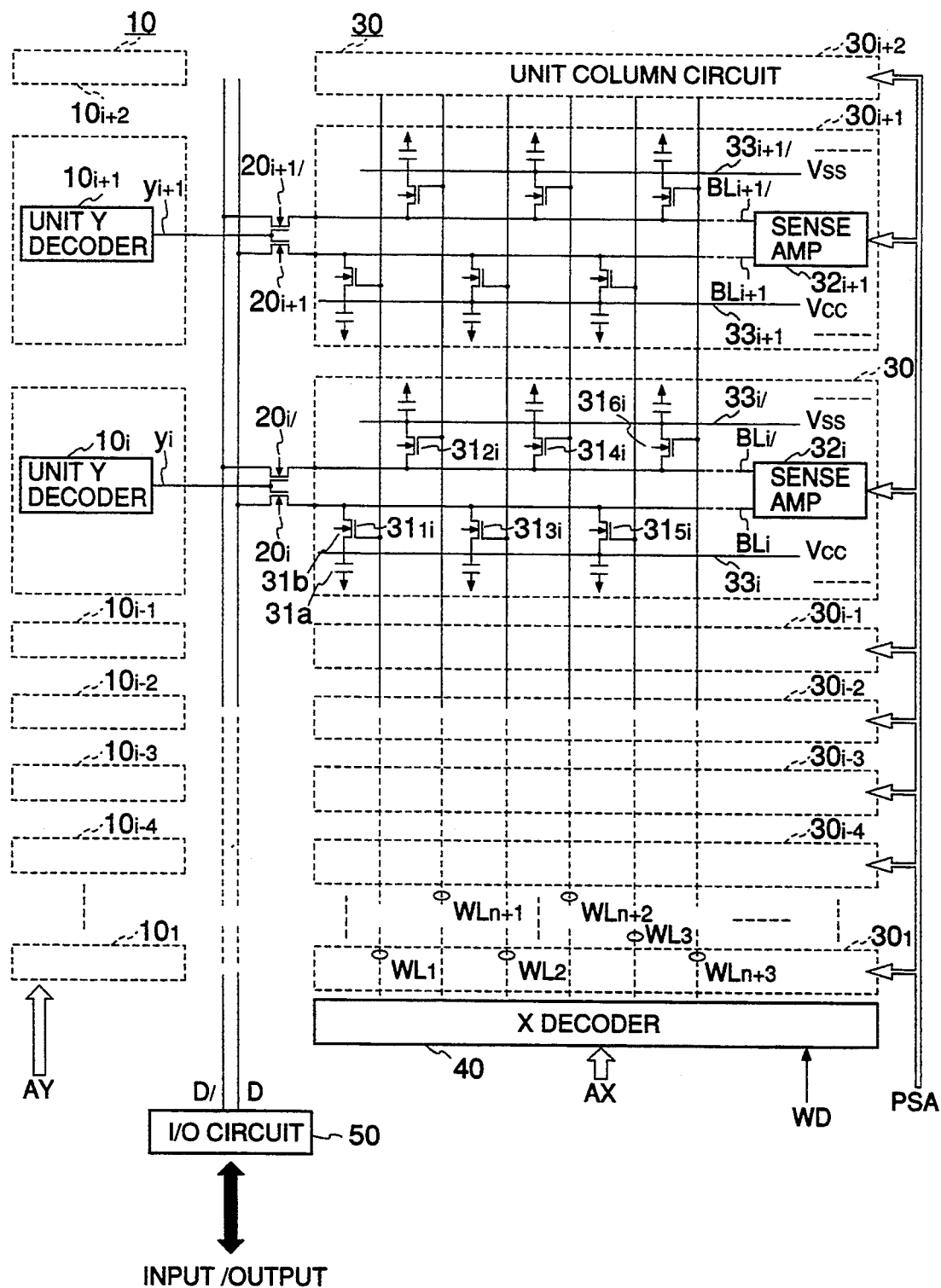
FIG. 5 is a circuit diagram illustrating a semiconductor memory device according to a second embodiment of the invention.

FIG. 5 shows another embodiment according to the present invention by illustrating its circuit diagram in which the identical elements shown in FIGS. 1 and 2 bear commonly the identical alfa-numeric numbers and detailed explanation thereof will be hereunder omitted for simplicity and avoid much duplicated explanations.

In this embodiment, the word line WL$k$ (k=1−l) is differently disposed as compared to that shown in FIG. 1, and the X decoder circuit 40 which selects the word line WL$k$ employs a different structure to correspond to the different word line structure. As shown in FIG. 5, the bit line BL$i$ is connected to the memory cells 31$_{1i}$, 31$_{3i}$, 31$_{5i}$, ..., 31$_k$ (k=odd number) disposed in odd locations, whereas the bit line BL$i$/ is connected to the memory cells 31$_{2i}$, 31$_{4i}$, 31$_{6i}$, ..., 31$_l$ (l=even number) disposed in even locations. The memory cells 31$_{1i}$, 31$_{3i}$, 31$_{5i}$, ..., 31$_k$, which are disposed in the positive logic section with the bit line BL$i$, are respectively connected to word lines WL$_1$, WL$_2$, WL$_3$, ..., the X address AX (A$_0$X, A$_0$X/—A$_m$X, A$_m$X/) of which are sequentially incremented. The memory cells 31$_{2i}$, 31$_{4i}$, 31$_{6i}$, ..., 31$_l$, which are disposed in the negative logic section with the bit line BL$i$/, are respectively connected to word lines WL$_{n+1}$, WL$_{n+2}$, WL$_{n+3}$, ..., the elements of the X address AX (A$_0$X, A$_0$X/—A$_m$X, A$_m$X/) of which are sequentially incremented.

Figure 6:
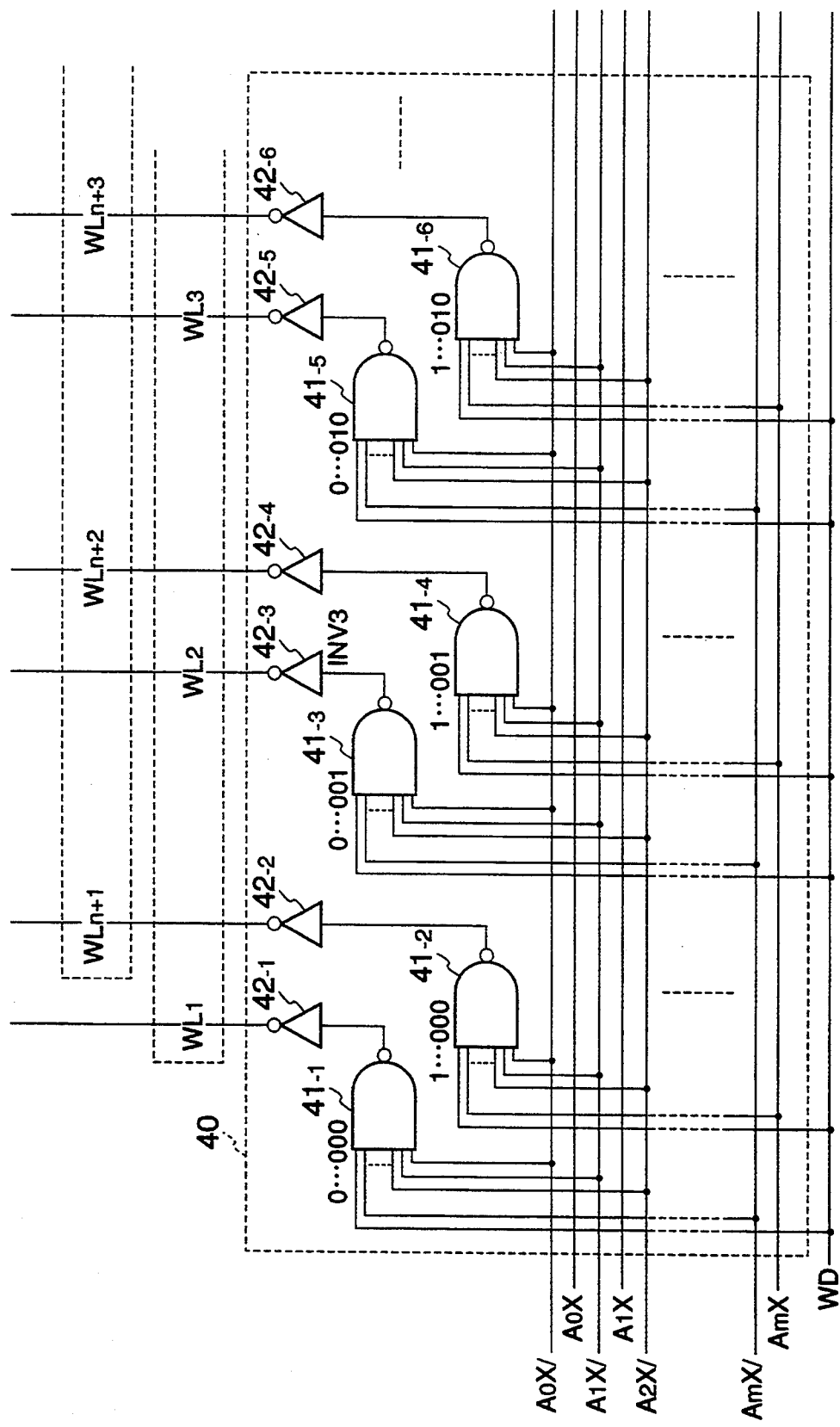
FIG. 6 is a circuit diagram illustrating another type X decoder for the semiconductor memory device in FIG. 1.

FIG. 6 shows another type of X decoder which can be used for this memory device. Although the X decoder in FIG. 1 activates the word lines WL so that sequential word lines WL have sequential row addresses, the X decoder in FIG. 6 activates two groups of the word lines WL so that the word lines am divided between the positive logic sections and the negative logic sections. In the X decoder 40 shown in FIG. 6, the word lines WL$_1$, WL$_2$, WL$_3$, ... connected to the memory cells 31$_{1i}$, 31$_{5i}$, ..., 31$_k$ have sequential row addresses, for instance, "000 ... 00", "000 ... 01", "000 ... 10", ..., respectively, in the positive logic section, and the word line WL$_{n+1}$, WL$_{n+2}$, WL$_{n+3}$, ... connected to the memory cells 31$_{2i}$, 31$_{4i}$, 31$_{6i}$, ... 31$_l$ have other sequential row addresses, for instance, "100 ... 00", "100 ... 01", "100 ... 10", ..., respectively, in the negative logic section. The X decoder 40 includes a number of NAND gates 41-1 to 41-6, ... and a number of inverters 42-1 to 42-6, ... that are connected to row address lines A$_0$X to A$_m$X (and A$_0$X/ to A$_m$X/) and a signal line for a word line drive enable signal WD. Each NAND gate is connected to the row address lines corresponding to the assigned address to decode the row addresses and is activated by the word line drive enable signal WD. The inverters 42-1 to 42-6, ... invert output level of the NAND gates and drive the word lines WL.

In operation, when the NAND gates 41-1 to 41-6, ... are activated by the word line drive enable signal WD, one of the word lines WL is selected according to the row address. In the decoder 40, if the first digit (MSB) of the row address is "1", then the memory cells in the negative logic section are to be selected, and if the first digit of the row address is "0", then the memory cells in the positive logic section are to be selected. When sequential row addresses are given, the memory cells in either the positive logic section or the negative logic section are to be selected unless the sequential address includes transition of the first digit. Therefore, sequential addresses can determine that the memory cells to be selected are in either the positive logic section or the negative logic section. As a result, this X decoder 40 makes analysis during the development period and quality tests readily, and, in case of a trouble in the market, makes analysis of the memory device readily.

The unit column circuit 30$i$ may be formed in another structure. Although the bit line structure in FIG. 1 indicates a folded or a closed bit line type, an open bit line type structure can be employed as shown in FIG. 7.

Figure 7:
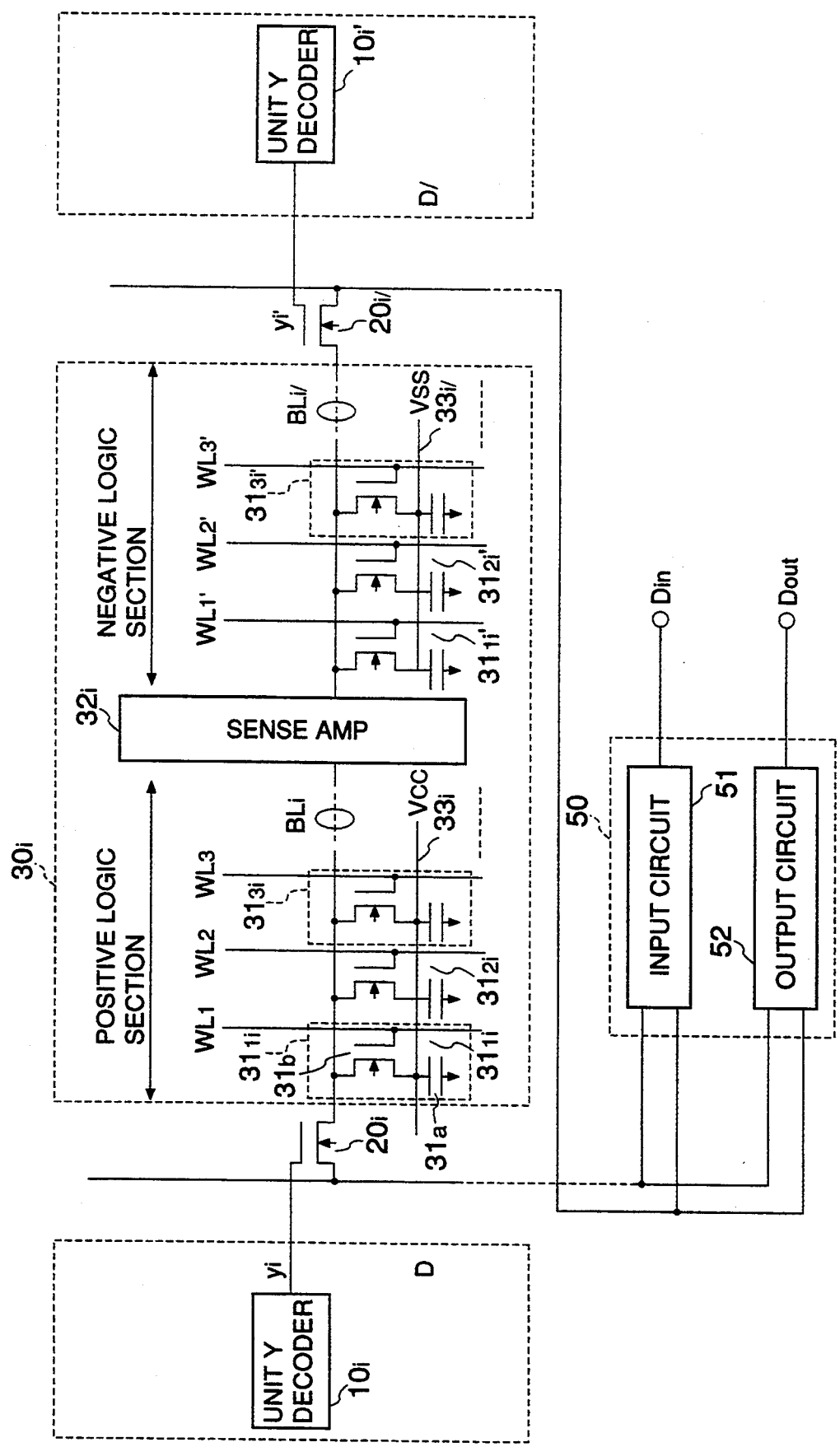
FIG. 7 is a circuit diagram illustrating another type unit column circuit of an open bit line constitution for the semiconductor memory device in FIG. 1.

As shown in FIG. 7, the Y decoder is divided into a unit Y decoder 10$i$ for delivering a column address signal y$i$ and a unit Y decoder 10$i'$ for delivering a column address signal y$i'$. A transfer gate 20$i$ provided on one side of the memory cell array is controlled to be on and off by the column address signal y$i$, whereas another transfer gate 20$i'$ provided on the other side of the memory cell array is controlled to be on and off by the column address signal y$i'$. The transfer gate 20$i$ couples the bit line BL$i$ in the positive logic section with the data line D; the transfer gate 20$i$/ couples the bit line BL$i$/ in the negative logic section with the data line D/. In one unit column circuit, the bit line BL$i$ in the positive logic section and the bit line BL$i$/ in the negative logic section extend in one direction and are connected to a sense amplifier 32$i$ located in the center thereof. A power (VCC) supply line 33$i$ is provided in the positive logic section extending in parallel to the bit line BL$i$; a ground (VSS) line 33$i$/ is provided in the negative logic section extending in parallel to the bit line BL$i$/. The power supply line 33$i$ is selectively connected to memory cells functioning as ROM cells, as in embodiments as described above, and so is the ground line 33$i$/. In this open bit line structure, the positive logic section and the negative logic section are completely separated in the terms of its layout. Therefore, this structure prevents the power supply line 33$i$ and the ground line 33$i$/ from short-circuiting and gives margin for fabrication and analysis of the memory device. Other voltage line formation, such as a power supply line in the negative logic section and a ground line in the positive logic section, is also possible with this open bit line structure.

Figure 8:
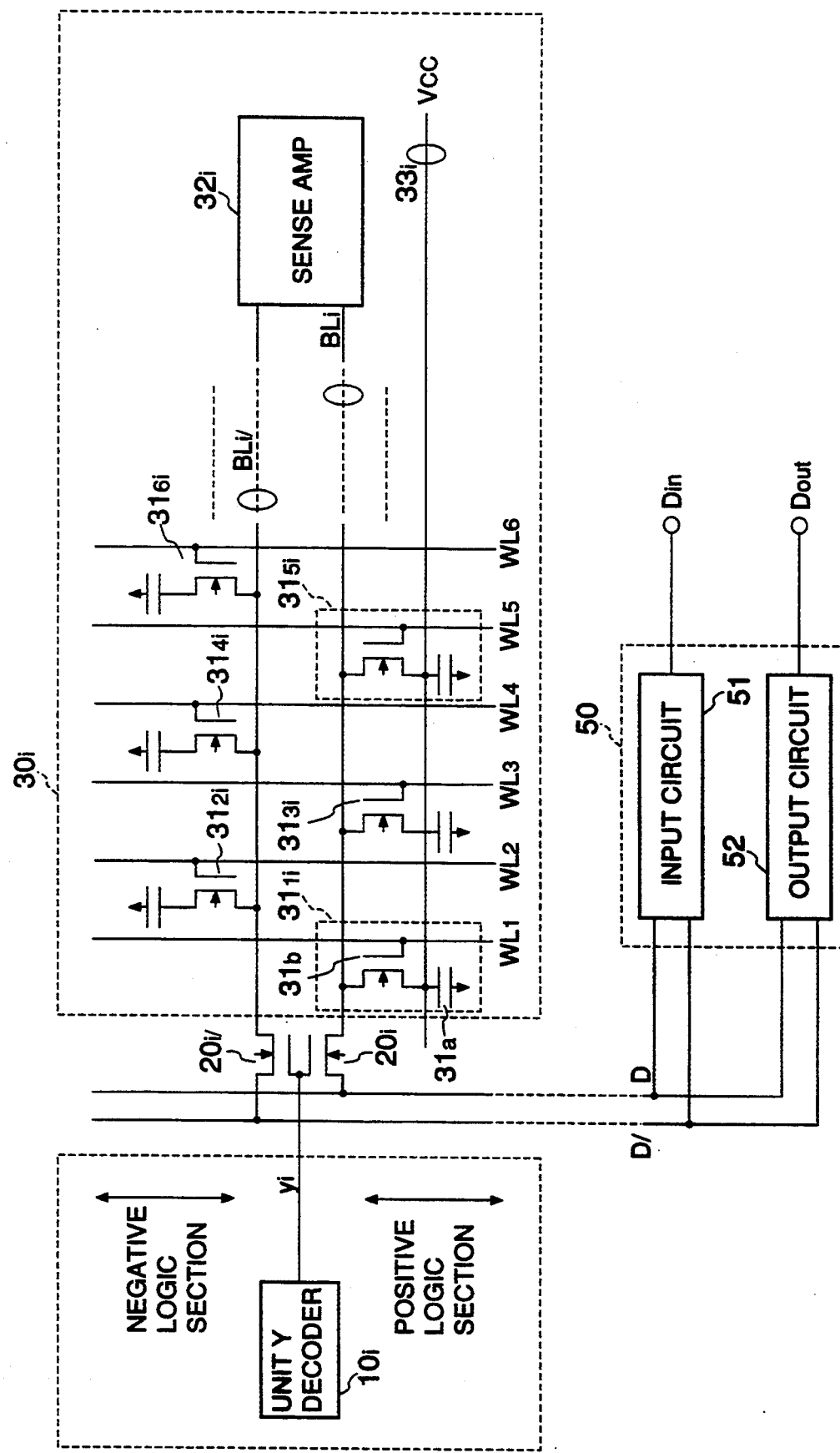
FIG. 8 is a circuit diagram illustrating another type column circuit for the semiconductor memory device in FIG. 1.

The memory device according to the invention may be formed with only one voltage line for either the positive logic section or the negative logic section. In FIG. 8, a unit column circuit 30$i$ formed with a power supply line 33$i$ is shown. Only the power supply line 33$i$ is arranged in the positive logic section, and no line is arranged in the negative logic section. With such a voltage line, regions for connections are required only in the positive logic section. This structure gives the memory cell a margin of occupied area and allows the memory cells in the negative logic section to be used entirely as DRAM cells. Only one kind voltage line prevents the memory device from short-circuiting and makes the analysis of the memory device easy. Moreover, using only the power supply line provides more reliable data than the ground line, because retention of a high level is more difficult than retention of a low level in such a DRAM cell and supplying VCC provides very stable stored data. In addition, using the power supply line allows the word line to be free from boosting.

Although, in FIG. 8, only the power supply line in the positive logic section is shown, this memory device is also able to employ a structure with one of a power supply line in the negative logic section, a ground line in the positive logic section, and a ground line in the negative logic section. Using the ground line as the voltage line for supplying stored data provides the following benefits. The ground line can be used in common for a ground line for the peripheral circuit of the memory device. Such a commonly used ground line gives a short wiring of a ground line on the chip, thereby providing a suitable margin for each cell's operation. In addition, the voltage VSS of the ground line is more stable than the voltage VCC of the power supply line, so that using the ground line provides more reliable circuitry.

Figure 9:
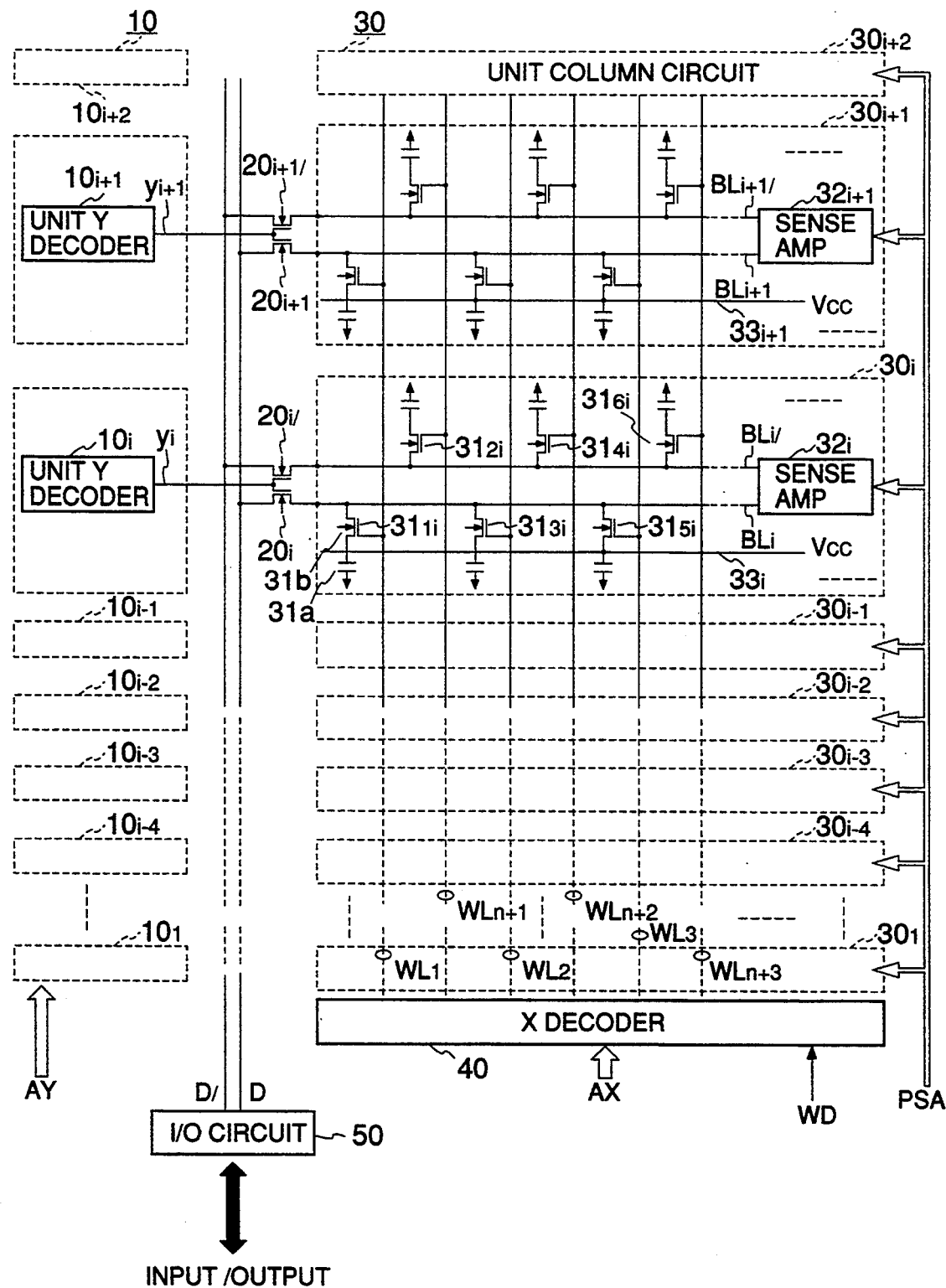
FIG. 9 is a circuit diagram illustrating a semiconductor memory device according to a fifth embodiment of the invention.

FIG. 9 shows a fifth embodiment of the invention, the basic structure of which is similar to one shown in FIG. 5. In this embodiment, the ground line 33$i$/ with which the ROM structure was made in the negative logic section in FIG. 5 is not provided, whereas only the power supply line 33$i$ is provided in the positive logic section to form the ROM structure.

In this embodiment, contrary to the embodiment shown in FIG. 5, the ROM structure is not formed in the negative logic section of the unit column circuit 30$i$ so that the similar functions can be achieved excluding the ROM structure.

Figure 10:
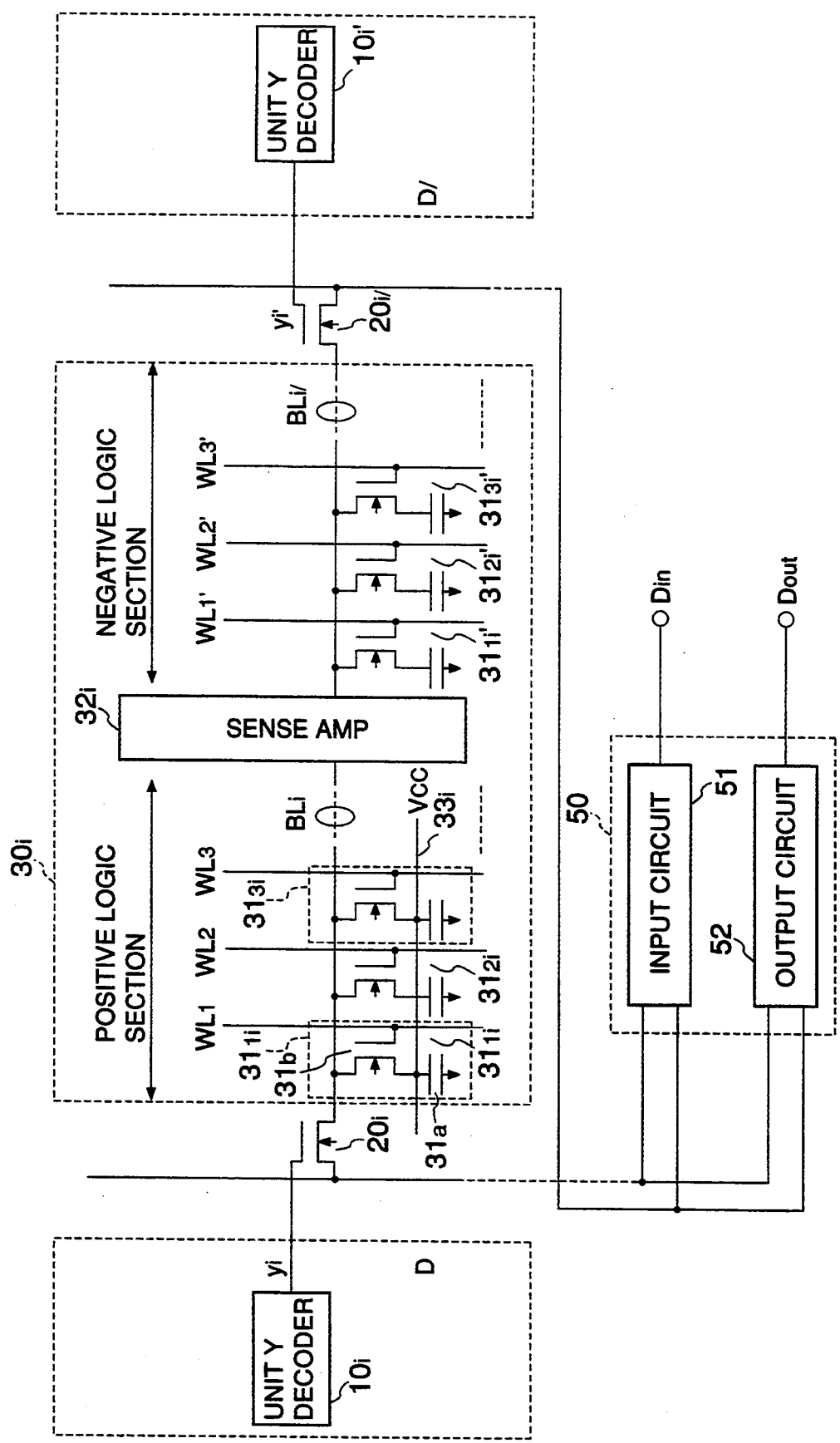
FIG. 10 is a circuit diagram illustrating a unit column circuit utilized in a sixth embodiment of the invention.

FIG. 10 shows a sixth embodiment of the invention, the basic structure of which is similar to that of the third embodiment shown in FIG. 7. In this embodiment, each of the unit column circuits 30$i$ employs an open bit line structure similar to the third embodiment but only the power supply line 33$i$ is provided in the positive logic section.

Figure 11:
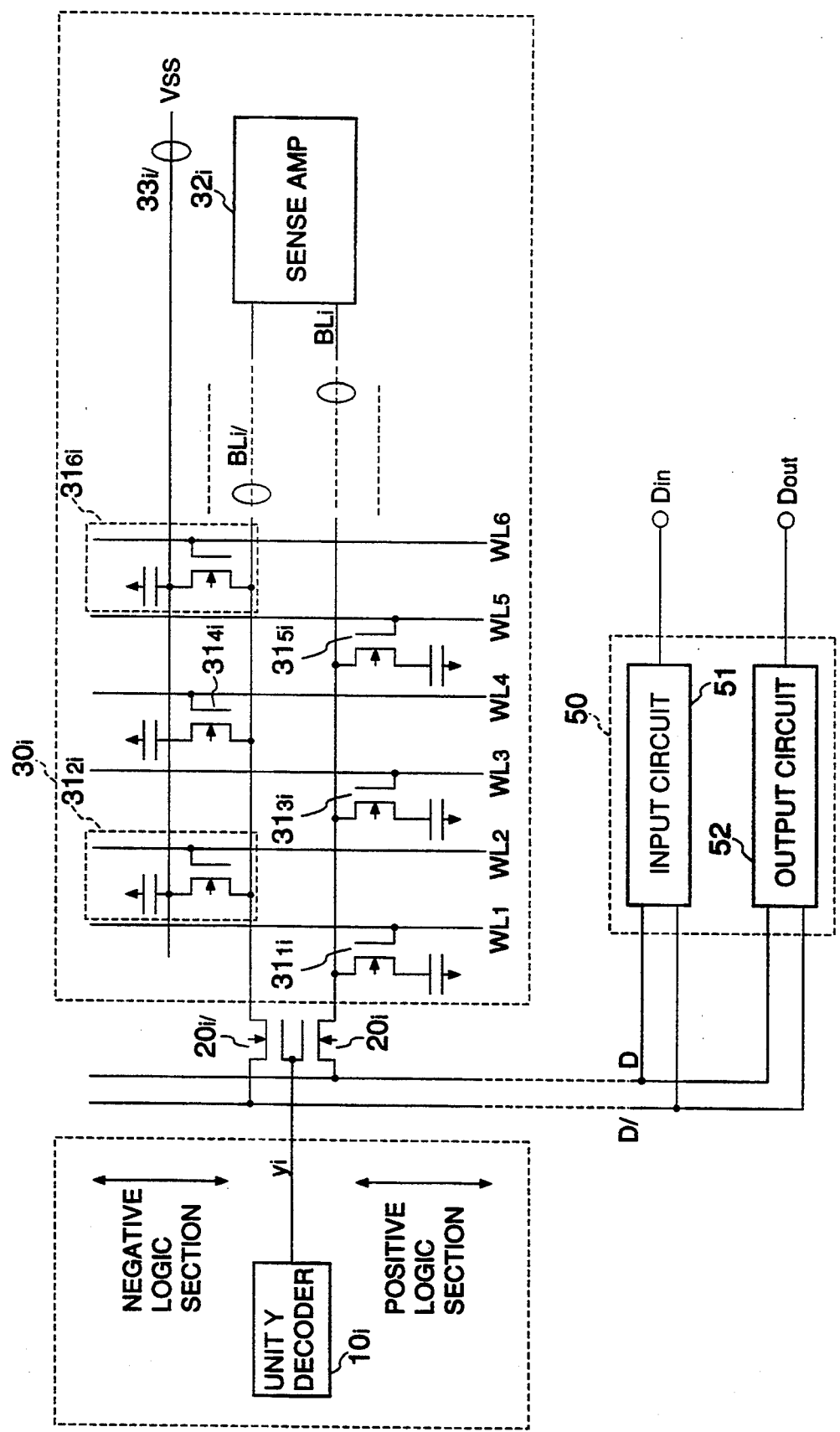
FIG. 11 is a circuit diagram illustrating a unit column circuit utilized in a seventh embodiment of the invention.

FIG. 11 shows a seventh embodiment of the invention, the basic structure of which is similar to that of the first embodiment shown in FIGS. 1 and 2. In this embodiment, only the ground line 33$i$/ is provided in the negative logic section of the unit column circuit 30$i$.

Figure 12:
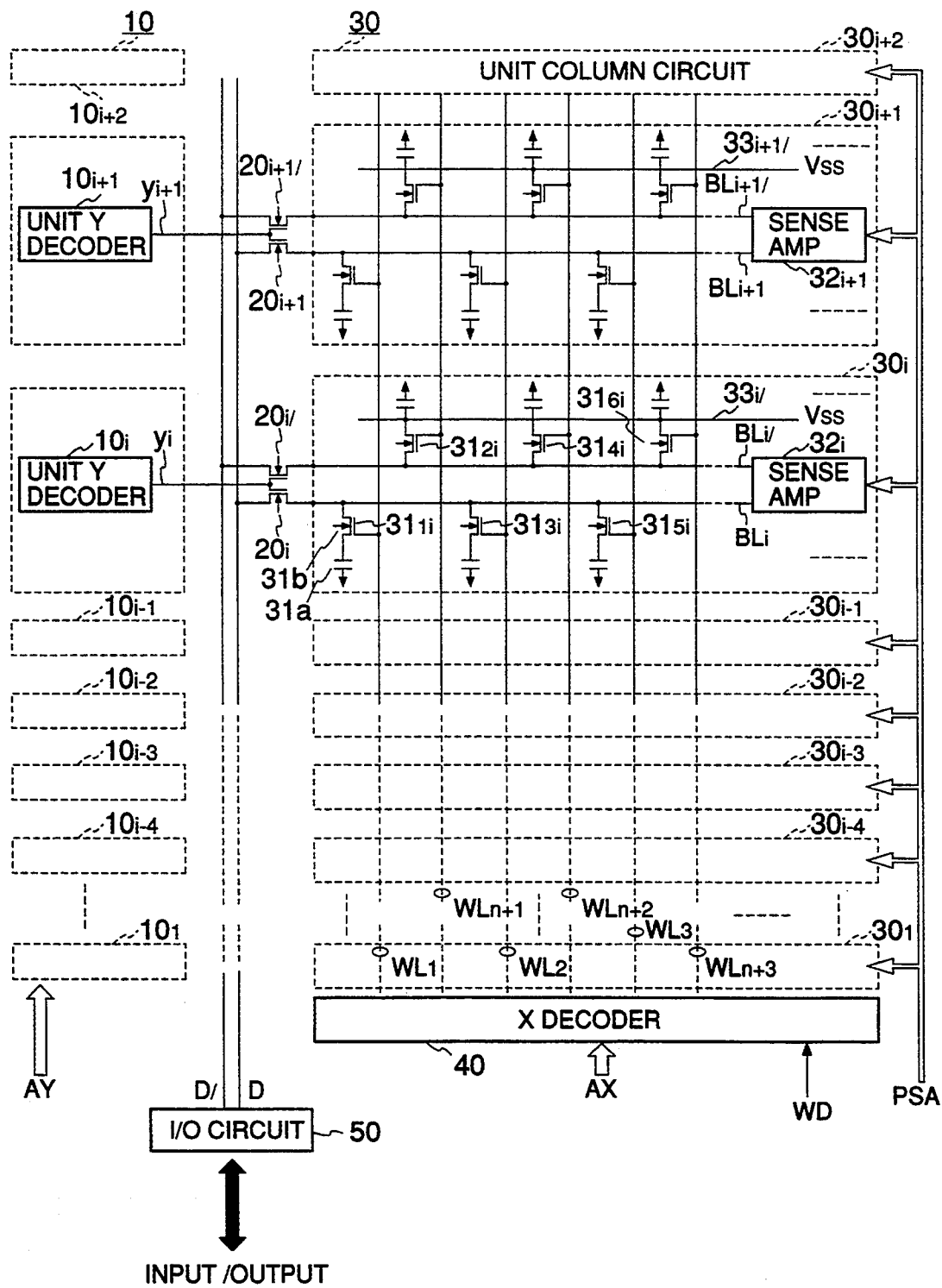
FIG. 12 is a circuit diagram illustrating a semiconductor memory device according to an eighth embodiment of the invention.

FIG. 12 shows an eighth embodiment of the invention having a similar structure to that of the second embodiment shown in FIG. 5. In this embodiment, the power supply line 33$i$ with which the ROM structure is formed in the positive logic section of the unit column circuit 30$i$ is not provided only the ground line 33$i$/ is provided to form the ROM structure in the negative logic section.

Further, the X decoder circuit 40 shown in FIG. 6 is employed.

Figure 13:
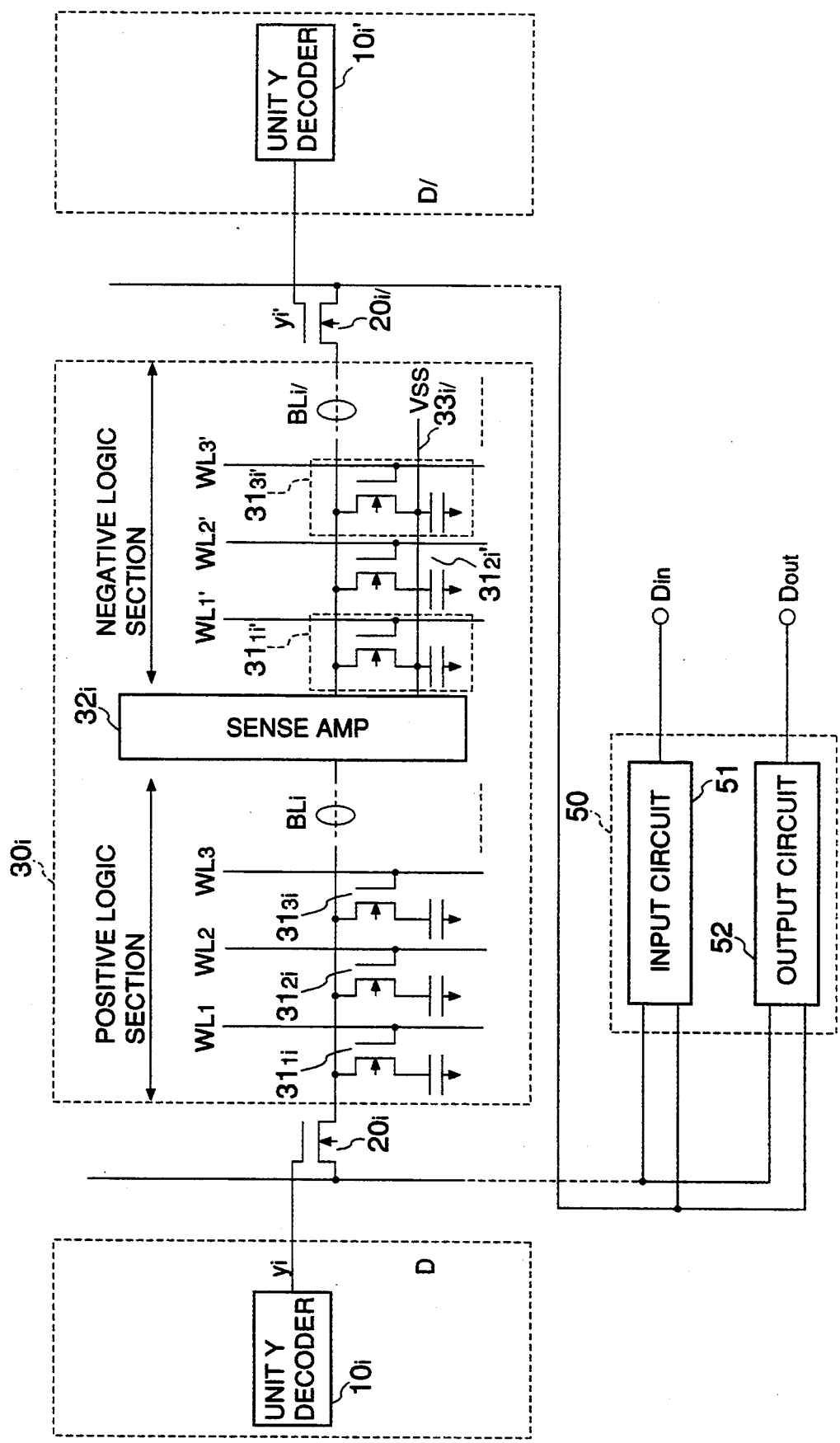
FIG. 13 is a circuit diagram illustrating a unit column circuit of the semiconductor memory device utilized for a ninth embodiment of the invention.

FIG. 13 shows a ninth embodiment of the invention, the basic structure of which is similar to that of the third embodiment employing an open bit line structure in each unit column circuit 30$i$ as shown in FIG. 7. In this embodiment, only the ground line 33$i$/ is provided in the negative logic section.

Figure 14:
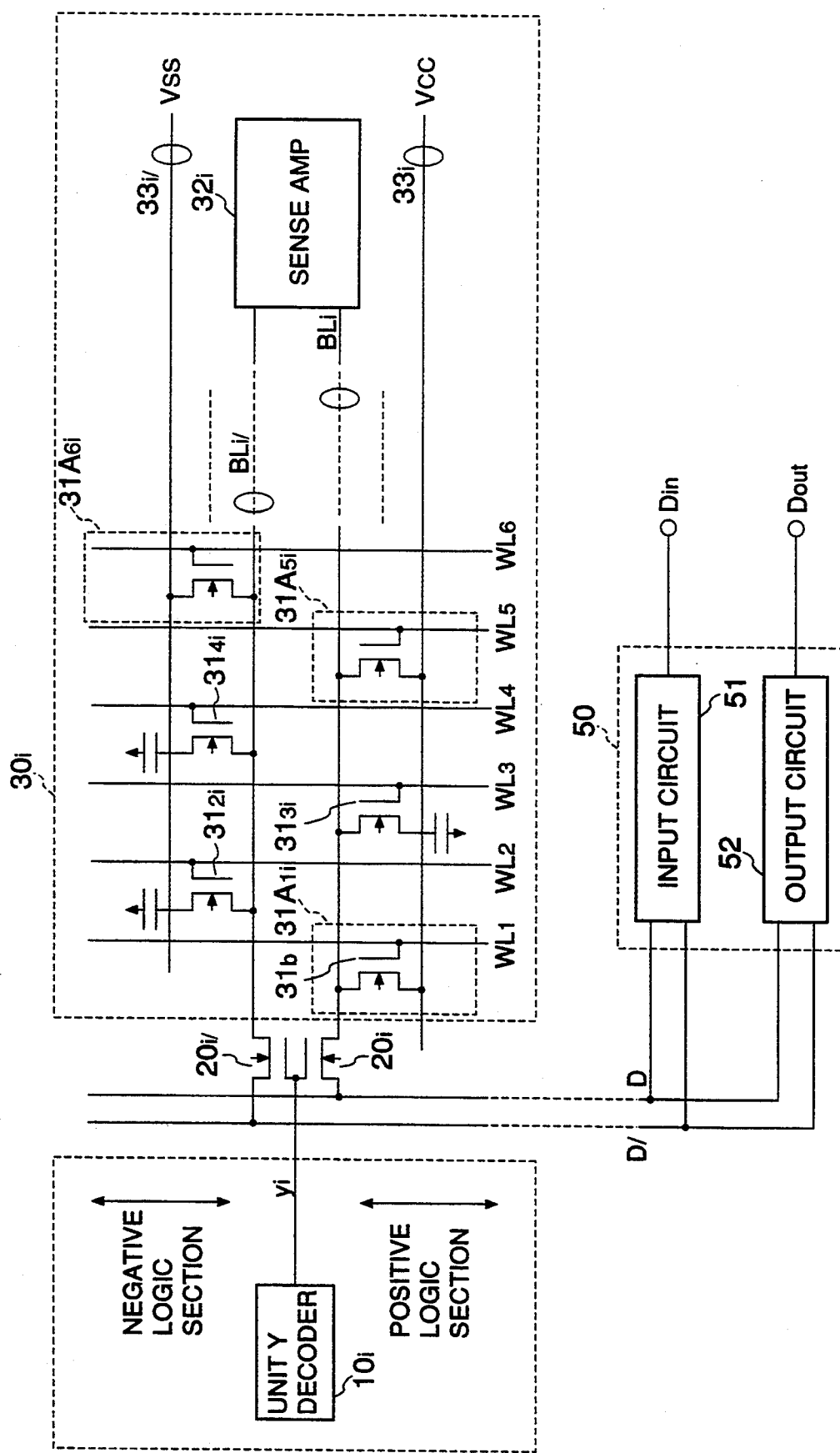
FIG. 14 is a circuit diagram illustrating a unit column circuit of the semiconductor memory device utilized for a tenth embodiment of the invention.

FIG. 14 shows a tenth embodiment of the invention, the basic structure of which is similar to that of the first embodiment shown in FIG. 2. In this embodiment, however, the memory cells 33A$_{1i}$, 31A$_{5i}$, 31A$_{6i}$, . . . connected to either the power supply line 33$i$ or the ground line 33$i$/ to form the ROM structure are each constituted of only the transfer gate 31$b$ without the capacitor 31$a$.

Figure 15:
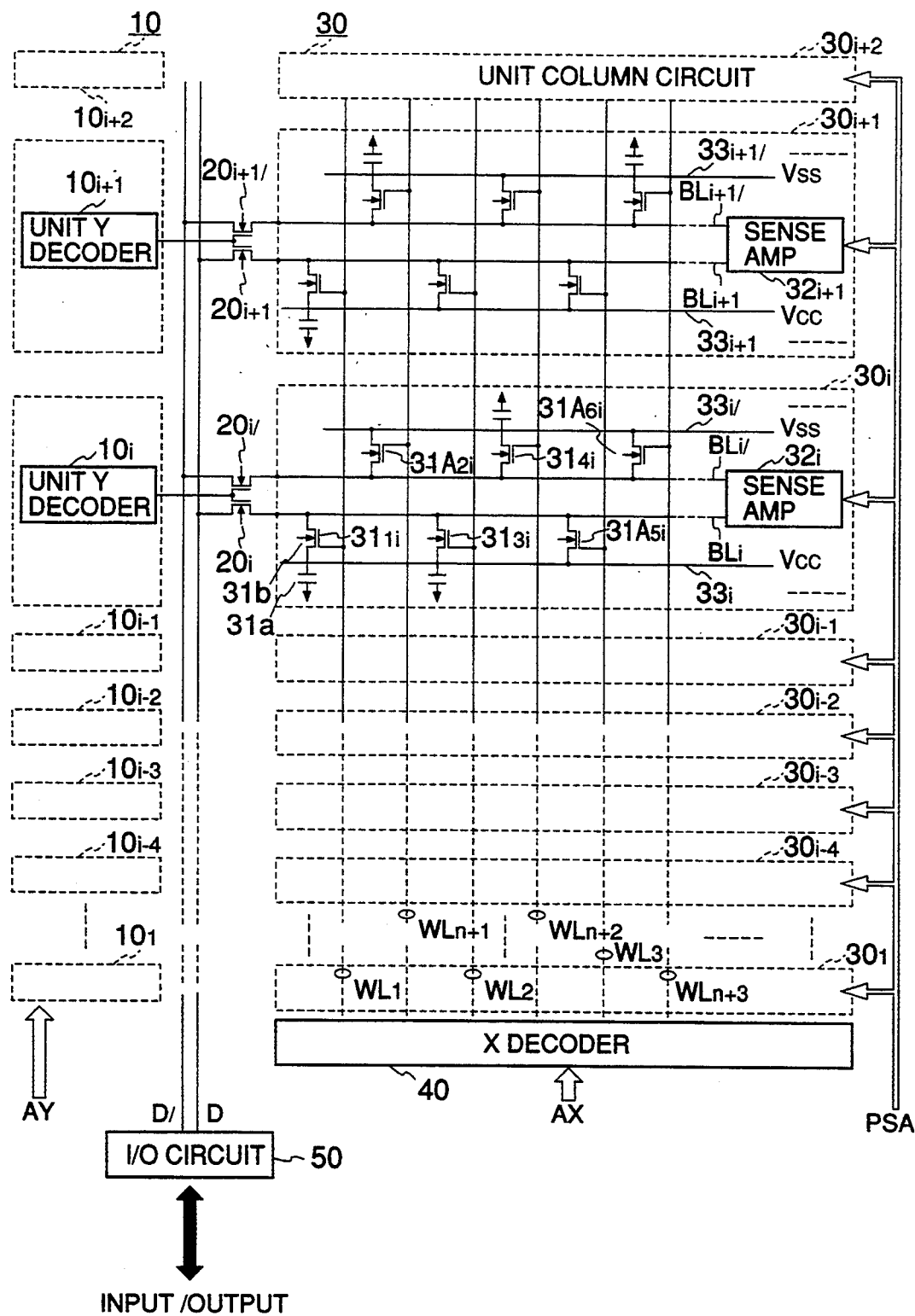
FIG. 15 is a circuit diagram illustrating a semiconductor memory device according to a 11th embodiment of the invention.

FIG. 15 shows an eleventh embodiment of the invention, the basic structure of which is similar to that of the second embodiment shown in FIG. 5. In this embodiment, however, the memory cells 31A$_{2i}$, 31A$_{5i}$, 31A$_{6i}$, . . . connected to either the power supply line 33$i$ or the ground line 33$i$/ to form the ROM structure are each constituted of only the transfer gate 31$b$ without the capacitor 31$a$.

Figure 16:
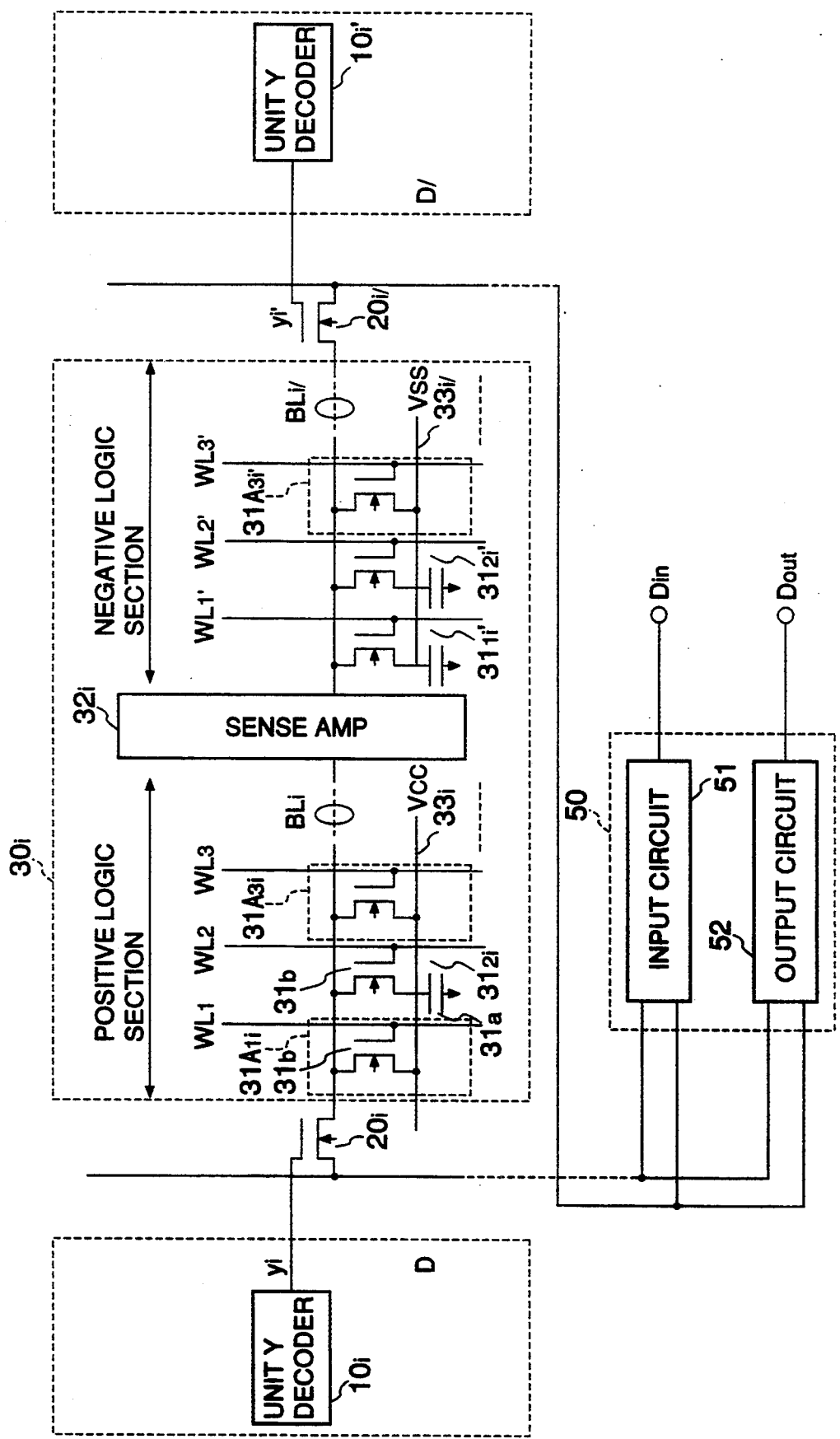
FIG. 16 is a circuit diagram illustrating a unit column circuit of the semiconductor memory device utilized for a 12th embodiment of the invention.

FIG. 16 shows a twelveth embodiment of the invention, the basic structure of which is similar to that of the second embodiment shown in FIG. 7. In this embodiment, the memory cells 31A$_{1i}$, 31A$_{3i}$, 31A$_{3i}'$, . . . connected to either the power supply line 33$i$ or the ground line 33$i$/ to form the ROM structure are each constituted of only the transfer gate 31$b$ without the capacitor 31$a$ and the other memory cells 31$_{2i}$, 31$_{2i}'$, 31$_{1i}'$, . . . are each constituted of both the capacitor 31$a$ and the transfer gate 31$b$.

Figure 17:
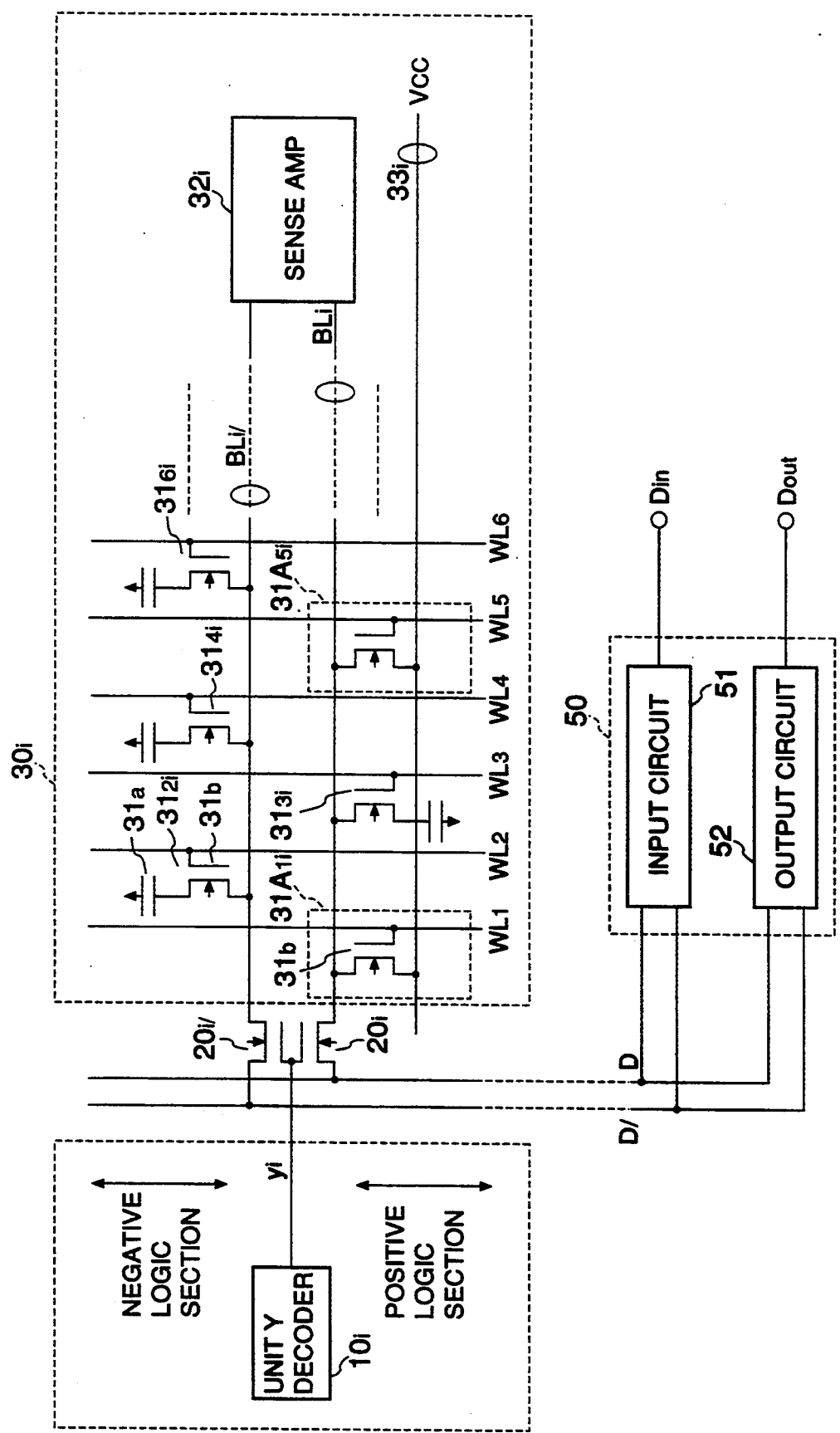
FIG. 17 is a circuit diagram illustrating a unit column circuit of the semiconductor memory device utilized for a 13th embodiment of the invention.

FIG. 17 shows a thirteenth embodiment of the invention, the basic structure of which is similar to that of the fourth embodiment shown in FIG. 8. In this embodiment each of the memory cells 31A$_{1i}$, 31A$_{5i}$, . . . for the ROM structure connected to either the power supply line 33$i$, is constituted of only the transfer gate 31$b$ without the capacitor 31$a$.

Figure 18:
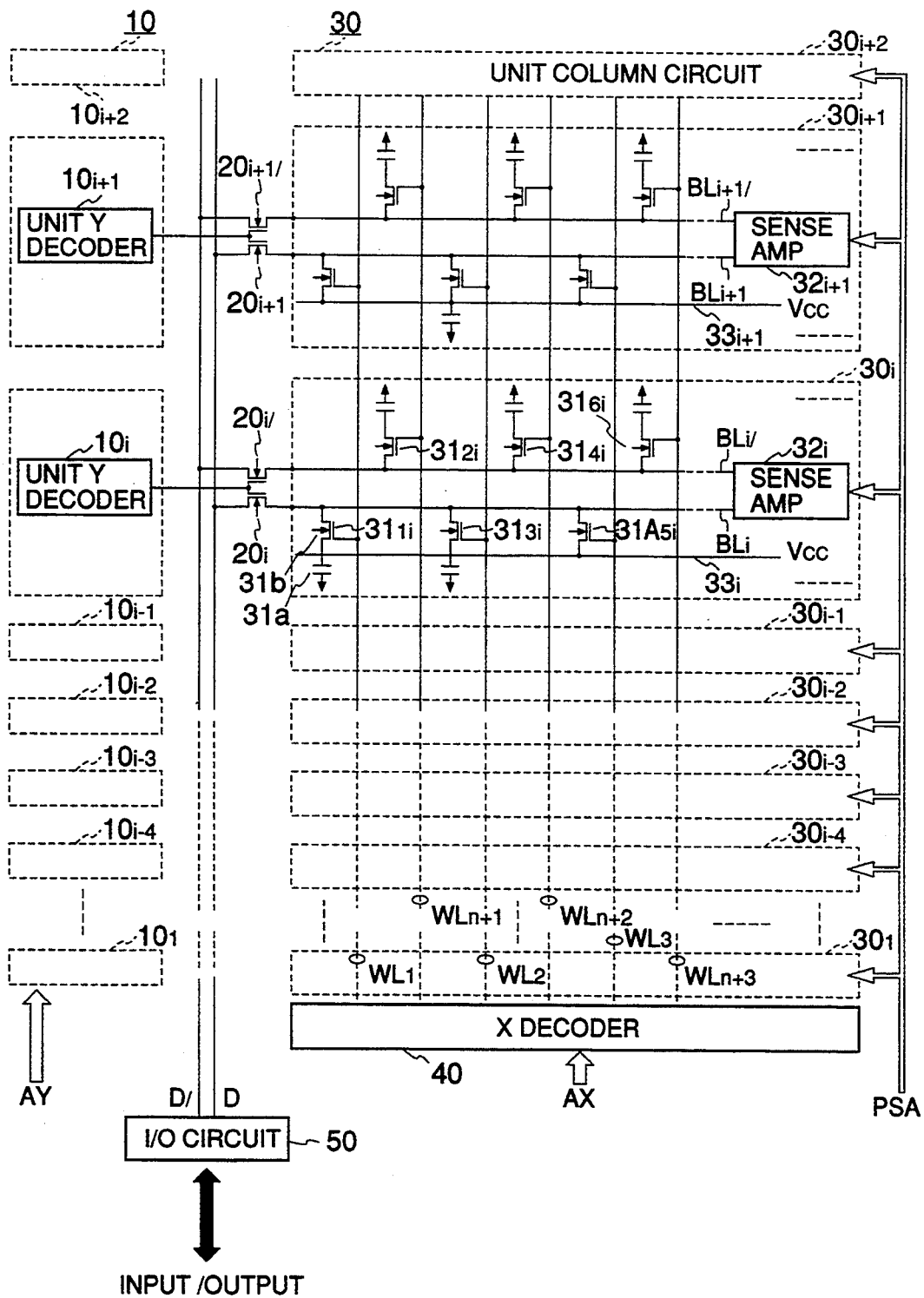
FIG. 18 is a circuit diagram illustrating a semiconductor memory device according to a 14th embodiment of the invention.

FIG. 18 shows a fourteenth embodiment of the invention, the basic structure of which is similar to that of the fifth embodiment shown in FIG. 9. In this embodiment the memory cells 31A$_{5i}$, . . . are each constituted of only the transfer gate 31$b$ without employing the capacitor 31$a$.

Figure 19:
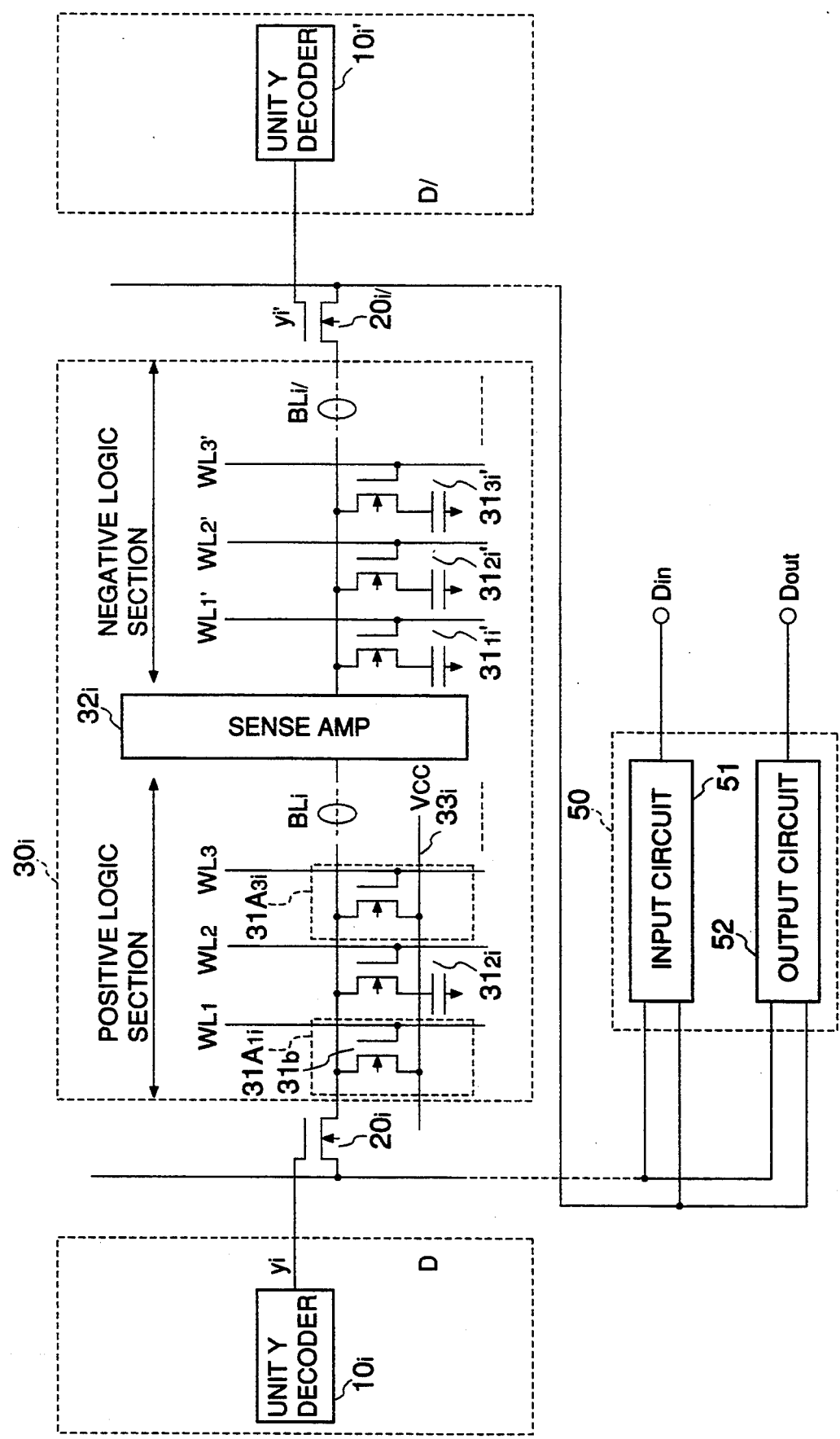
FIG. 19 is a circuit diagram illustrating a unit column circuit of the semiconductor memory device utilized for a 15th embodiment of the invention.

FIG. 19 shows an fifteenth embodiment of the invention, the basic structure of which is similar to that of the sixth embodiment shown in FIG. 10. In this embodiment, the memory cells 31A$_{1i}$, 31A$_{3i}$, . . . connected to the power supply line 33$i$ each are each constituted of only the transfer gate 31$b$ without employing the capacitor 31$a$.

Figure 20:
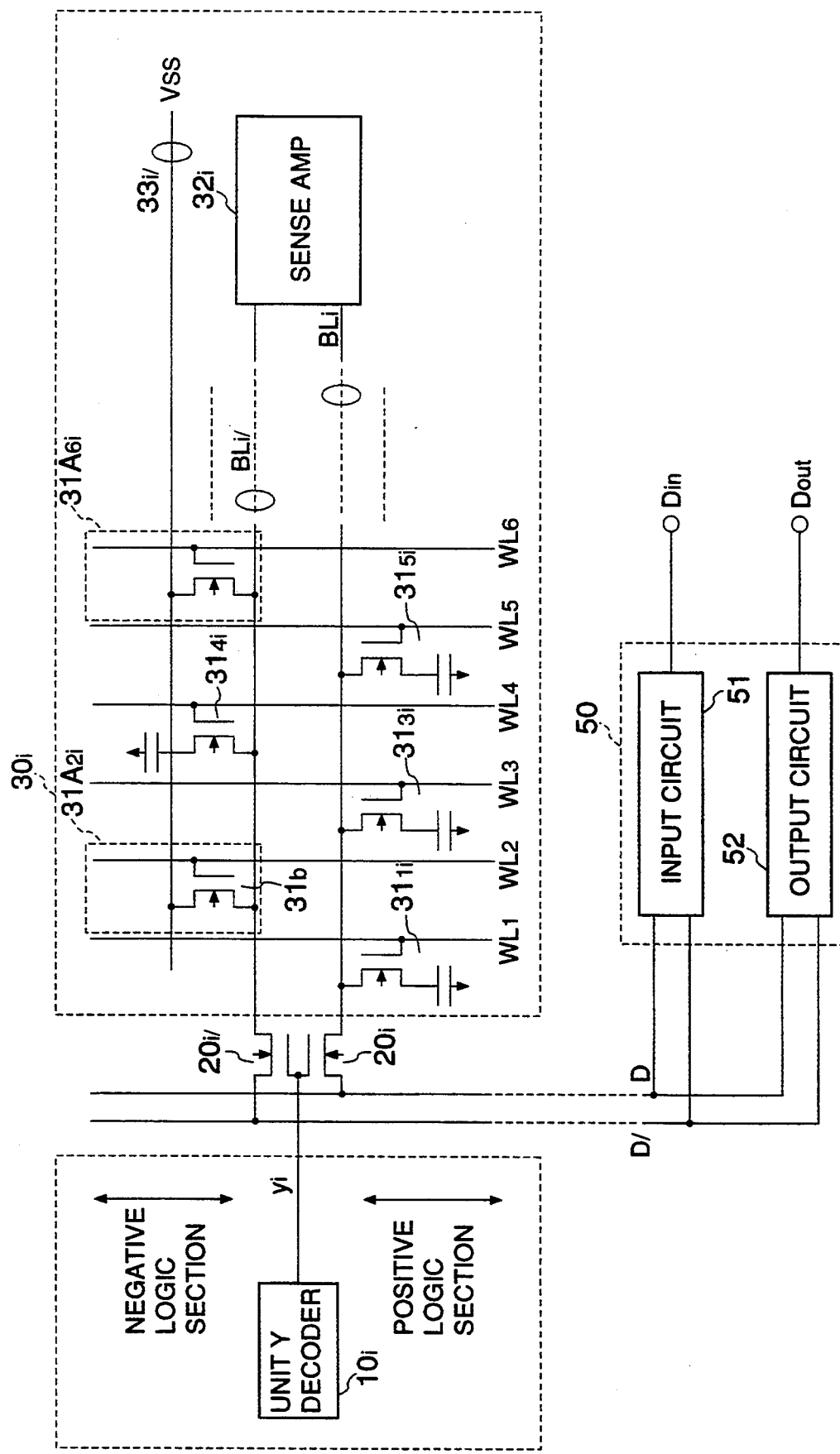
FIG. 20 is a circuit diagram illustrating a unit column circuit of the semiconductor memory device utilized for a 16th embodiment of the invention.

FIG. 20 shows a sixteenth embodiment of the invention, the basic structure of which is similar to that of the seventh embodiment shown in FIG. 10. In this embodiment, the memory cells 31A$_{2i}$, 31A$_{6i}$, . . . connected to the ground line 33$i$/ are each constituted of only the transfer gate 31$b$ without employing the capacitor 31$a$.

Figure 21:
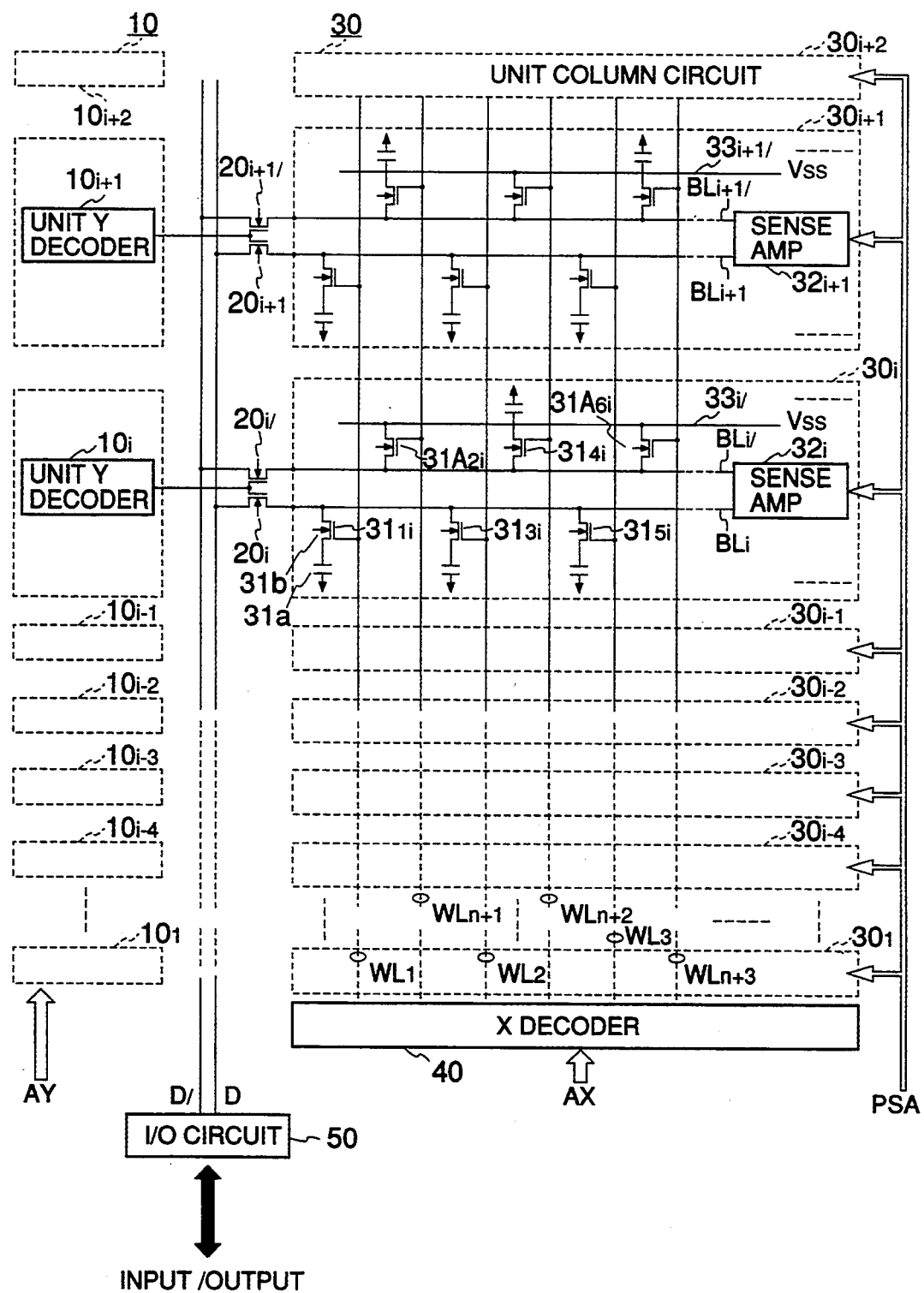
FIG. 21 is a circuit diagram illustrating a semiconductor memory device according to a 17th embodiment of the invention.

FIG. 21 shows a seventeenth embodiment of the invention, the basic structure of which is similar to that of the eighth embodiment shown in FIG. 12. In this embodiment, the memory cells 31A$_{2i}$, 31A$_{6i}$, . . . connected to the ground line 33$i$/ are each constituted of only the transfer gate 31$b$ without employing the capacitor 31$a$.

Figure 22:
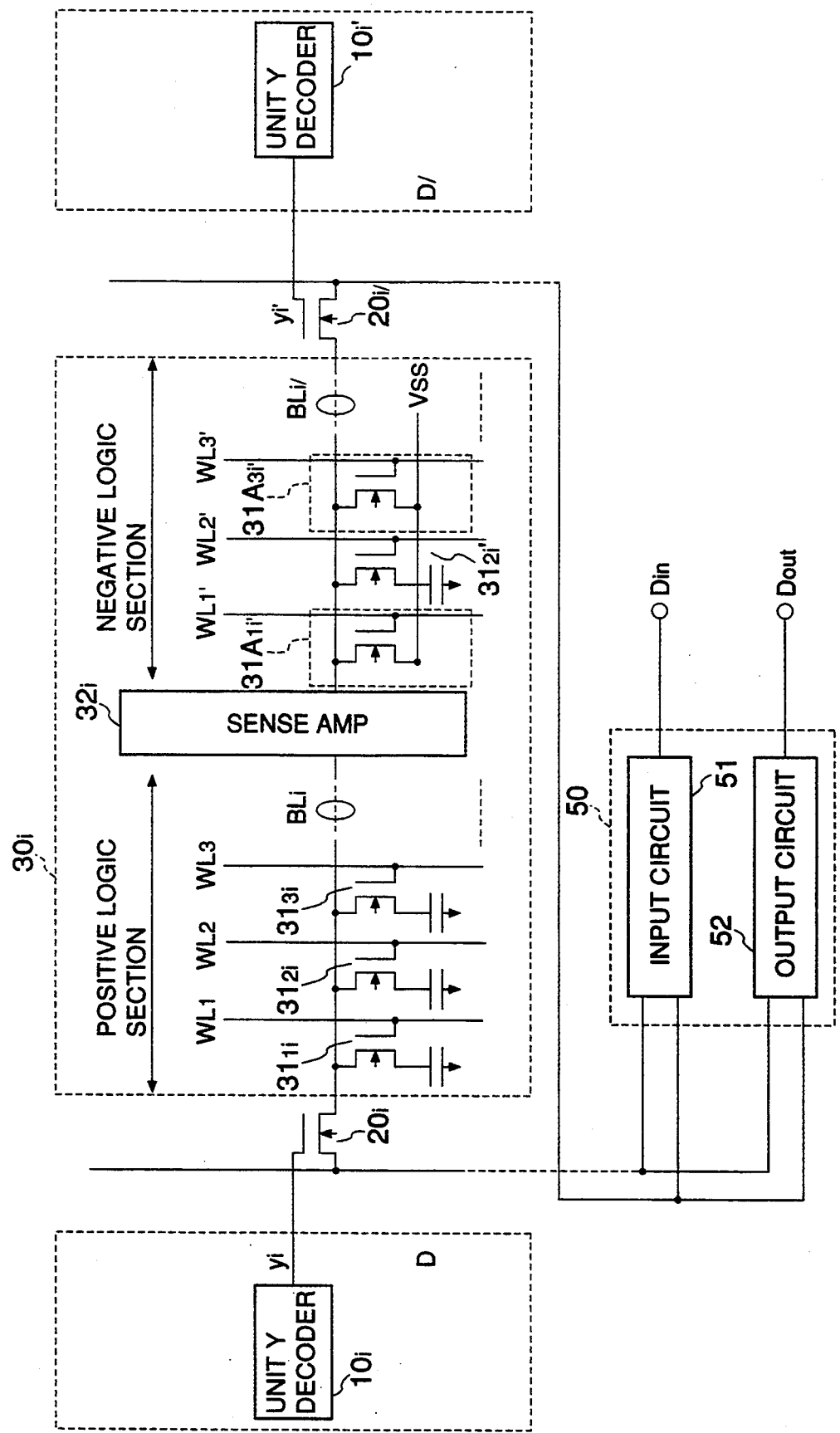
FIG. 22 is a circuit diagram illustrating a semiconductor memory device according to a 18th embodiment of the invention.

FIG. 22 shows an eighteenth embodiment of the invention, the basic structure of which is similar to that of the ninth embodiment shown in FIG. 13. In this embodiment, the memory cells 31A$_{1i}'$, 31A$_{3i}'$, . . . connected to the ground line 33$i$/ are each constituted of only the transfer gate 31$b$ without employing the capacitor 31$a$.

Figure 23:
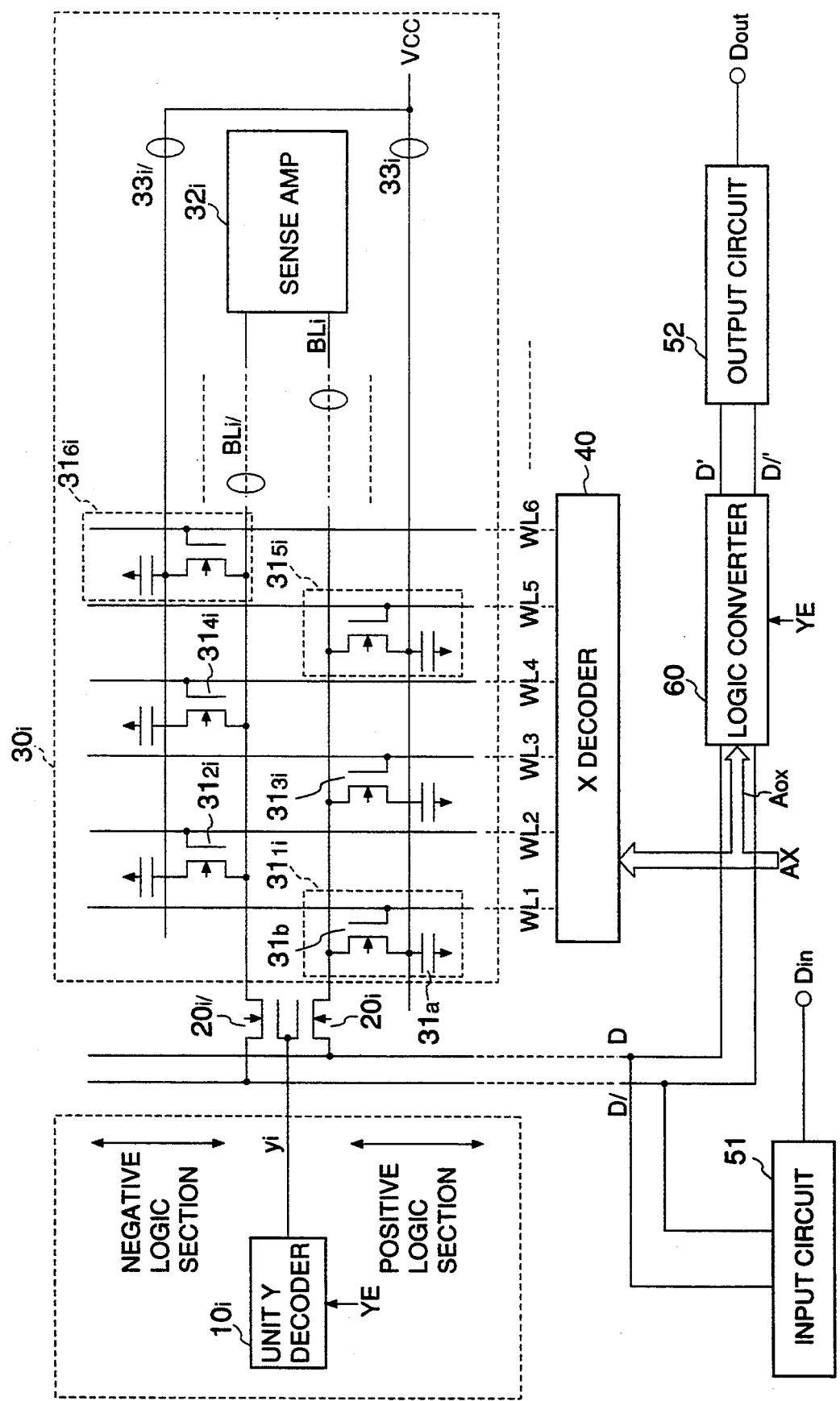
FIG. 23 is a circuit diagram illustrating a semiconductor memory device according to a 19th embodiment of the invention.
Figure 24:
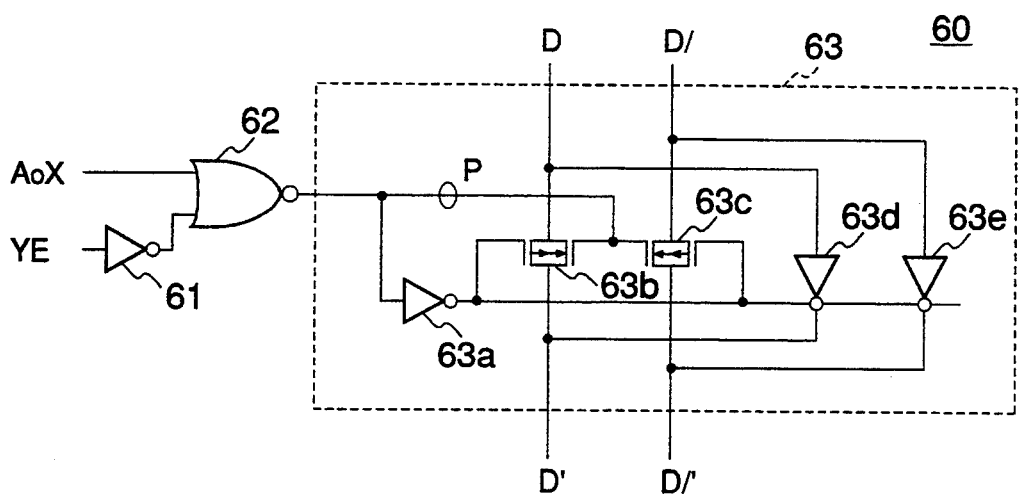
FIG. 24 is a circuit diagram illustrating the logic converter shown in FIG. 23.

FIG. 23 shows a nineteenth embodiment of the invention; and FIG. 24 shows a circuit diagram of a logic converter 60 employed in FIG. 23. The basic structure is similar to that of the first embodiment shown in FIGS. 1 and 2.

The differences from the foregoing embodiments are that memory cells $31_{1i}$, $31_{5i}$, $31_{6i}$, . . . functioning as ROM cells in the memory device are connected not to the ground line $33i/$ but to the power supply line $33i$ in both of the positive and negative logic sections and that the memory device has a logic converter 60 as will be described below.

In this memory device shown in FIG. 23, the power supply line $33i$ extends over memory cells $31_{2i}$, $31_{4i}$, $31_{6i}$, . . . in the negative logic section as well as in the positive logic section. The power supply line $33i$ is selectively connected to memory cells $31_{1i}$, $31_{5i}$, $31_{6i}$, . . . functioning as ROM cells. No ground line is provided in each unit column circuit.

A data line pair D, D/ is connected to an output circuit 52 through the logic converter 60 and another data line pair D', D/'. The logic converter 60 receives outputs from the memory cells $31_{2i}$, $31_{4i}$, $31_{6i}$, . . . in the negative logic section based on the LSB (Least Significant Bit) $A_0X$ of the row addresses $A_0X$, $A_0X/$ to $A_mX$, $A_mX/$ and converts the outputs to the opposite logic level, which is then transferred to the output circuit 52 through the data line pair D', D/'.

The logic converter 60 may be composed of any circuits by which the outputs from the negative logic section are surely inverted. One specific example of the logic converter 60 is shown in FIG. 24. The logic converter 60 in FIG. 24 includes an inverter 61 for inverting the Y decoder enable signal YE for activating each unit Y decoder $10i$, 2-input NOR gate 62 for delivering negative logic sums of the outputs of the inverter 61 and the LSB $A_0X$, and a logic conversion circuit 63 for delivering outputs having inverted logic of the data line pair D, D/ based on the output P of the NOR gate 62 to the data line pair D', D/'.

The logic conversion circuit 63 includes an inverter 63a for inverting the output P of the NOR gate 62, a CMOS switch 63b connected between the data line D and the data line D' and composed of NMOS and PMOS transistors controlled to be turned on and off according to the output P of the NOR gate 62 and the output of the inverter 63a, another CMOS switch 63c connected between the data line D/ and the data line D/' and composed of NMOS and PMOS transistors controlled to be turned on and off according to the output P of the NOR gate 62 and the output of the inverter 63a, and tri-state inverters 63d, 63e connected in parallel to the CMOS switches 63b, 63c and controlled to be turned on and off according to the output of the inverter 63a.

With this logic converter 60, when data is read out of the memory cells $31_{2i}$, $31_{4i}$, $31_{6i}$, . . . in the negative logic section, or when the LSB $A_0X$ is a high level, the information transferred from the bit line pair BLi, BLi/ to the data line pair D, D/ is further transferred to the data line pair D', D/' through the tri-state inverters 63d, 63e. Since the ROM structure is formed in the negative logic section by using the power supply line $33i$, the memory cells serving as ROM cells are seen as if storing logic "0" unless such a logic converter 60 is used. The LSB $A_0X$ is used for determining whether the memory cell to be read out is in the negative logic section or not, and if so, the memory device converts the logic level of the output to a suitable opposite logic.

Figure 25:
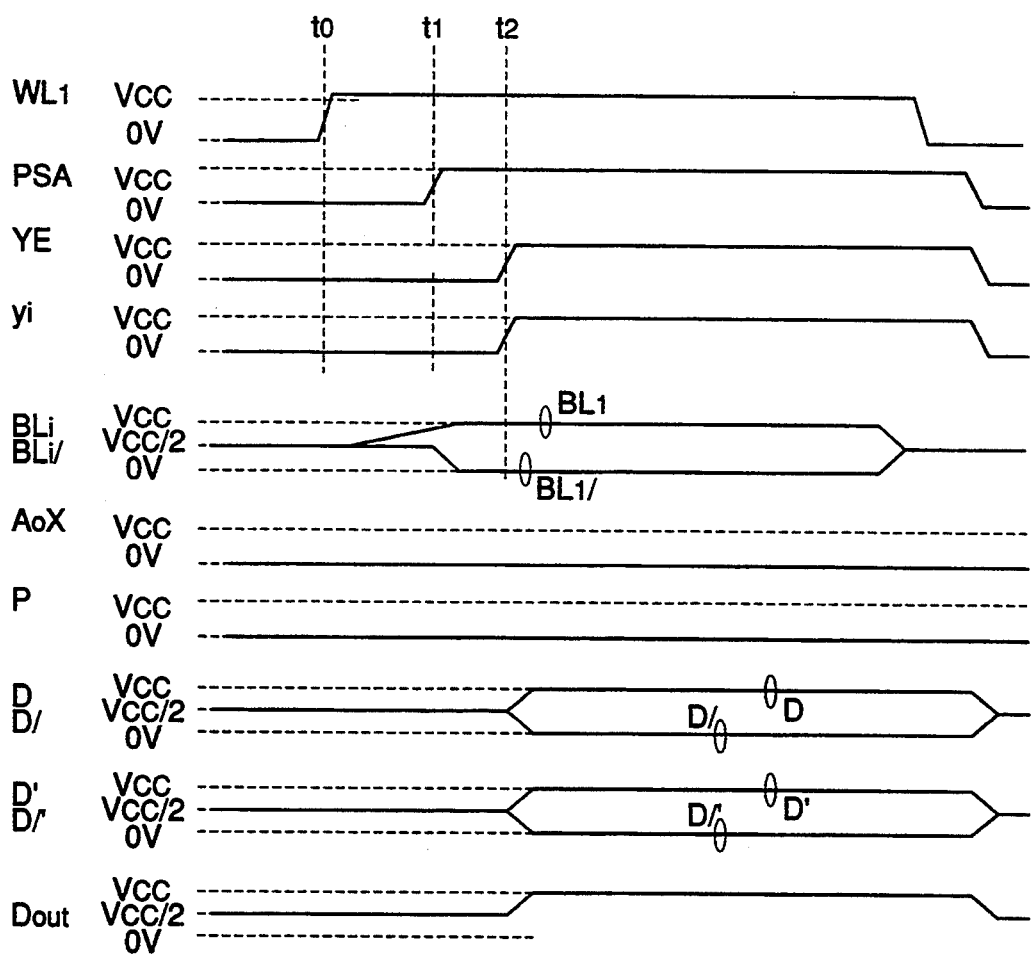
FIGS. 25, 26 are time charts showing wave forms of signals for the semiconductor memory device in FIG. 23.
Figure 26:
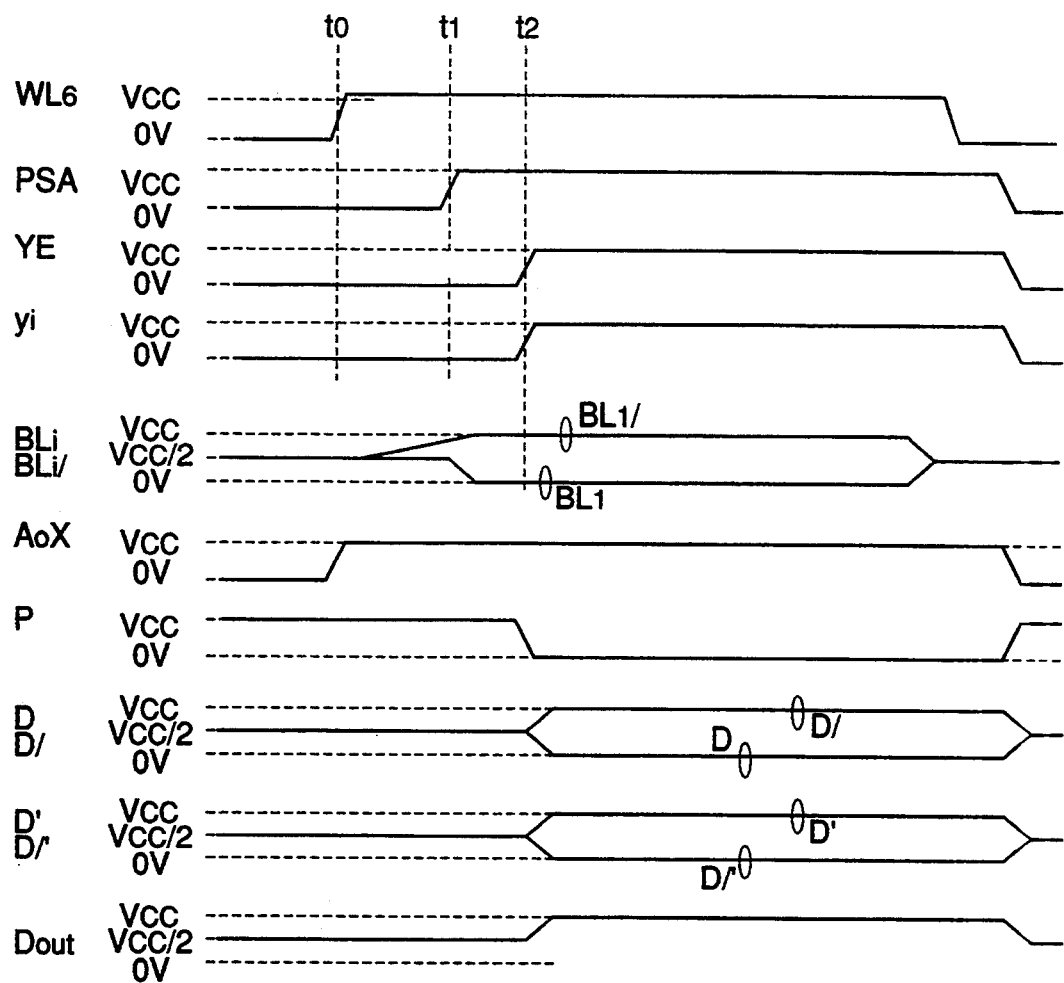

Referring to FIGS. 25 and 26, reading-out operations of this memory device in FIG. 23 will be explained. FIG. 25 is for the word line WL1 being selected; FIG. 26 is for the word line WL6 being selected.

In FIG. 25, the word line WL1 is activated to select the memory cell $31_{1i}$ in the positive logic section at time $t_0$, and other operation up to time $t_2$ is the same as the above described operation shown in FIG. 3, so that for the sake of the simplicity the description will be omitted hereinafter.

After data from the memory cell $31_{1i}$ is transferred to the data line pair D, D/, the data line D is at a high level where the data line D/ is at a low level, because the bit line BLi in the positive logic section is at a high level where the bit line BLi/ in the negative logic section is at a low level. Since the LSB $A_0X$ of the row address is "0", or a low level, the output P of the NOR gate 62 becomes a high level at a time that the Y decoder enable signal YE is raised. Consequently, the data line pair D, D/ and the data line pair D', D/' are coupled through the transfer gates 63b, 63c in the logic converter 60 to make signals on these data line pairs in the same phase. The output at the output terminal Dout, therefore, becomes logic "1", or a high level.

In FIG. 26, the word line WL6 is activated to select the memory cell in the negative logic section at time $t_0$, and other operation up to time $t_2$ is similar to that shown in FIG. 3 described above. The difference from the operation in FIG. 3 is that the potential of the bit line BLi/ is pulled up to VCC since the memory cell $31_{6i}$ is connected not to the ground line but to power supply line $33i$ having VCC level.

After that data from the memory cell $31_{6i}$ is transferred to the data line pair D, D/, the data line D is at a low level where the data line D/ is at a high level, because the bit line BLi in the positive logic section is at a low level where the bit line BLi/ in the negative logic section is at a high level. Since the LSB $A_0X$ of the row address is "1", or a high level, the output P of the NOR gate 62 becomes a low level at a time that the Y decoder enable signal YE is raised. Consequently, the data line pair D, D/ and the data line pair D', D/' are coupled through the tri-state inverters 63d, 63e in the logic converter 60 to make the signals on these data line pairs in the reverse phase. Therefore, the output at the output terminal Dout becomes logic "1", or a high level, even though the data line D is at a low level.

According to this memory device, the power supply line $33i$ can be provided in not only the positive logic section but also the negative logic section in association with the logic converter 60. This allows the memory cells functioning as ROM cells to be arranged in the positive and negative logic sections with an exclusive voltage line, thereby making the layout design easy, and thereby preventing the voltage lines from short-circuiting. Since all data outputs from the memory cells in the negative logic section are inverted and since the input circuit 51 is directly connected to the data line pair D, D/, another logic converter activated only when the data are written in the memory cells not connected with the voltage line in the negative logic section can be provided to prevent unnecessary logic conversion. Otherwise, the data to be written are inverted before being written into the memory cells not connected with the voltage line in the negative logic section.

As modifications, this memory device may be formed with only the ground line arranged in the positive and negative logic sections and a logic converter. This memory device may also be formed with the X decoder as shown in FIG. 6 to give sequential addresses to each logical section. In the memory device with such an X decoder, the MSB (Most Significant Bit) is used to operate the logic converter. Moreover, the memory device with one type voltage line in both logic sections may be formed either or both with the memory cells without a capacitor as shown in FIG. 4 and with an open bit line structure as shown in FIG. 7. Furthermore, such a logic converter could be eliminated, if the circuitry, or a CPU, connected to the memory device recognizes the output in the reverse phase as the data from the memory cells inversely storing.

Figure 27:
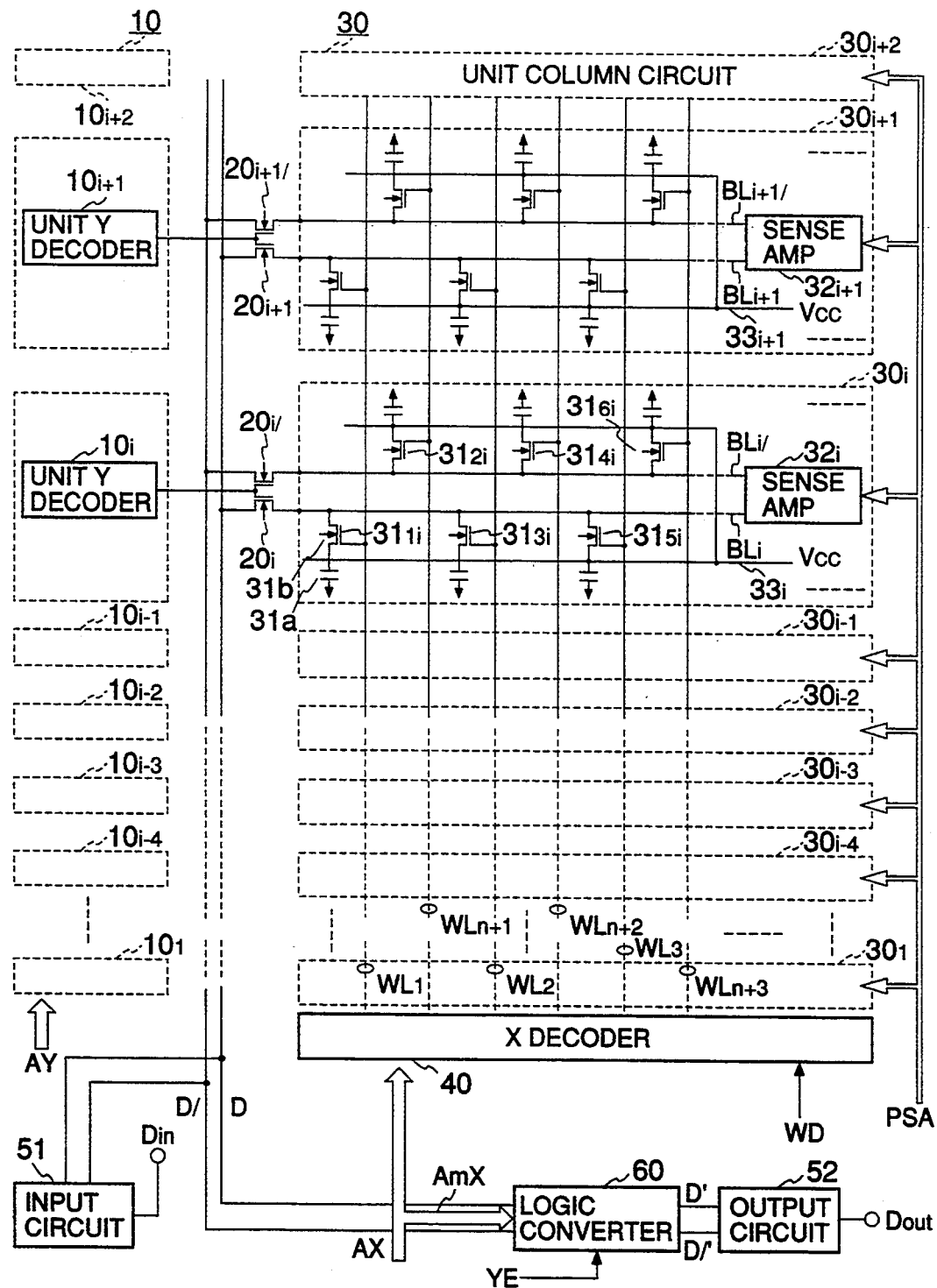
FIG. 27 is a circuit diagram illustrating a semiconductor memory device according to a 20th embodiment of the invention.

FIG. 27 shows a 20th embodiment of the invention, the basic structure of which is similar to those of the second embodiment shown in FIGS. 5 and 6, and the 19th embodiment shown in FIG. 24.

In this embodiment, the memory cells $31_{2i}$, $31_{5i}$, $31_{6i}$, . . . which store a logic "1" as the ROM data in the positive and negative logic sections are connected to the power supply line $33i$.

The data line pair D, D/ are connected through the logic converter 60 and the other data line pair D′, D/′ to the output circuit 52.

The word line structure is constituted such that both the word lines $WL_1$, $WL_2$, $WL_3$, . . . in the positive logic section and the word lines $WL_{n+1}$, $WL_{n+2}$, $WL_{n+3}$, . . . in the negative logic section are sequentially disposed to be selected by the X decoder circuit 40. The X decoder circuit 40 has the identical circuit structure shown in FIG. 6.

Although the logic converter 60 employs the identical circuit structure shown in FIG. 25, the NOR gate 62 is input from the MSB address $A_mX$ instead of the LSB address $A_0X$.

Figure 28:
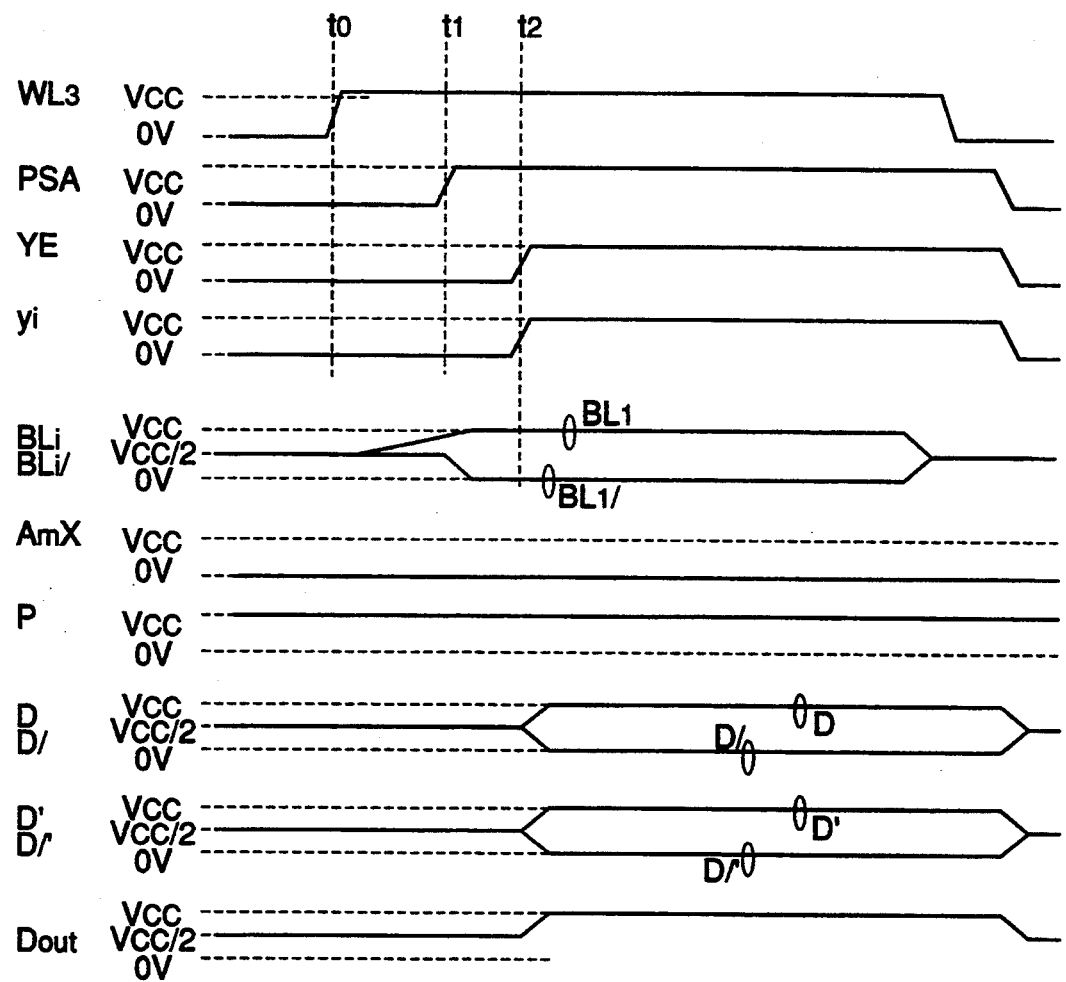
FIGS. 28, 29 are time charts showing wave forms of signals for the semiconductor memory device in FIG. 27.
Figure 29:
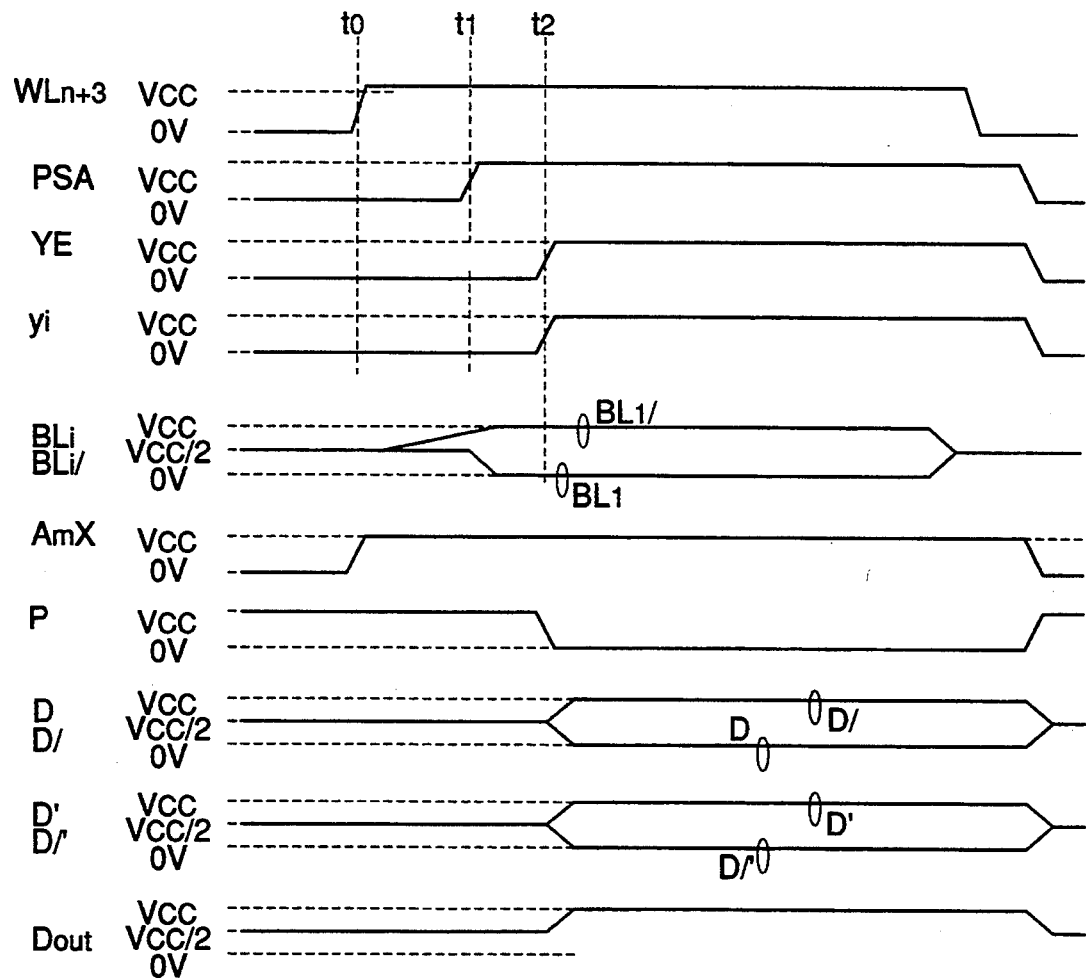

FIG. 28 shows a time chart when the word line $WL_3$ shown in FIG. 27 is activated (a positive logic state), and FIG. 29 shows a time chart when the word line $WL_{n+3}$ shown in FIG. 27 is activated (a negative logic state). Contrary to the time charts shown in FIGS. 25 and 26, the word lines $WL_1$, $WL_6$ and the LSB address $A_0X$ are respectively replaced by the word lines $WL_3$, $WL_{n+3}$ and the MSB address $A_mX$.

In this embodiment, when both the word line $WL_3$ in the positive logic section and the word line $WL_{n+3}$ in the negative logic section are activated, the reading-out operations will be performed in the same manner described as to the 19th embodiment.

Figure 30:
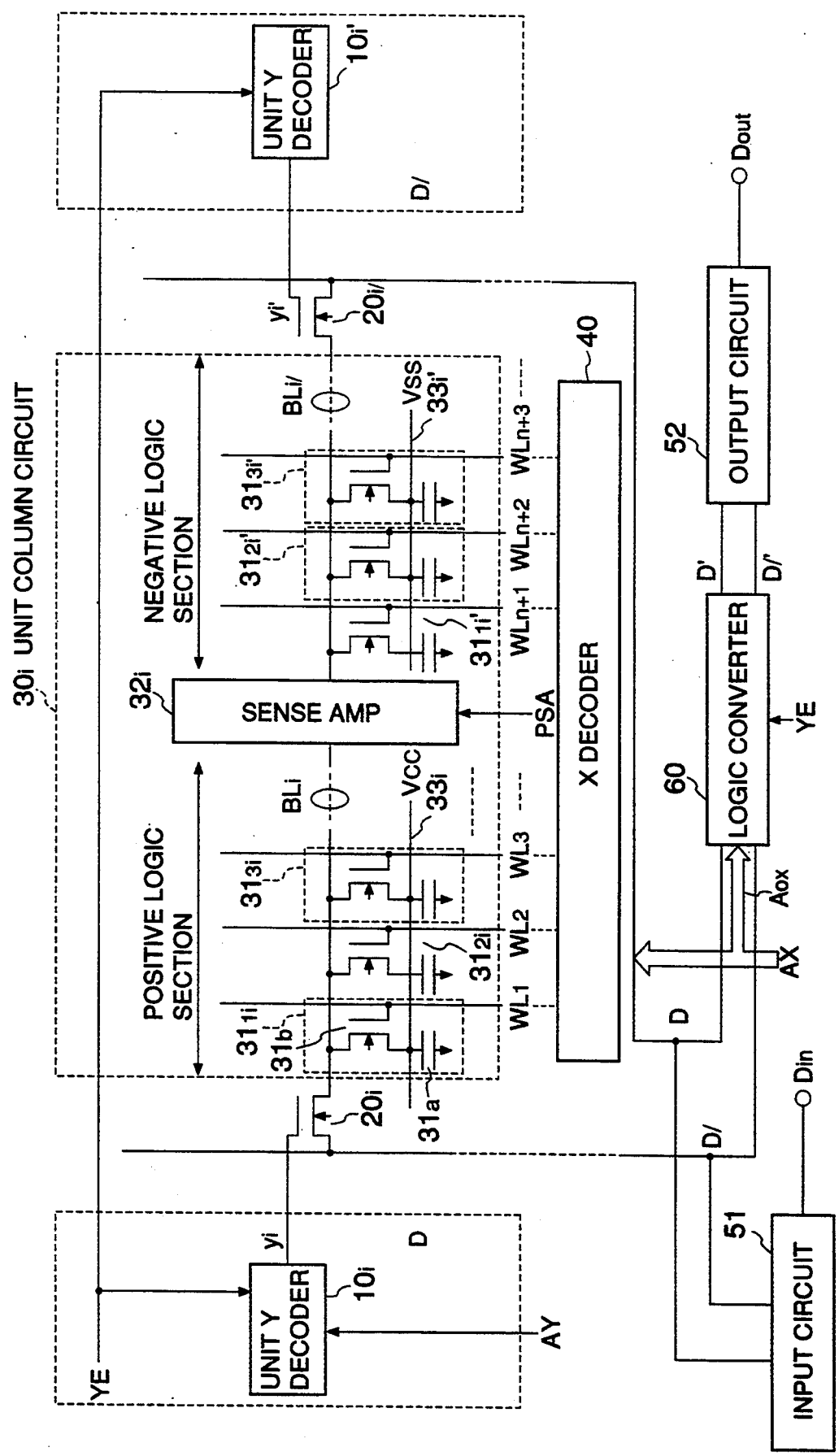
FIG. 30 is a circuit diagram illustrating a unit column circuit of the semiconductor memory device utilized for a 21st embodiment of the invention.

FIG. 30 shows a 21st embodiment of the invention, the basic structure of which is similar to those disclosed in FIGS. 7, 23 and 27.

In this embodiment employing an open bit line structure, the memory cells $31_{1i}$, $31_{3i}$, $31_{2i}'$, $31_{3i}'$, . . . , which correspond as a ROM data storing of logic "1", in the positive and negative logic sections, are respectively connected to the power supply line $33i$ and the ground line $33i'$.

Further, the data line pair D, D/ are connected through the logic converter circuit 60 and the other data line pair D′, D/′ to the output circuit 52.

Figure 31:
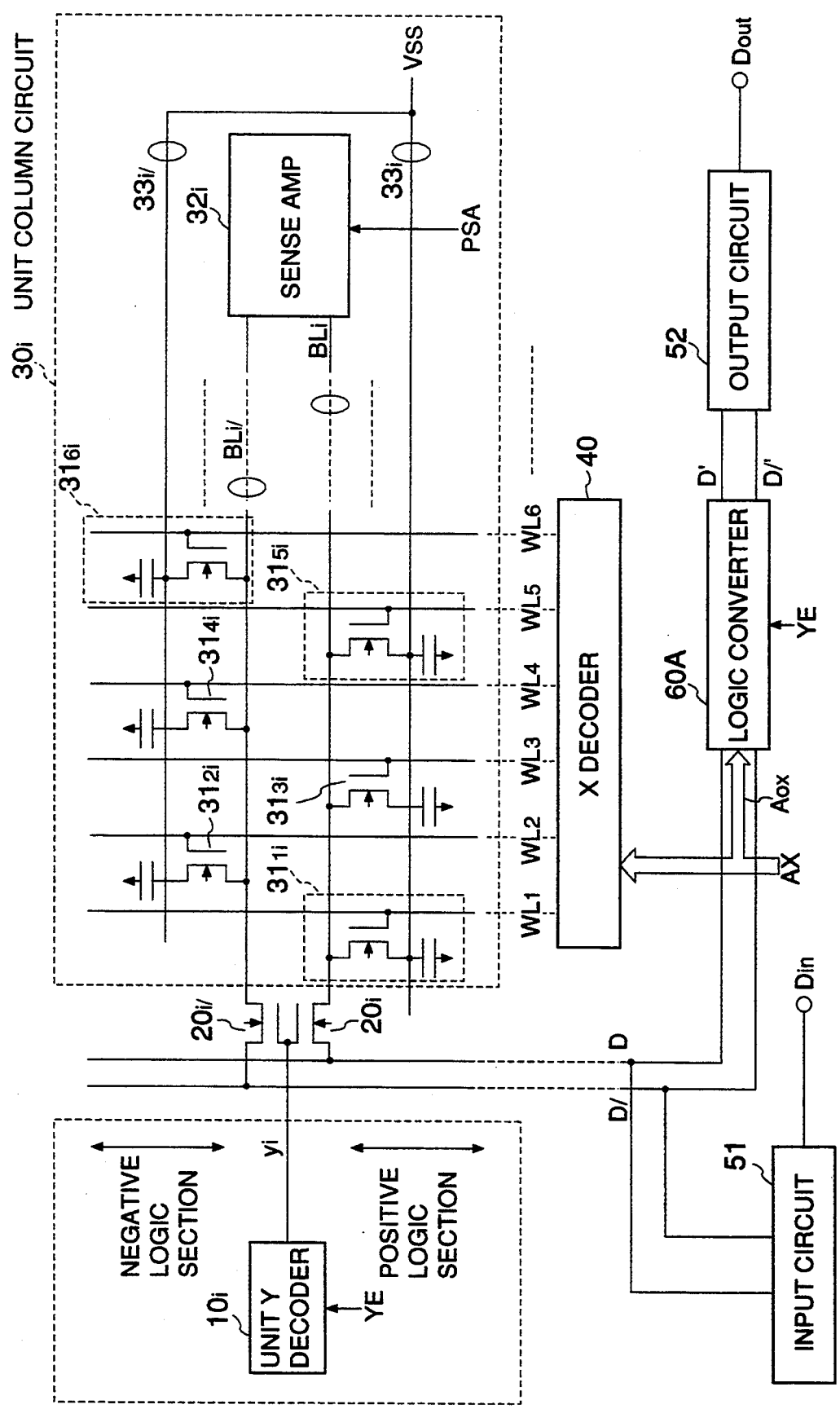
FIG. 31 is a circuit diagram illustrating a unit column circuit of the semiconductor memory device utilized for a 22nd embodiment of the invention.
Figure 32:
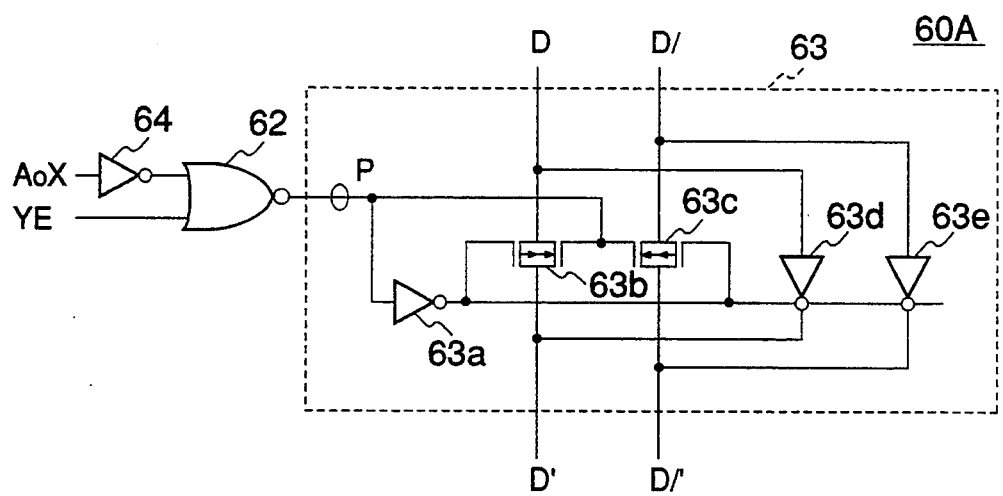
FIG. 32 ia a circuit diagram illustrating the logic converter shown in FIG. 31.

FIG. 31 shows a 22nd embodiment of the invention, and FIG. 32 shows a circuit diagram of the logic converter circuit 60 utilized in FIG. 31.

The respective basic structures are similar to those disclosed in FIGS. 23 and 24 illustrating the 19th embodiment. The 19th embodiment employs the structure by which the power supply line $33i$ is connected to the memory cells $31_{1i}$, $31_{5i}$, $31_{6i}'$, . . . , whereas this embodiment employ the structure that the ground line $33i/$ is connected to the memory cells.

Further, in place of the logic converter 60, a logic converter 60A employing a slightly different circuit structure is provided. The logic converter 60A is so constructed to invert the logic state in the positive logic section since a ROM data in the positive logic section is set to be a logic "0".

This memory device functions similarly as that of the 19th embodiment except that the logic converter 60A determines whether the data are stored in the memory cells in a negative logic form or not in accordance with the LSB address $A_0X$ and converts the logic state of the output data.

Figure 33:
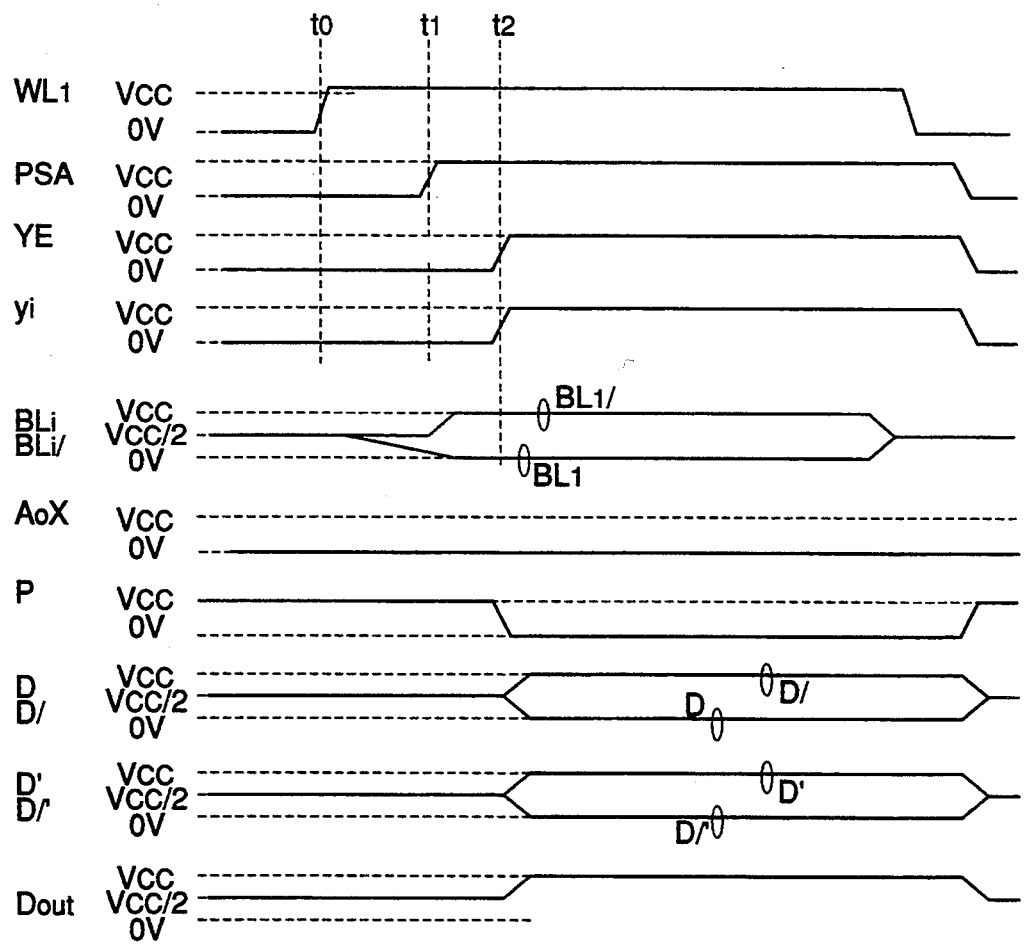
FIGS. 33, 34 are time charts showing wave forms of signals for the semiconductor memory device in FIG. 31.
Figure 34:
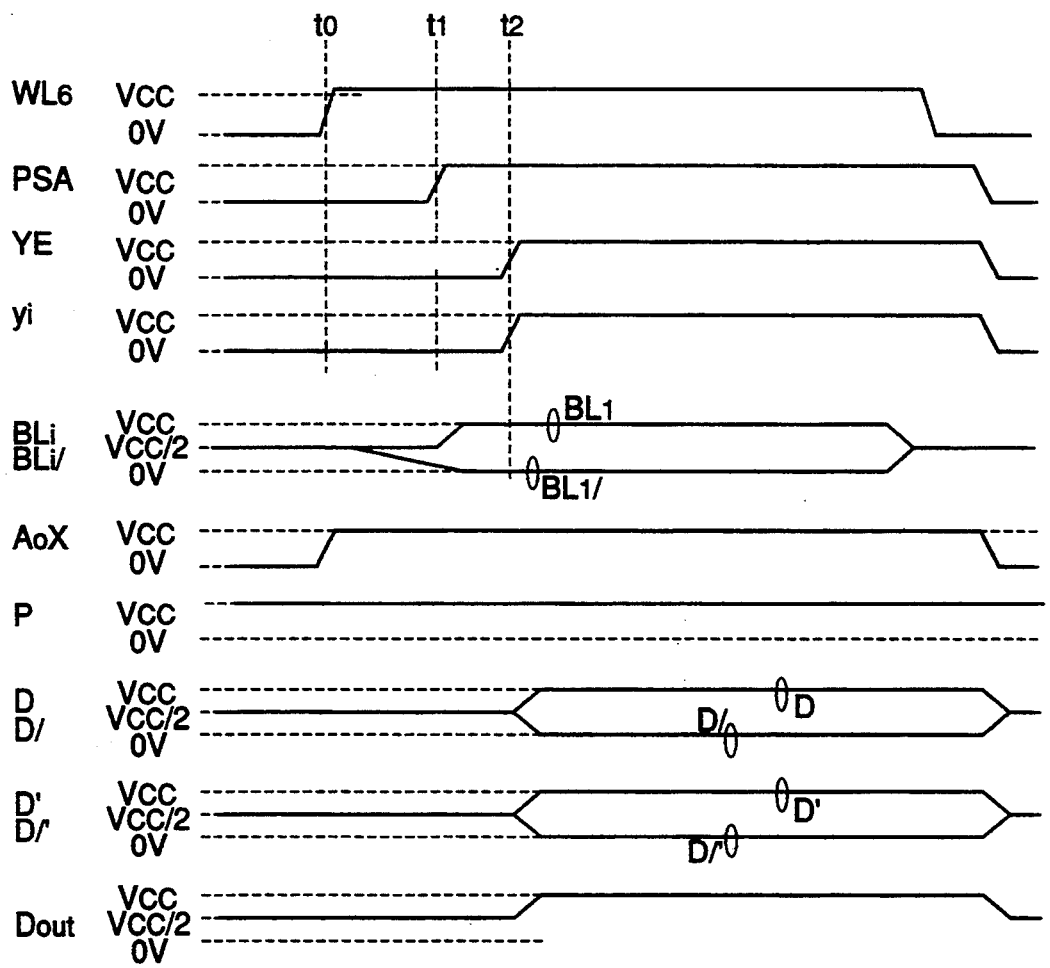

FIGS. 33 and 34 show time charts illustrating the word lines $WL_1$ and $WL_6$ being activated, respectively. These time charts and their operations are quite similar to those described above in accordance with FIGS. 25 and 26, so that for the sake of the simplicity detailed description will be omitted.

Figure 35:
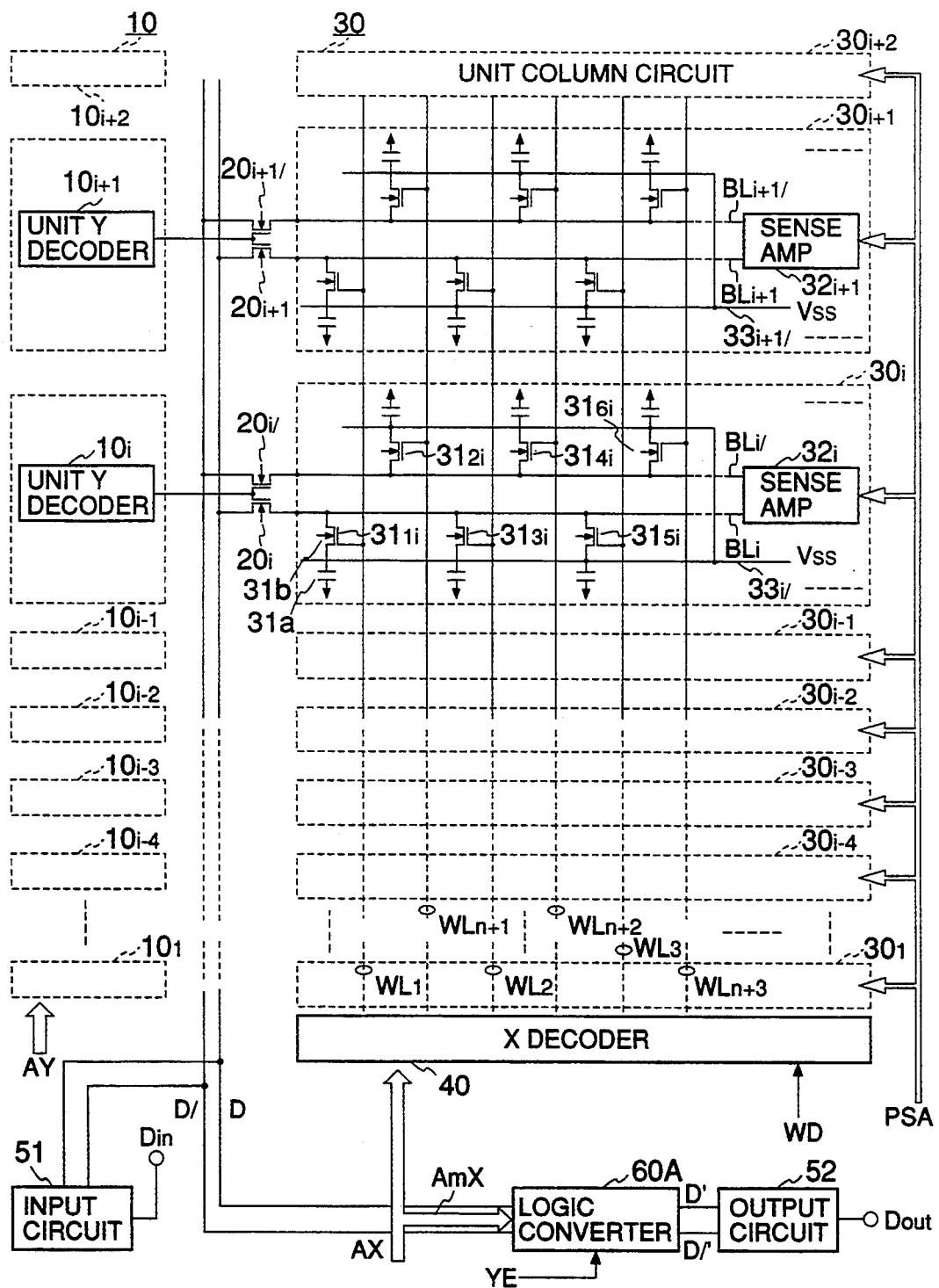
FIG. 35 is a circuit diagram illustrating a semiconductor memory device according to a 23rd embodiment of the invention.

FIG. 35 shows a 23rd embodiment of the invention, the basic structure of which is similar to those disclosed in FIGS. 6, 27 and 32.

In this embodiment, which employs a structure similar to that of the 20th embodiment, the memory cells $31_{2i}$, $31_{5i}$, $31_{6i}$, . . . are connected to the ground line $33i/$ instead of the power supply line $33i$ and the logic converter 60A is provided instead of the logic converter 60.

Figure 36:
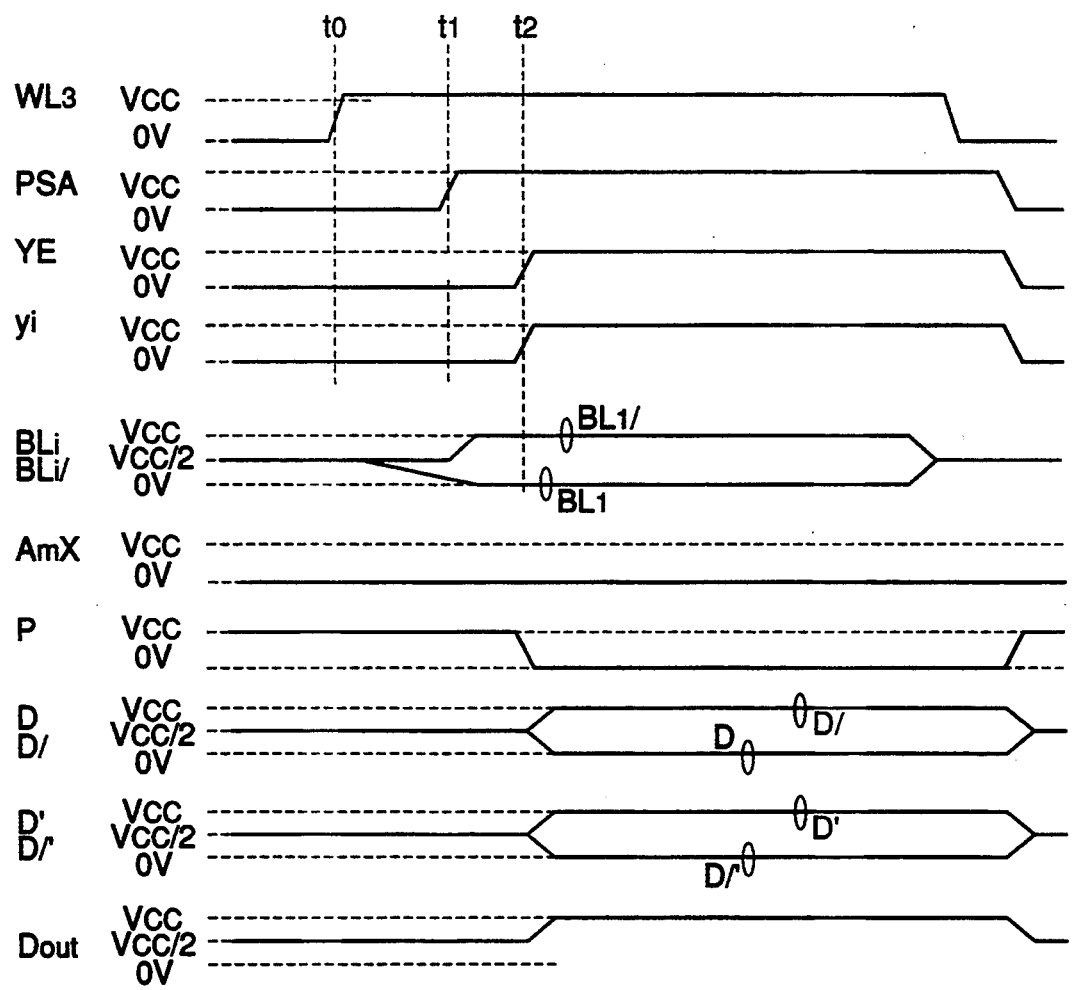
FIGS. 36, 37 are time charts showing wave forms of signals for the semiconductor memory device in FIG. 35.
Figure 37:
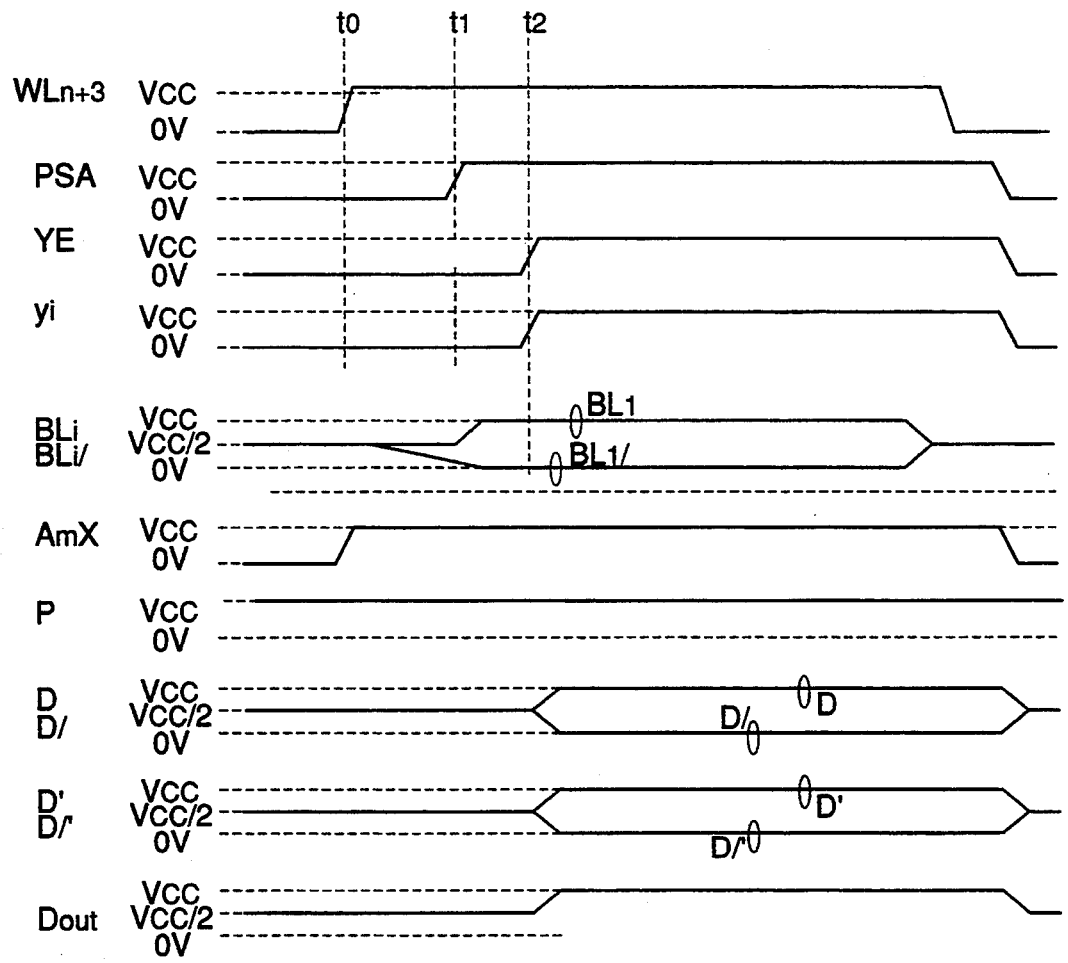

FIGS. 36 and 37 are time charts illustrating the word lines $WL_3$ and $WL_{n+3}$ being activated. In relation to the time charts shown in FIGS. 33 and 34, identical wave forms are shown except that the word lines $WL_1$ and $WL_6$ are respectively replaced by the word lines $WL_3$ and $WL_{n+3}$.

Figure 38:
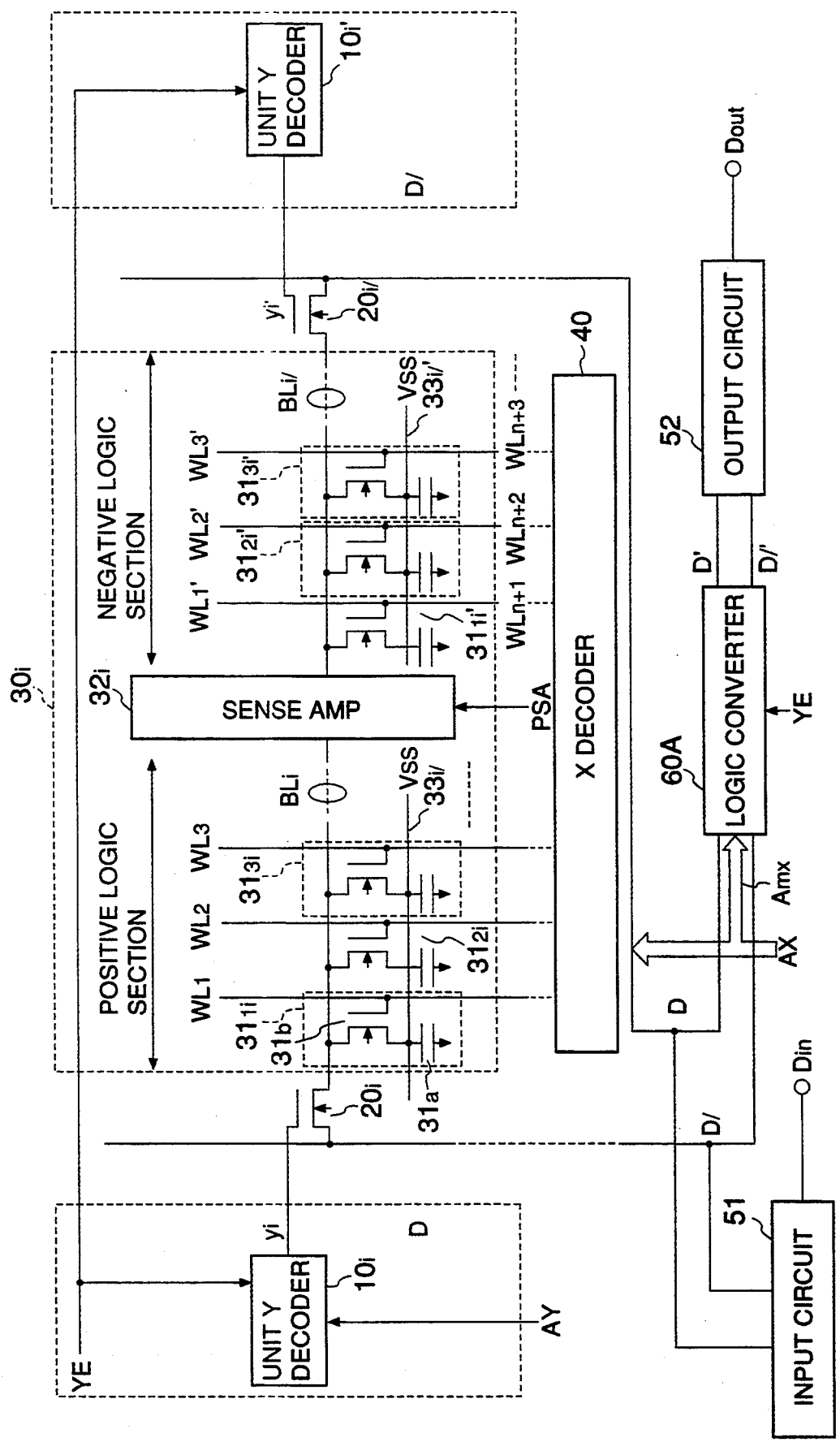
FIG. 38 is a circuit diagram illustrating a unit column circuit of the semiconductor memory device utilized for a 24th embodiment of the invention.

FIG. 38 shows a 24th embodiment of the invention, the basic structure of which is similar to those disclosed in FIGS. 30 and 35.

In this embodiment employing an open bit line structure, the ground lines $33i/$, $33i/'$ are respectively connected to the memory cells $31_{1i}$, $31_{3i}$, $31_{2i}'$, $31_{3i}'$, . . .

Further contrary to the 21st embodiment, ROM data in the positive logic section are set to be a logic "0", so the logic state in the positive logic section must be inverted. Therefore, similar to the 23th embodiment, the data line pair D, D/ are connected through the logic converter 60A to the output circuit 52.

Figure 39:
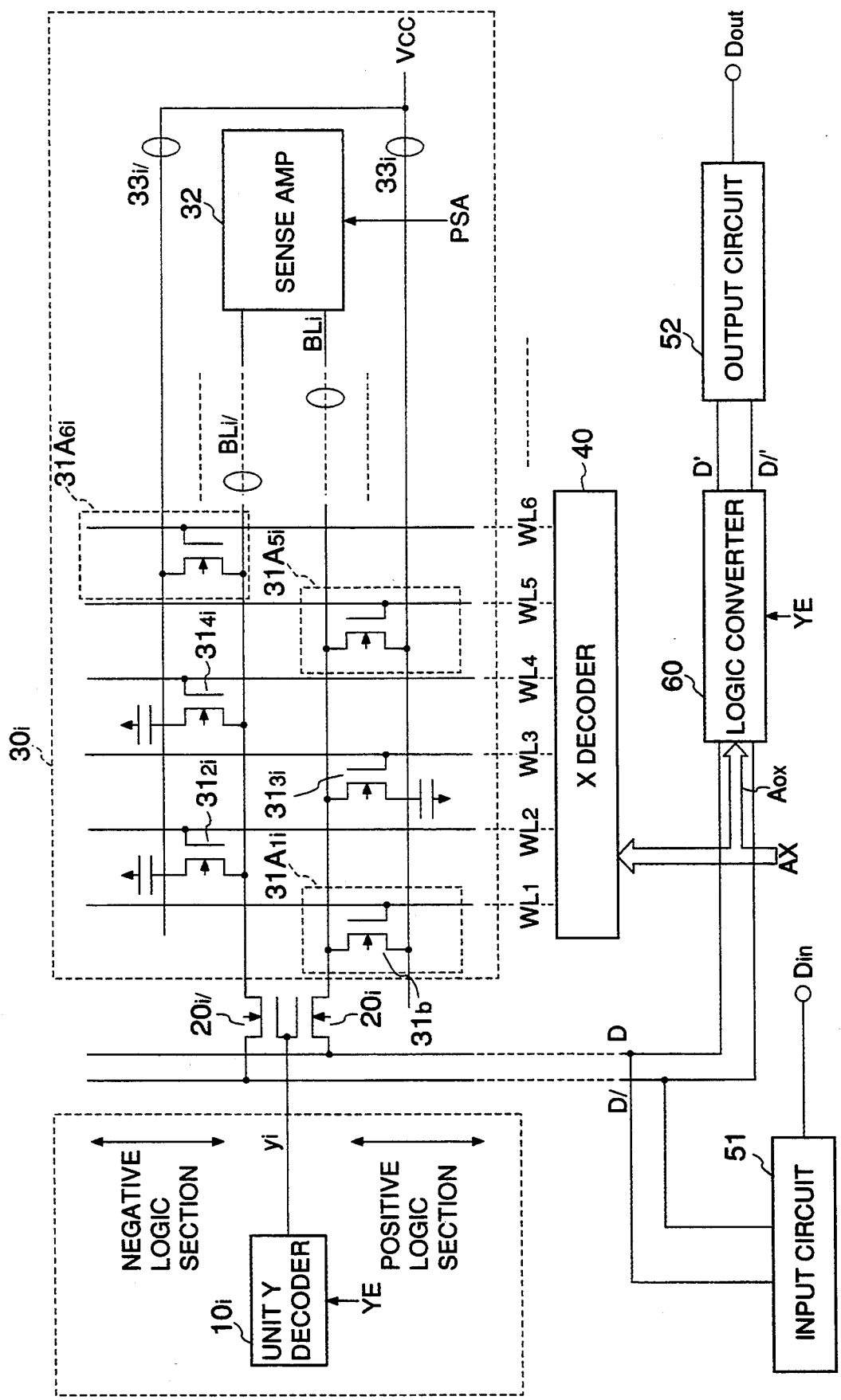
FIG. 39 is a circuit diagram illustrating a unit column circuit of the semiconductor memory device utilized for a 25th embodiment of the invention.

FIG. 39 shows a 25th embodiment of the invention, the basic structure of which is similar to that shown in FIG. 23. In this embodiment, the memory cells $31A_{1i}$, $31A_{5i}$, $31A_{6i}$, . . . , which are connected to the power supply line $33i$ are each constituted of only the transfer gate $31b$ without employing the capacitor $31a$.

Figure 40:
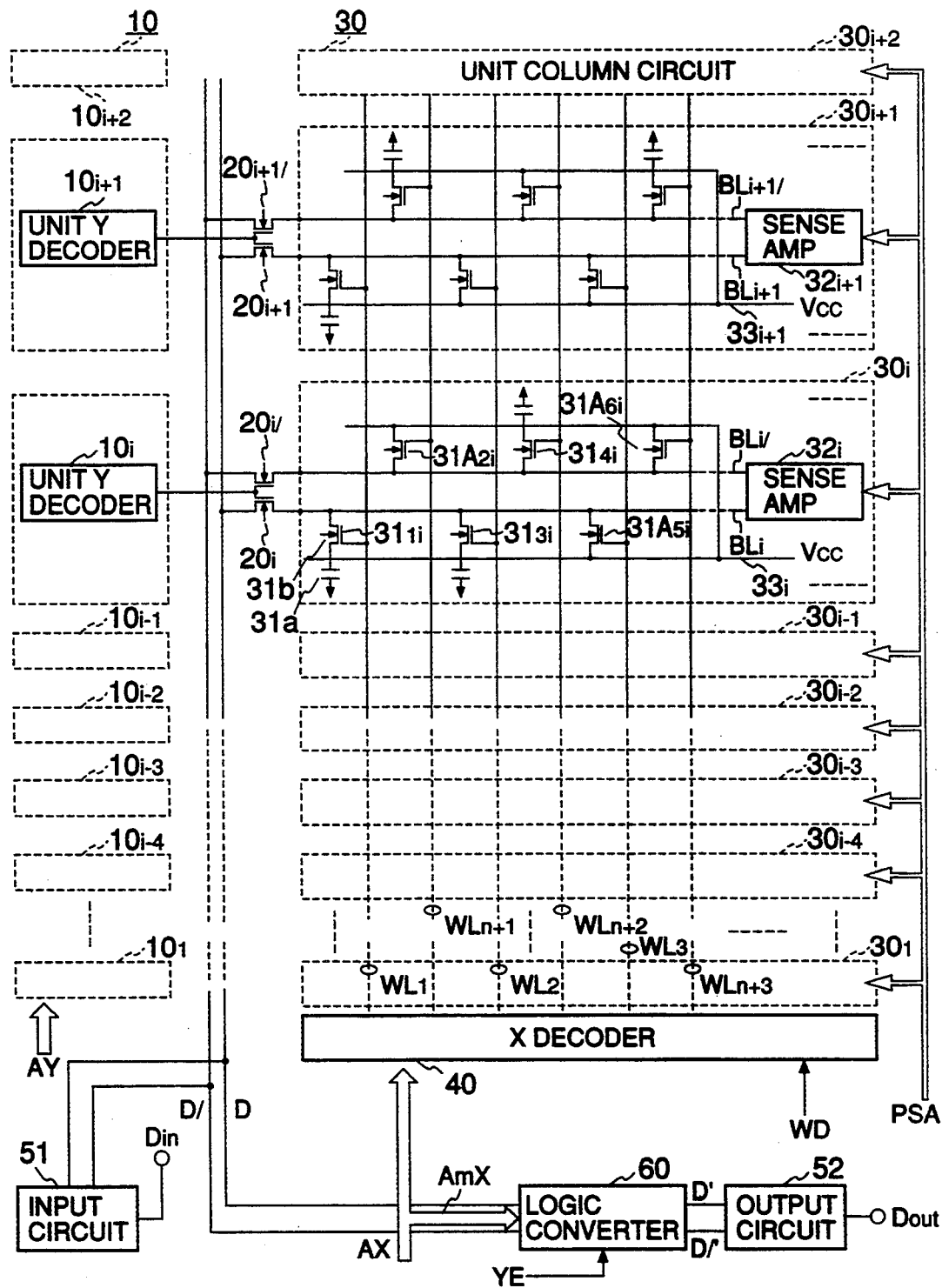
FIG. 40 is a circuit diagram illustrating a semiconductor memory device according to a 26th embodiment of the invention.

FIG. 40 shows a 26th embodiment of the invention, the basic structure of which is similar to that shown in FIG. 27. In this embodiment, the memory cells $31A_{2i}$, $31A_{5i}$, $31A_{6i}$, . . . , which are connected to the power supply line $33i$, are each constituted of only the transfer gate $31b$ without employing the capacitor $31a$.

Figure 41:
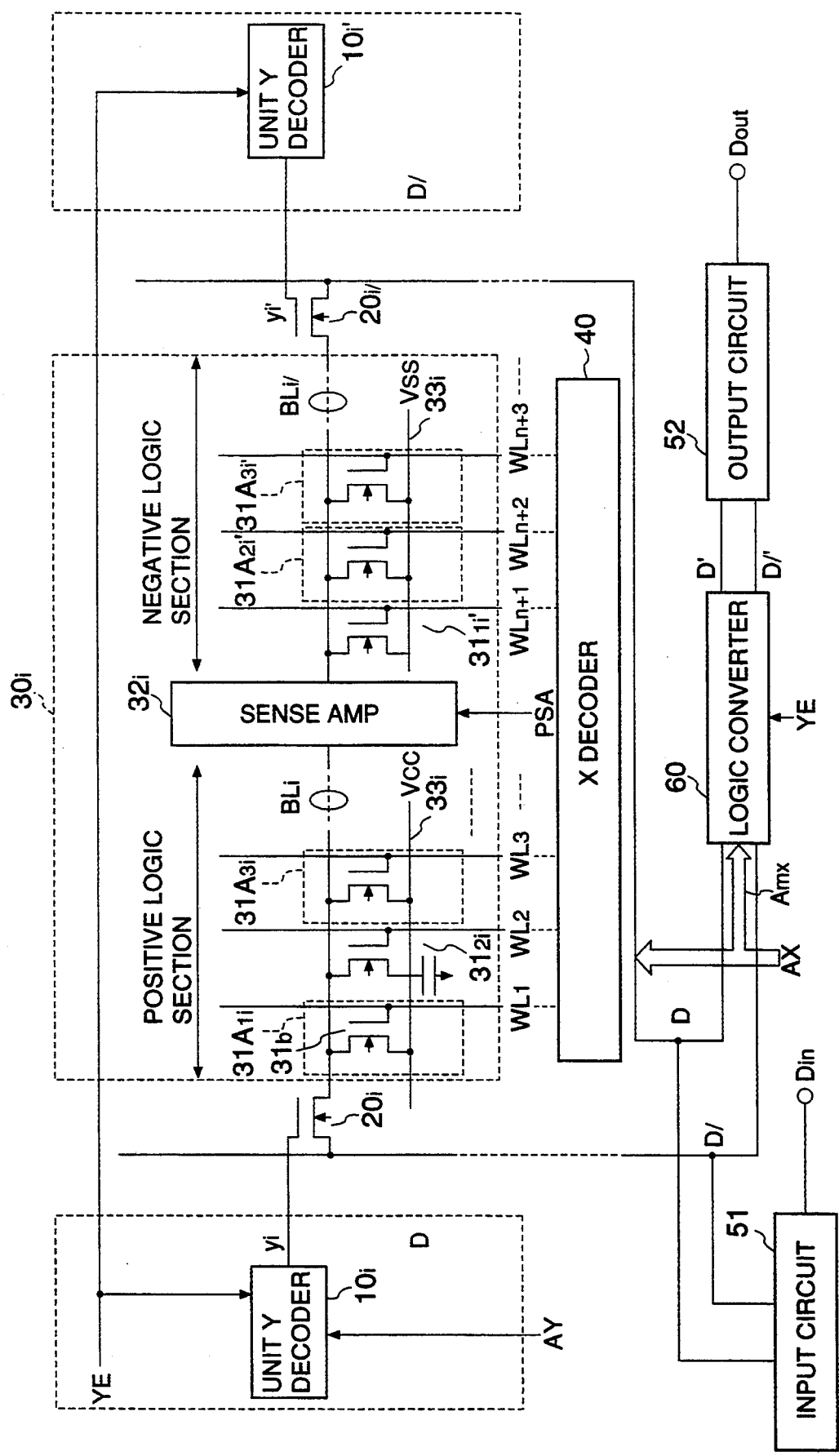
FIG. 41 is a circuit diagram illustrating a unit column circuit of the semiconductor memory device utilized for a 27th embodiment of the invention.

FIG. 41 shows a 27th embodiment of the invention, the basic structure of which is similar to that shown in FIG. 30. In this embodiment, the memory cells $31A_{2i}$, $31A_{3i}$, $31A_{2i}'$, $31A_{3i}'$ . . . , which are connected to the power supply lines $33i$, $33i/$ are each constituted of only the transfer gate $31b$ without employing the capacitor $31a$.

Figure 42:
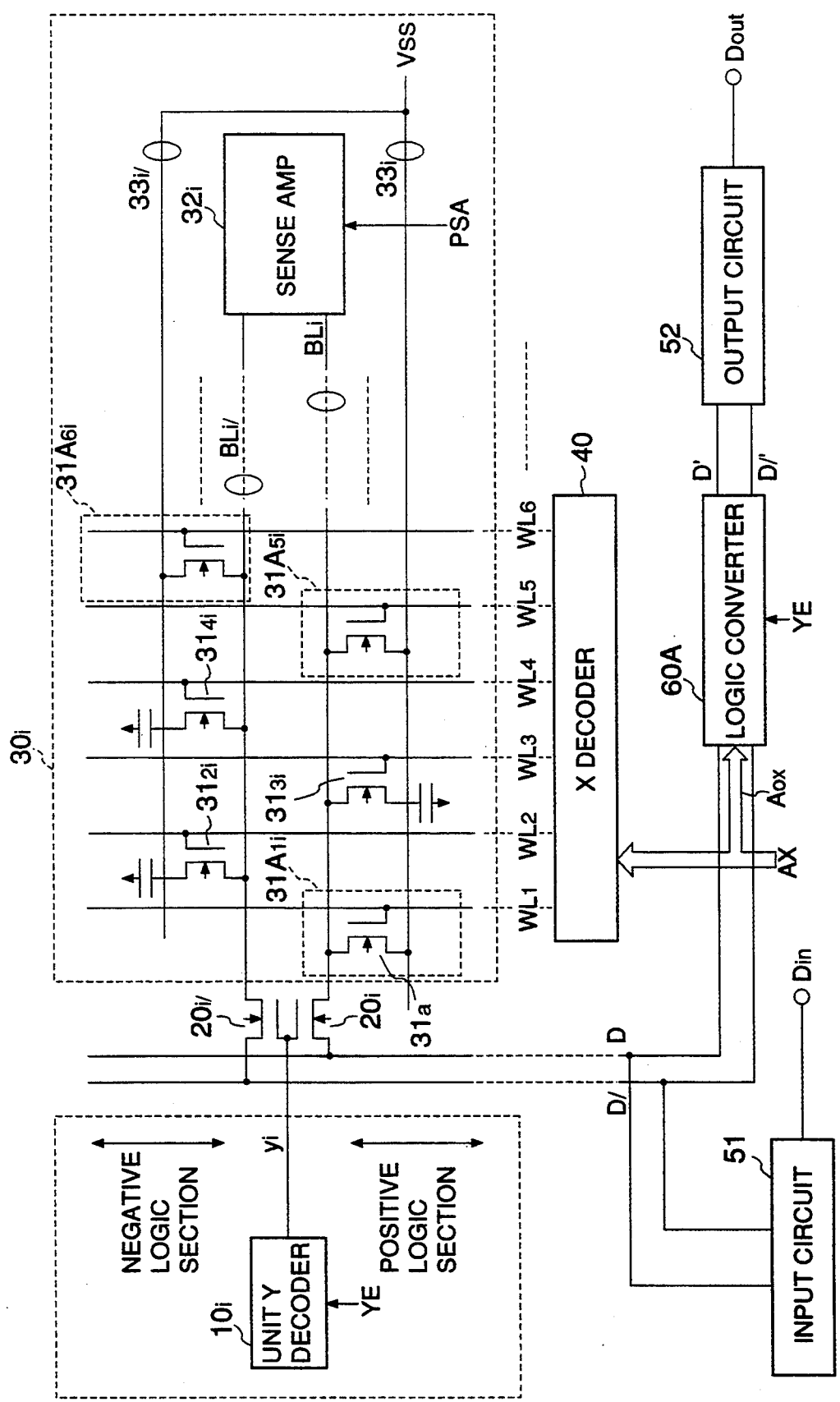
FIG. 42 is a circuit diagram illustrating a unit column circuit of the semiconductor memory device utilized for a 28th embodiment of the invention.

FIG. 42 shows a 28th embodiment of the invention, the basic structure of which is similar to that shown in FIG. 31. In this embodiment, the memory cells $31A_{1i}$, $31A_{5i}$, $31A_{6i}$, . . . , which are connected to the power supply line 33*i/*, are each constituted of only the transfer gate 31*b* without employing the capacitor 31*a*.

Figure 43:
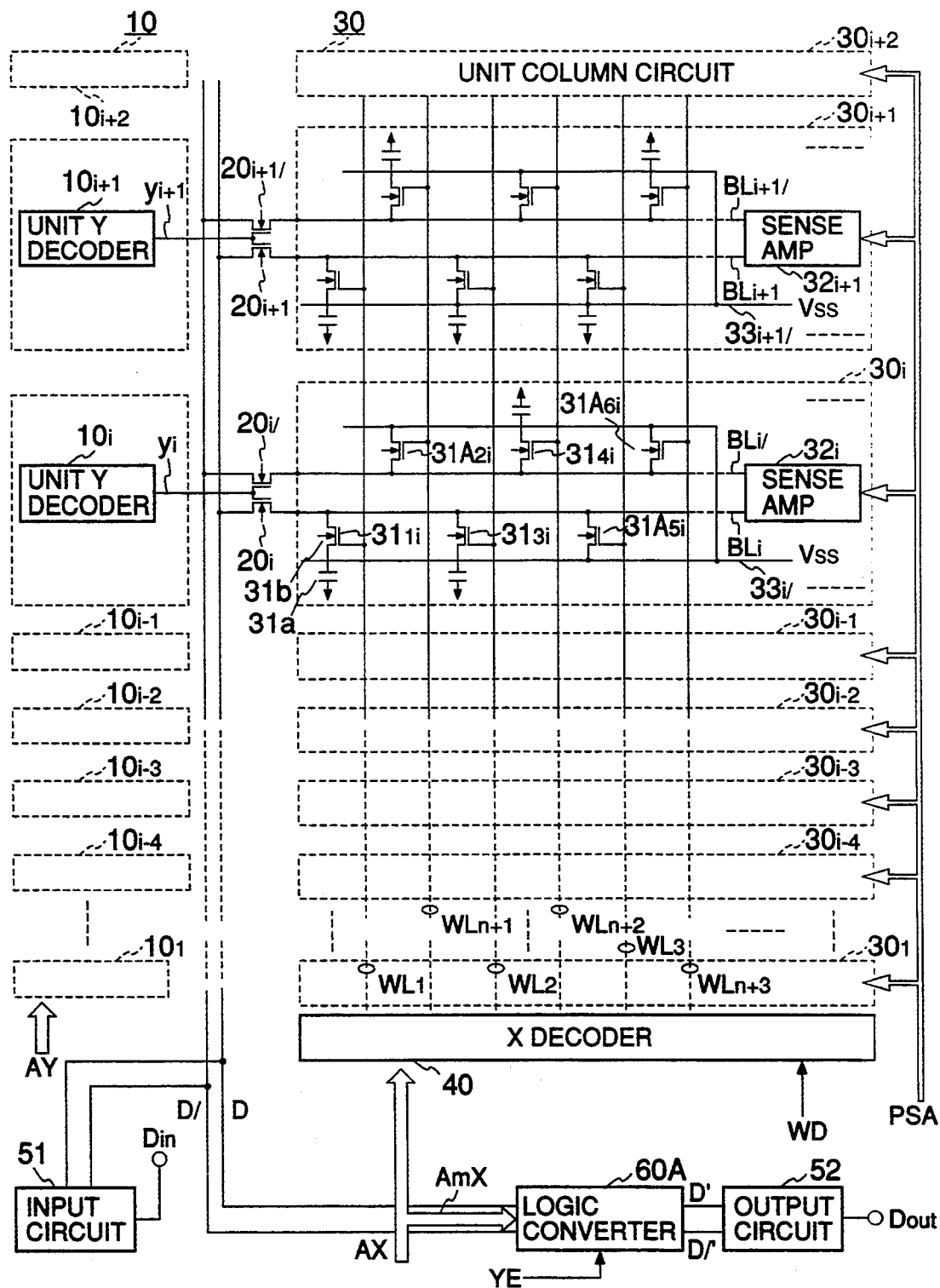
FIG. 43 is a circuit diagram illustrating a semiconductor memory device according to a 29th embodiment of the invention.

FIG. 43 shows a 29th embodiment of the invention, the basic structure of which is similar to that shown in FIG. 35. In this embodiment, the memory cells 31A$_{2i}$, 31A$_{5i}$, 31A$_{6i}$, ..., which are connected to the ground line 33*i/*, are each constituted of only the transfer gate 31*b* without employing the capacitor 31*a*.

Figure 44:
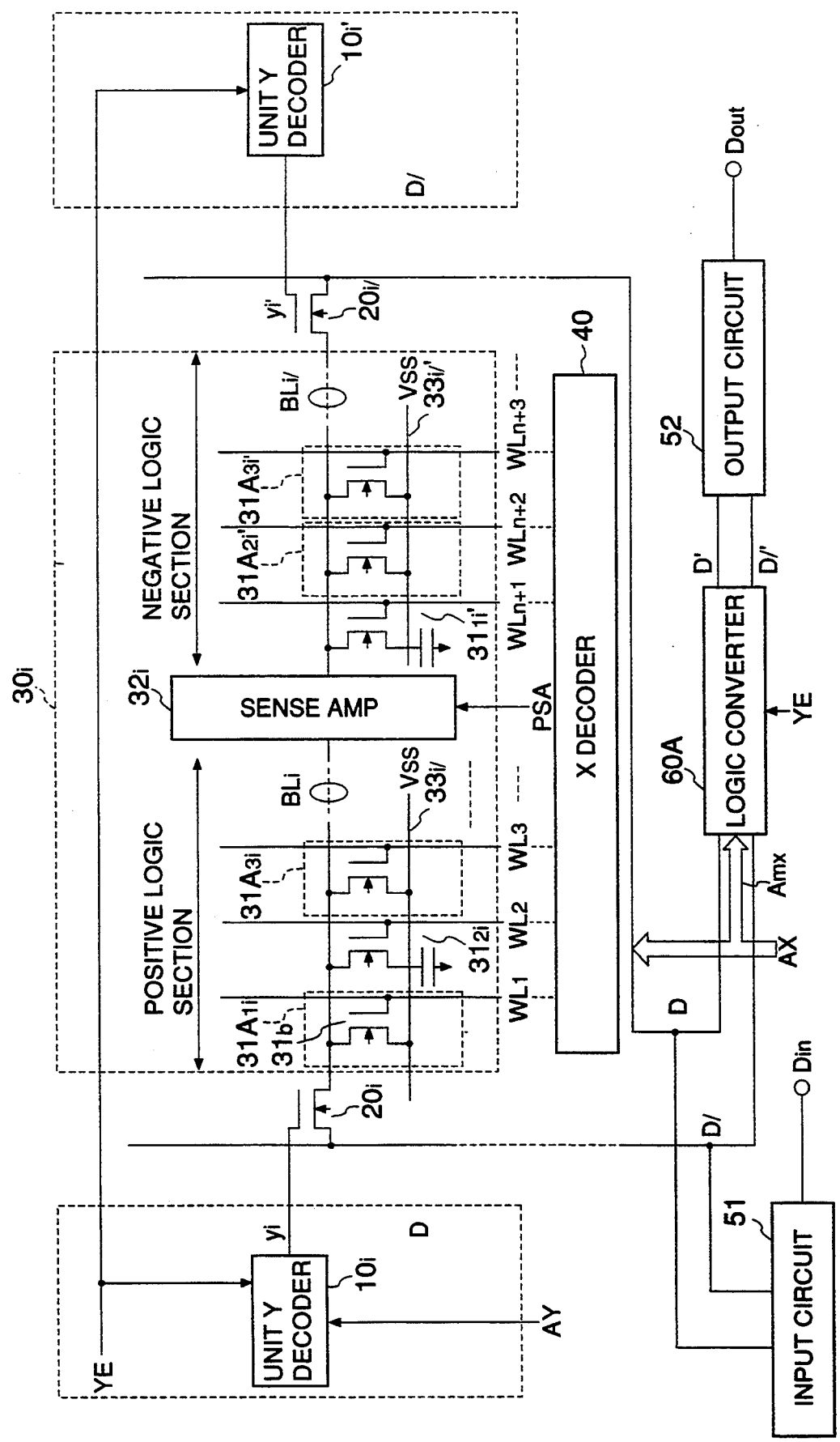
FIG. 44 is a circuit diagram illustrating a unit column circuit of the semiconductor memory device utilized for a 30th embodiment of the invention.

FIG. 44 shows a 30th embodiment of the invention, the basic structure of which is similar to that shown in FIG. 38. In this embodiment, the memory cells 31A$_{1i}$, 31A$_{3i}$, 31A$_{2i}'$, 31A$_{3i}'$ ..., which are connected to the ground lines 33*i/*, 33*i/'*, are each constituted of only the transfer gate 31*b* without employing the capacitor 31*a*.

Figure 45:
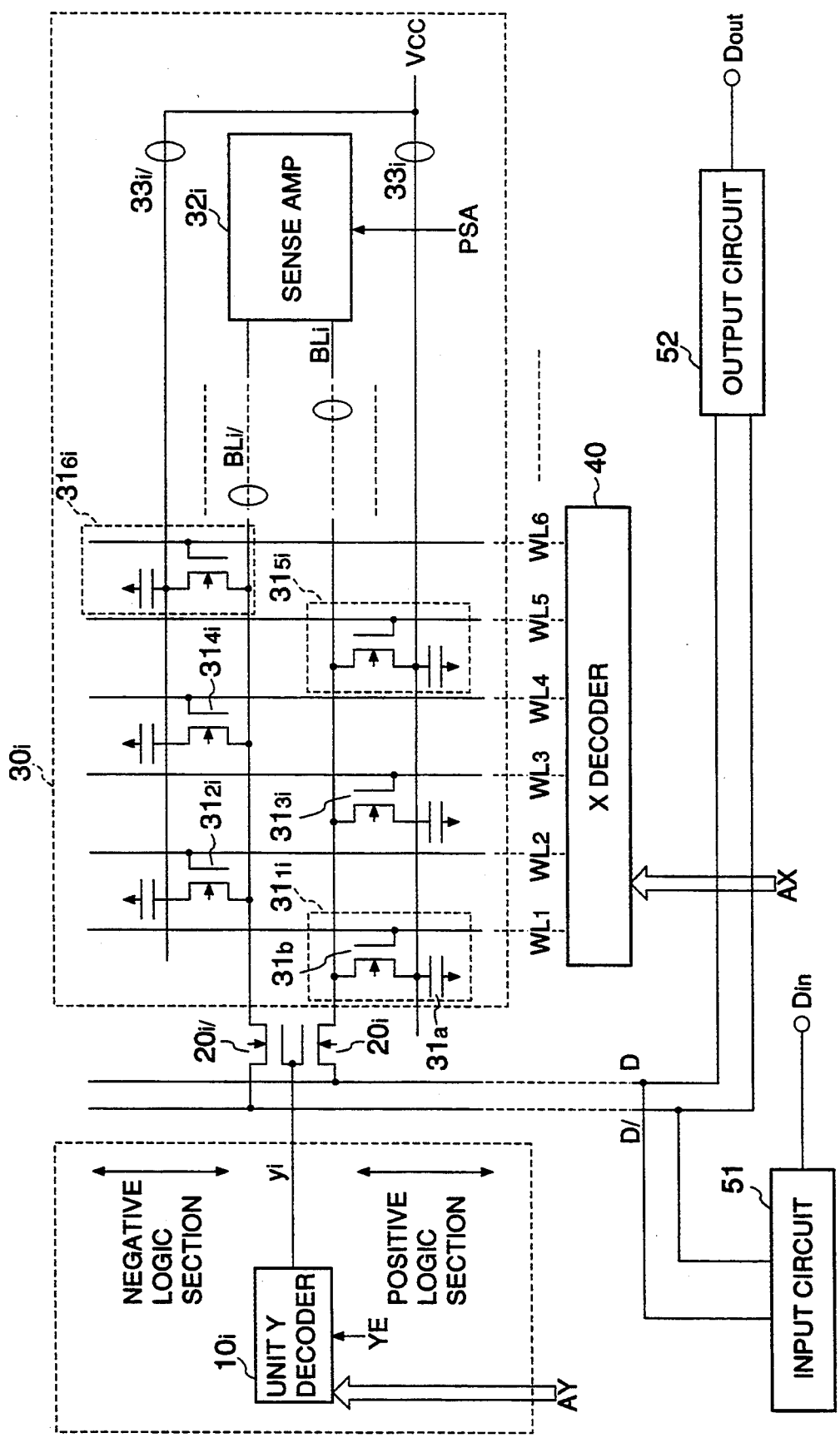
FIG. 45 is a circuit diagram illustrating a unit column circuit of the semiconductor memory device utilized for a 31st embodiment of the invention.

FIG. 45 shows a 31st embodiment of the invention, the basic structure of which is similar to that shown in FIG. 23. In this embodiment, the logic converter 60 shown in FIG. 23 is not disposed.

Figure 46:
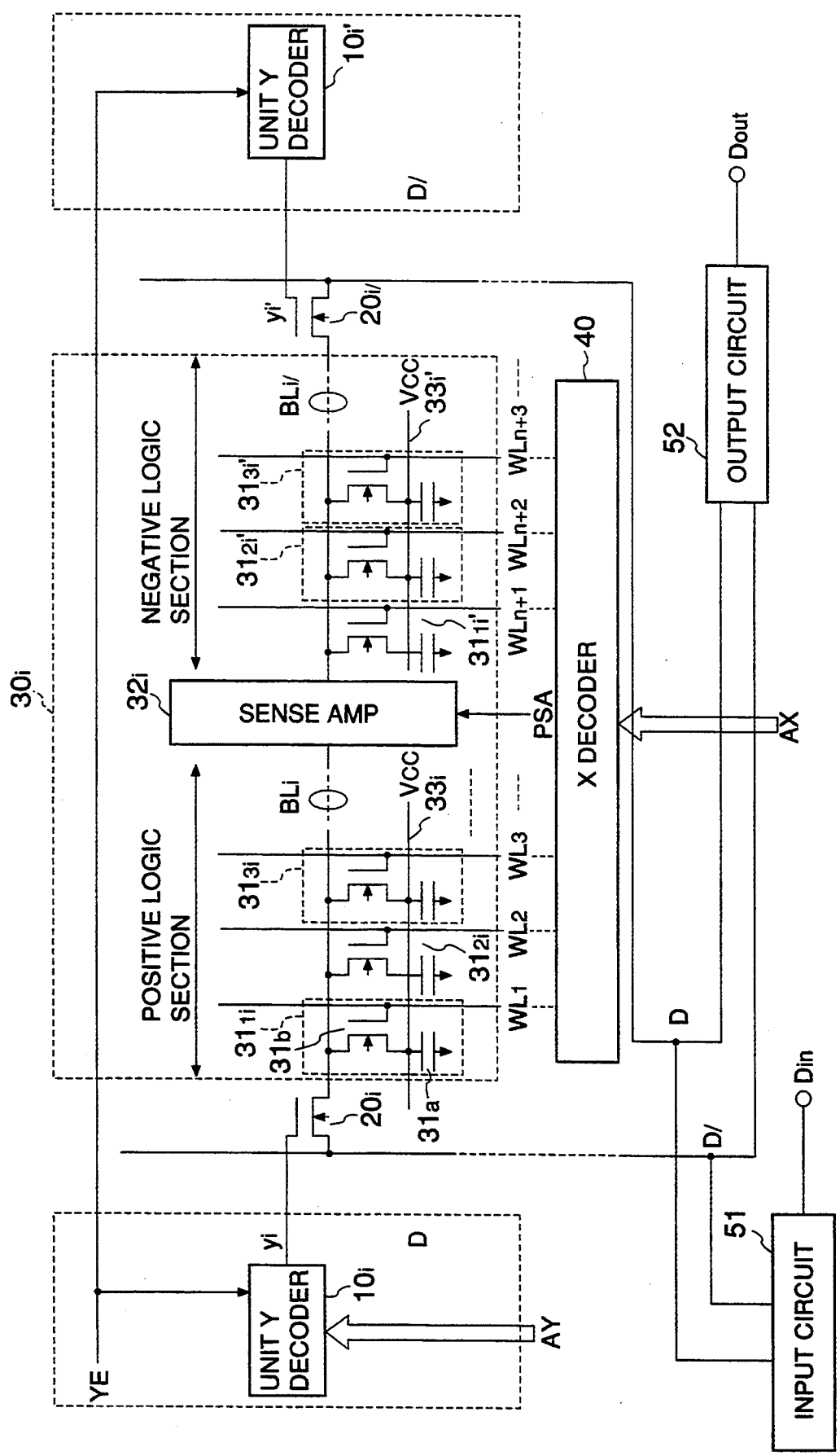
FIG. 46 is a circuit diagram illustrating a unit column circuit of the semiconductor memory device utilized for a 32nd embodiment of the invention.

FIG. 46 shows a 32nd embodiment of the invention, the basic structure of which is similar to that shown in FIG. 30. In this embodiment, the logic converter 60 shown in FIG. 30 is also not disposed.

Figure 47:
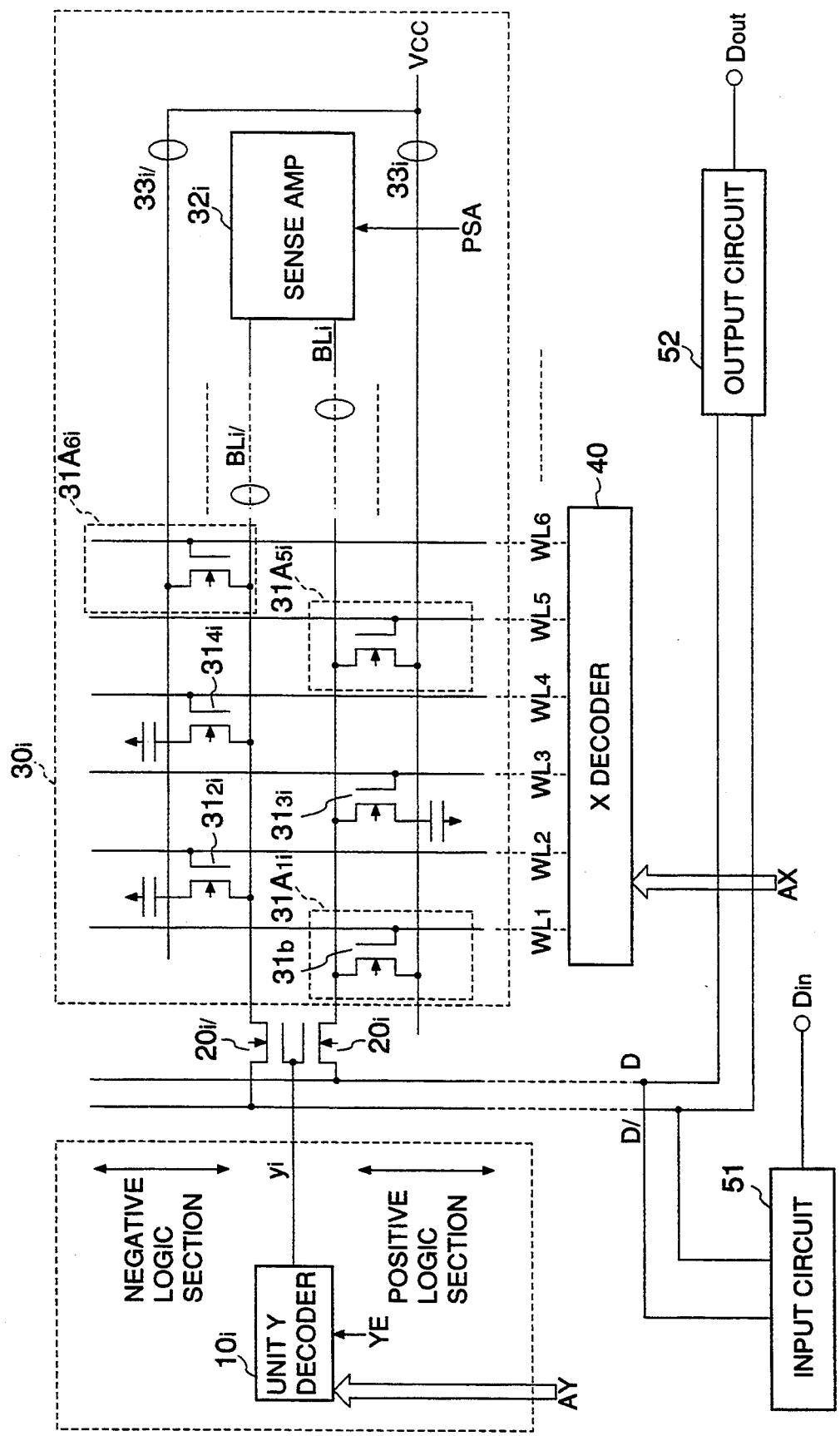
FIG. 47 is a circuit diagram illustrating a unit column circuit of the semiconductor memory device utilized for a 33rd embodiment of the invention.

FIG. 47 shows a 33rd embodiment of the invention, the basic structure of which is similar to that shown in FIG. 45. In this embodiment, the memory cells 31A$_{1i}$, 31A$_{5i}$, 31A$_{6i}$, ..., which are connected to the power supply line 33*i*, are each constituted of only the transfer gate 31*b* without employing the capacitor 31*a*.

Figure 48:
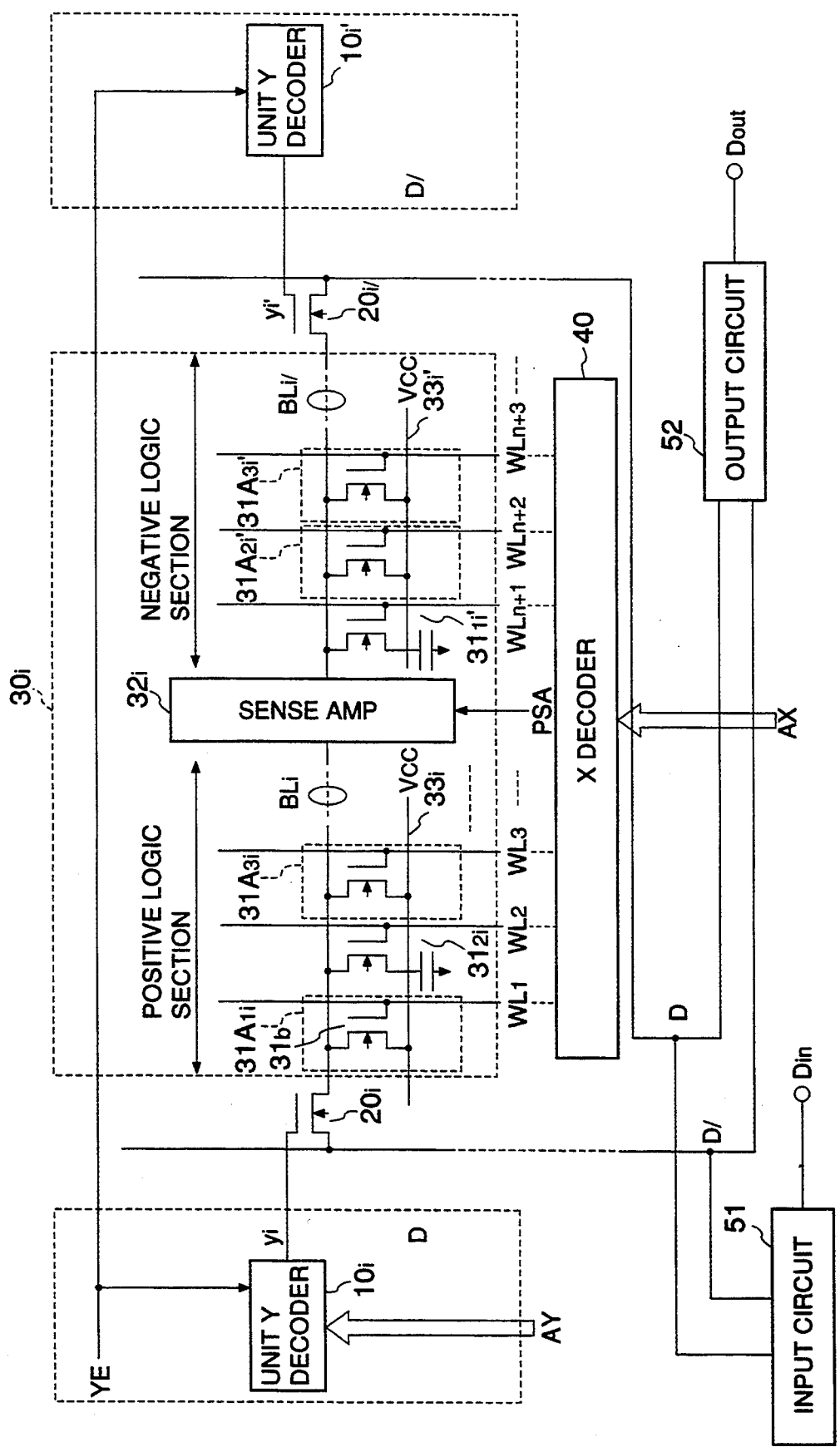
FIG. 48 is a circuit diagram illustrating a unit column circuit of the semiconductor memory device utilized for a 34th embodiment of the invention.

FIG. 48 shows a 34th embodiment of the invention, the basic structure of which is similar to that shown in FIG. 46. In this embodiment, the memory cells 31A$_{1i}$, 31A$_{3i}$, 31A$_{2i}'$, 31A$_{3i}'$ ..., which are connected to the power supply lines 33*i*, 33*i'*, are each constituted of only the transfer gate 31*b* without employing the capacitor 31*a*.

Figure 49:
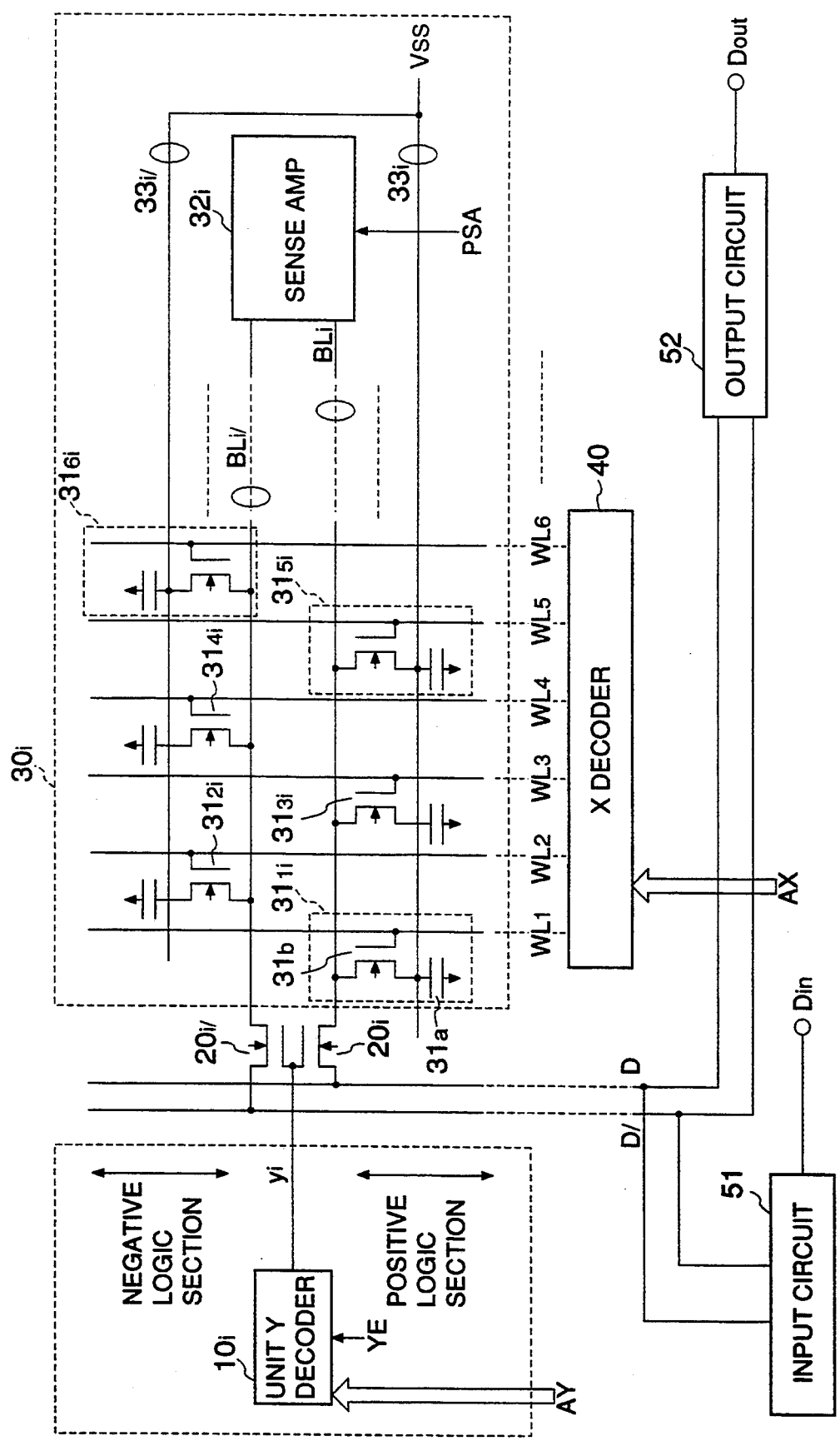
FIG. 49 is a circuit diagram illustrating a unit column circuit of the semiconductor memory device utilized for a 35th embodiment of the invention.

FIG. 49 shows a 35th embodiment of the invention, the basic structure of which is similar to that shown in FIG. 31. In this embodiment, the logic converter 60A shown in FIG. 31 is not provided.

Figure 50:
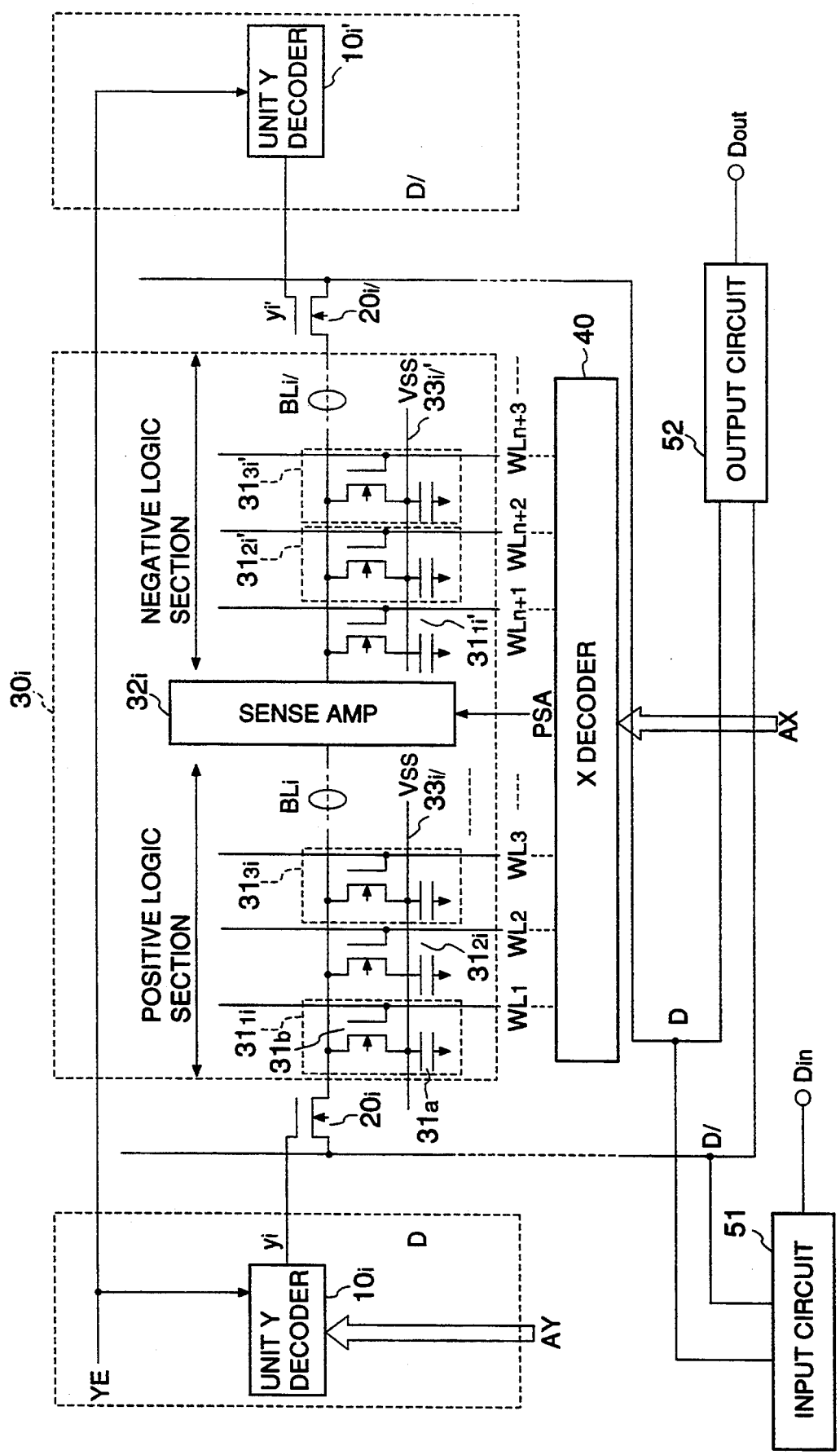
FIG. 50 is a circuit diagram illustrating a unit column circuit of the semiconductor memory device utilized for a 36th embodiment of the invention.

FIG. 50 shows a 36th embodiment of the invention, the basic structure of which is similar to that shown in FIG. 38. In this embodiment, the logic converter 60A shown in FIG. 38 is also not provided.

Figure 51:
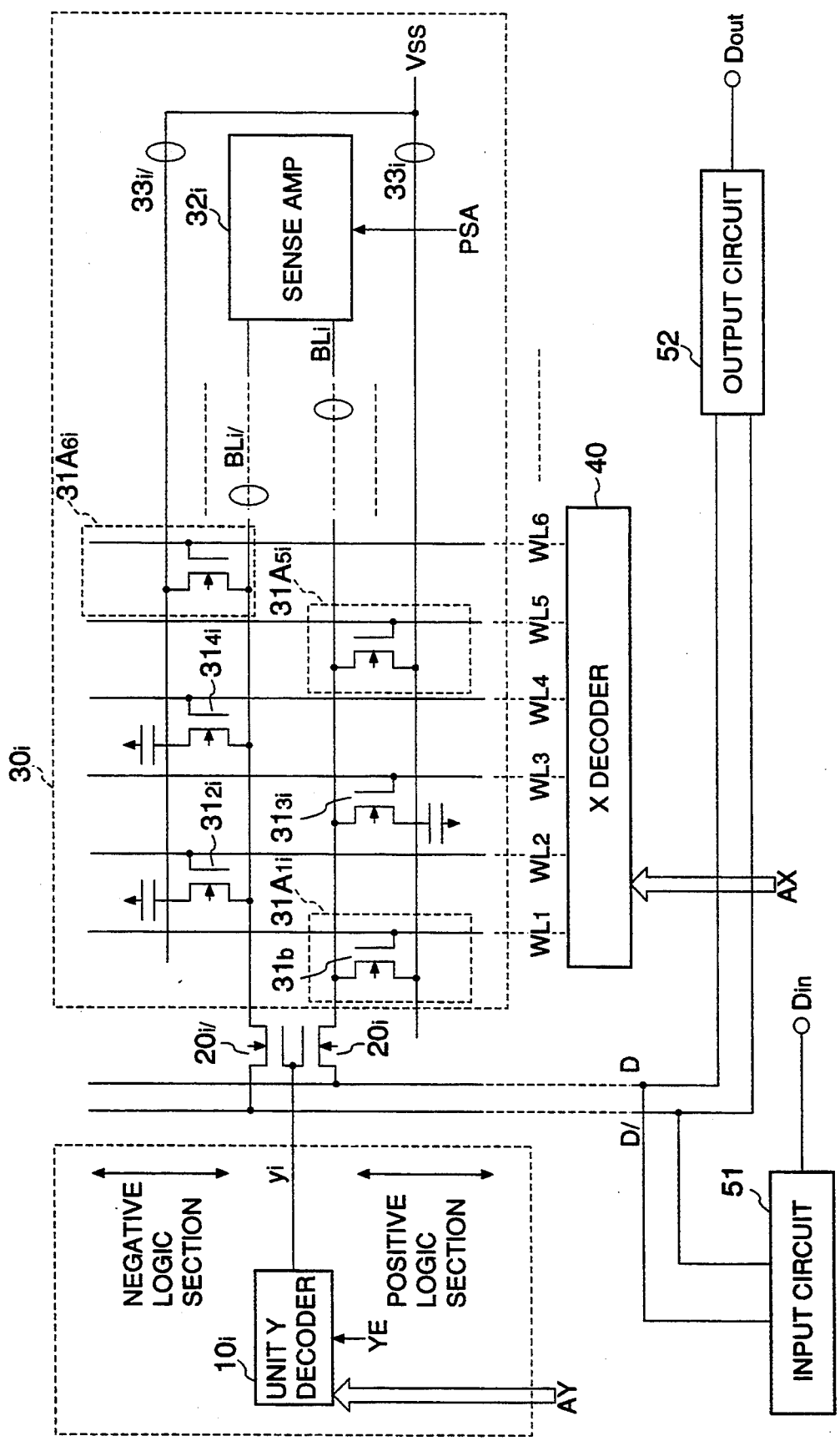
FIG. 51 is a circuit diagram illustrating a unit column circuit of the semiconductor memory device utilized for a 37th embodiment of the invention.

FIG. 51 shows a 37th embodiment of the invention, the basic structure of which is similar to that shown in FIG. 49. In this embodiment, the memory cells 31A$_{1i}$, 31A$_{5i}$, 31A$_{6i}$, ..., which are connected to the power supply line 33*i/*, are each constituted of only the transfer gate 31*b* omitting the capacitor 31*a*.

Figure 52:
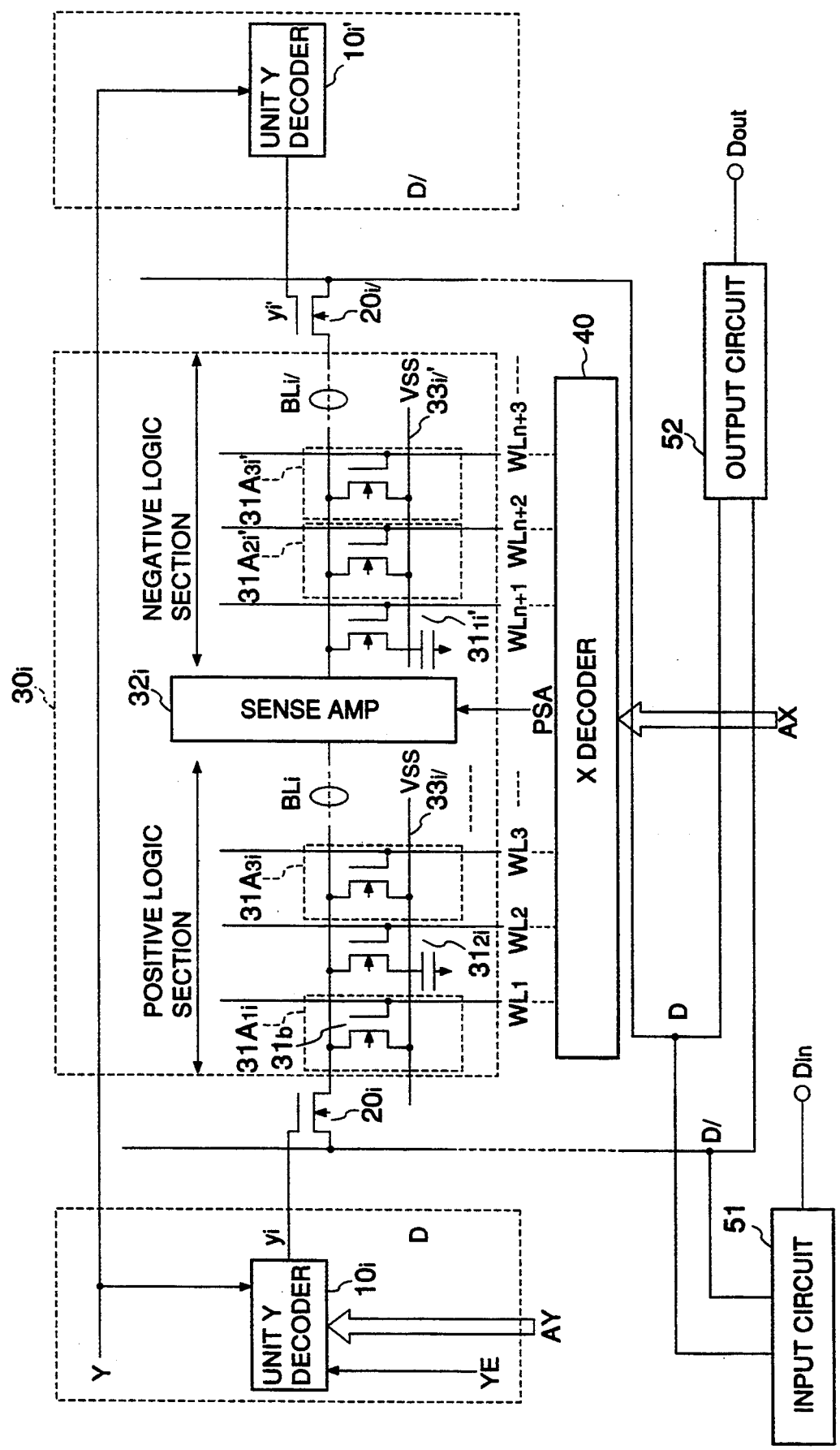
FIG. 52 is a circuit diagram illustrating a unit column circuit of the semiconductor memory device utilized for a 38th embodiment of the invention.

FIG. 52 shows a 36th embodiment of the invention, the basic structure of which is similar to that shown in FIG. 50. In this embodiment, the memory cells 31A$_{1i}$, 31A$_{3i}$, 31A$_{2i}'$, 31A$_{3i}'$ ..., which are connected to the ground lines 33*i/*, 33*i/'*, are each constituted of only the transfer gate 31*b* omitting the capacitor 31*a*.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A semiconductor memory circuit comprising:
    a plurality of bit lines each of which is coupled to a sense amplifier;
    a plurality of word lines arranged to intersect said bit lines and coupled to a decoder;
    a plurality of memory cells each of which includes
        a transfer transistor having a first electrode coupled to one of said bit lines, a second electrode, and a control electrode coupled to one of said word lines, and
        a data storing means coupled to the second electrode of the transfer transistor; and
    a reference voltage supply line coupled to a voltage source for supplying a reference voltage, said reference voltage supply line being coupled to the second electrodes of the transfer transistors of a selected group of said memory cells so that said memory cells coupled to said reference voltage supply line store a fixed data value according to a voltage level of the reference voltage.

2. A semiconductor memory circuit according to claim 1, wherein the voltage source is a ground.

3. A semiconductor memory circuit according to claim 1, wherein the voltage source is a power supply.

4. A semiconductor memory circuit according to claim 1, wherein the reference voltage supply line extends in parallel to said bit lines.

5. A semiconductor memory circuit according to claim 1, further comprising means for reading data values stored in the memory cells, including the data values stored in memory cells with transfer transistors whose second electrodes are coupled to the reference voltage supply line, out from the semiconductor memory circuit.

6. A semiconductor memory circuit according to claim 1, wherein the memory cells with transfer transistors whose second electrodes are coupled to the reference voltage supply line are read only memory cells, and further comprising means for reading data values stored in the memory cells, including the read only memory cells, out of the semiconductor memory circuit.

7. A semiconductor circuit according to claim 1, further comprising means for actuating each of said word lines individually.

8. A semiconductor memory circuit comprising:
    a plurality of pairs of bit lines, each pair of bit lines being coupled to a sense amplifier, each pair of bit lines including a first bit line and a second bit line;
    a plurality of word lines intersecting said bit lines and coupled to a decoder;
    a plurality of first memory cells each of which includes
        a first transfer transistor having a first electrode coupled to the first bit line of one of said pairs of bit lines, a second electrode, and a control electrode coupled to one of said word lines, and
        a first data storing means coupled to the second electrode of the first transfer transistor;
    a plurality of second memory cells each of which includes
        a second transfer transistor having a first electrode coupled to the second bit line of one of said pairs of bit lines, a second electrode, and a control electrode coupled to one of said word lines, and
        a second data storing means coupled to the second electrode of the second transfer transistor;
    a first reference voltage supply line coupled to a first voltage source for supplying a first reference voltage, said first reference voltage supply line being selectively coupled to the second electrodes of the first transfer transistors so that said first memory cells coupled to said first reference voltage supply line store a fixed data value according to a voltage level of the first reference voltage; and a second reference voltage supply line coupled to a second voltage source for supplying a second reference voltage, said second reference voltage supply line being selectively coupled to the second electrodes of the second transfer transistors so that said second memory cells coupled to said second reference voltage supply line store a fixed data value according to a voltage level of the second reference voltage.

9. A semiconductor memory circuit according to claim 8, wherein the first and second voltage sources are the same voltage source.

10. A semiconductor memory circuit according to claim 8, wherein the first voltage source is a power supply and the second voltage source is a ground.

11. A semiconductor memory circuit according to claim 8, wherein the first and second reference voltage supply lines extend in parallel to said bit lines.

12. A random access memory circuit having a read only memory function comprising:
a decoder;
a plurality of sense amplifiers;
a plurality of bit lines each of which is coupled to one of said sense amplifiers;
a plurality of word lines intersecting said bit lines and coupled to said decoder;
a plurality of random access memory cells each of which includes
a transfer transistor having a first electrode coupled to one of said bit lines, a second electrode, and a control electrode coupled to one of said word lines and
a data storing means coupled to the second electrode of the transfer transistor; and
a reference voltage supply line coupled to a voltage source for supplying a reference voltage, said reference voltage supply line being selectively coupled to the second electrodes of the transfer transistors of a selected group of said random access memory cells so that said random access memory cells coupled to said reference voltage supply line work as read only memory cells.

13. A semiconductor memory circuit according to claim 12, wherein the voltage source is a ground.

14. A semiconductor memory circuit according to claim 12, wherein the voltage source is a power supply.

15. A semiconductor memory circuit according to claim 12, wherein the reference voltage supply line extends in parallel to said bit lines.

16. A semiconductor memory circuit according to claim 12, wherein said decoder comprises means for actuating each of said word lines individually.

17. A semiconductor memory circuit comprising:
a plurality of pairs of bit lines, each pair of bit lines being coupled to a sense amplifier, each pair of bit lines including a first bit line and a second bit line;
a plurality of word lines intersecting said bit lines and coupled to a decoder;
an array of memory cells, the memory cells of said array including first memory cells, second memory cells and third memory cells, each of the first, second and third memory cells including
a transfer transistor having a first electrode coupled to the first bit line of one of said pairs bit lines, a second electrode, and a control electrode coupled to one of said word lines, and
a data storing means coupled to the second electrode, the data storing means of each of the third memory cells storing data input thereto via said bit lines;
a first reference voltage supply line coupled to a voltage source for supplying a first reference voltage, said first reference voltage supply line being coupled to the second electrodes of the transfer transistors of said first memory cells so that said first memory cells store a fixed first data value according to a voltage level of the first reference voltage; and
a second reference voltage supply line coupled to the voltage source for supplying a second reference voltage, said second reference voltage supply line being coupled to the second electrodes of the transfer transistors of said second memory cells so that said second memory cells store a fixed second data value according to a voltage level of the second reference voltage.

18. A semiconductor memory circuit according to claim 17, wherein the first and second reference voltages are the same voltage.

19. A semiconductor memory circuit according to claim 17, wherein the voltage source comprises a power supply coupled to said first reference voltage supply line and a ground coupled to said second reference voltage supply line.

20. A semiconductor memory circuit according to claim 17, wherein said first and second reference voltage supply lines extend in parallel to said bit lines.

21. A semiconductor memory circuit comprising:
a decoder;
a plurality of sense amplifiers;
a plurality of pairs of bit lines, each pair of bit lines being coupled to one of said sense amplifiers, each pair of bit lines including a first bit line and a second bit line;
a plurality of word lines intersecting said bit lines and coupled to said decoder;
an array of random access memory cells, the random access memory cells of said array including first random access memory cells and second random access memory cells, each of the first and second random access memory cells including
a transfer transistor having a first electrode coupled to the first bit line of one of said pairs bit lines, a second electrode, and a control electrode coupled to one of said word lines, and
a data storing means coupled to the second electrode;
an input circuit coupled to said bit lines for providing input data thereon, the data storing means of the second random access memory cells storing the input data on the bit lines when the transfer transistors of the second random access memory cells are turned ON;
a reference voltage supply line coupled to a voltage source for supplying a reference voltage, said reference voltage supply line being coupled to the second electrodes of the transfer transistors of said first random access memory cells so that said first random access memory cells store a fixed data value according to a voltage level of the reference voltage, whereby said first random access memory cells work only as read only memory cells.

22. A semiconductor memory circuit according to claim 21, wherein the voltage source comprises a power supply coupled to said reference voltage supply line.

23. A semiconductor memory circuit according to claim 21, wherein the voltage source comprises a ground coupled to said reference voltage supply line.

24. A semiconductor memory circuit according to claim 21, wherein said reference voltage supply line extends in parallel to said bit lines.

25. A semiconductor memory circuit comprising:
a decoder;
a plurality of sense amplifiers;
a plurality of pairs of bit lines, each being coupled to one of said sense amplifiers, each pair of bit lines including a first bit line and a second bit line;
a plurality of word lines intersecting said bit lines and coupled to said decoder;
an array of memory cells, the memory cells of said array including first memory cells and second memory cells, each of the first and second memory cells including a transfer transistor having a first electrode coupled to the first bit line of one of said pairs of bit lines, a second electrode, and a control electrode coupled to one of said word lines, each of the second memory cells being a random access memory cell which additionally includes a data value storing means coupled to the second electrode of the respective transfer transistor;
an input circuit coupled to said bit lines for providing input data thereon, the data value storing means of the second memory cells storing the input data on the bit lines when the transfer transistors of the second memory cells are turned ON; and
a reference voltage supply line coupled to a voltage source for supplying a reference voltage, said reference voltage supply line being coupled to the second electrodes of the transfer transistors of said first memory cells so that said first memory cells store a fixed data value according to a voltage level of the reference voltage, whereby said first memory cells work only as read only memory cells.

26. A semiconductor memory circuit according to claim 25, wherein the voltage source comprises a power supply coupled to said reference voltage supply line.

27. A semiconductor memory circuit according to claim 25, wherein the voltage source comprises a ground coupled to said reference voltage supply line.

28. A semiconductor memory circuit according to claim 25, wherein said reference voltage supply line extends in parallel to said bit lines.

29. A semiconductor memory circuit according to claim 25, further comprising an output circuit for outputting data values stored in the first memory cells and in the second memory cells.

* * * * *